(12) United States Patent
Atsumi et al.

(10) Patent No.: US 9,525,073 B2
(45) Date of Patent: Dec. 20, 2016

(54) SEMICONDUCTOR DEVICE INCLUDING OXIDE SEMICONDUCTOR

(71) Applicant: Semiconductor Energy Laboratory Co., Ltd., Atsugi-shi, Kanagawa-ken (JP)

(72) Inventors: Tomoaki Atsumi, Kanagawa (JP); Yoshiyuki Kobayashi, Tokyo (JP); Yutaka Shionoiri, Kanagawa (JP); Yuto Yakubo, Kanagawa (JP); Shuhei Nagatsuka, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/723,630

(22) Filed: May 28, 2015

(65) Prior Publication Data

US 2015/0349131 A1 Dec. 3, 2015

(30) Foreign Application Priority Data

May 30, 2014 (JP) ................. 2014-113591
May 30, 2014 (JP) ................. 2014-113592
Sep. 8, 2014 (JP) ................. 2014-182127

(51) Int. Cl.
*G05F 3/08* (2006.01)
*G05F 1/10* (2006.01)
(Continued)

(52) U.S. Cl.
CPC ........... *H01L 29/7869* (2013.01); *G05F 3/262* (2013.01); *H01L 27/124* (2013.01);
(Continued)

(58) Field of Classification Search
CPC ............ H01L 29/66795; H01L 29/785; H01L 21/845; H01L 27/1211; H01L 21/823431; H01L 27/0886; H01L 21/823821; H01L 29/7869–29/78693
(Continued)

(56) References Cited

U.S. PATENT DOCUMENTS 5,391,979 A * 2/1995 Kajimoto .................. G05F 3/30
  323/313
5,481,179 A * 1/1996 Keeth ..................... G05F 3/262
  323/315

(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Victor A Mandala
*Assistant Examiner* — Regan J Rundio
(74) *Attorney, Agent, or Firm* — Fish & Richardson P.C.

(57) ABSTRACT

A semiconductor device which occupies a small area is provided. A semiconductor device includes a resistor. The resistor includes a transistor. The increase rate of a drain current of the transistor with a 0.1 V change in drain voltage is preferably higher than or equal to 1% when the drain voltage is higher than a difference between a gate voltage and a threshold voltage of the transistor. The semiconductor device has a function of generating a voltage based on the resistance of the resistor.

19 Claims, 40 Drawing Sheets

(51) Int. Cl.

| | | |
|---|---|---|
| *G05F 3/26* | (2006.01) | |
| *H01L 29/786* | (2006.01) | |
| *H01L 29/78* | (2006.01) | |
| *H01L 29/06* | (2006.01) | |
| *H01L 29/24* | (2006.01) | |
| *H01L 27/12* | (2006.01) | |
| *H01L 29/04* | (2006.01) | |
| *H01L 27/085* | (2006.01) | |
| *H01L 27/088* | (2006.01) | |
| *H01L 29/66* | (2006.01) | |
| *H01L 29/778* | (2006.01) | |
| *H01L 29/16* | (2006.01) | |
| *H01L 29/20* | (2006.01) | |

(52) U.S. Cl.
CPC ...... *H01L 27/1211* (2013.01); *H01L 27/1225* (2013.01); *H01L 29/045* (2013.01); *H01L 29/0673* (2013.01); *H01L 29/24* (2013.01); *H01L 29/66439* (2013.01); *H01L 29/785* (2013.01); *H01L 29/78696* (2013.01); *H01L 27/085* (2013.01); *H01L 27/0886* (2013.01); *H01L 29/1606* (2013.01); *H01L 29/2003* (2013.01); *H01L 29/66795* (2013.01); *H01L 29/7782* (2013.01); *H01L 29/78648* (2013.01)

(58) Field of Classification Search
USPC .................................. 327/538–543
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,798,637 A * | 8/1998 | Kim .................. | G05F 3/242 323/313 |
| 5,838,188 A * | 11/1998 | Taguchi .................. | G11C 5/147 323/313 |
| 6,107,868 A * | 8/2000 | Diniz ...................... | G05F 3/245 327/512 |
| 6,294,274 B1 | 9/2001 | Kawazoe et al. | |
| 6,531,914 B2 * | 3/2003 | Kawakubo .............. | G05F 1/465 323/315 |
| 6,563,174 B2 | 5/2003 | Kawasaki et al. | |
| 6,727,522 B1 | 4/2004 | Kawasaki et al. | |
| 6,963,191 B1 * | 11/2005 | McCalmont ............ | G05F 3/262 323/315 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,071,672 B2 * | 7/2006 | Drusenthal ............. | G05F 1/46 323/314 |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,394,308 B1 * | 7/2008 | Stiff ........................ | G05F 3/262 323/315 |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,863,674 B2 * | 1/2011 | Yeo .................. | H01L 29/42384 257/302 |
| 8,188,785 B2 * | 5/2012 | Iacob ........................ | G05F 1/10 327/543 |
| 8,441,312 B2 * | 5/2013 | Yuasa ...................... | G05F 3/24 327/543 |
| 8,542,060 B2 * | 9/2013 | Tomioka .................. | G05F 3/245 323/313 |
| 2001/0046027 A1 | 11/2001 | Tai et al. | |
| 2002/0039044 A1 * | 4/2002 | Kwak ..................... | G05F 3/262 327/540 |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0128760 A1 * | 6/2008 | Jun ......................... | B82Y 10/00 257/280 |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |

(56) References Cited

U.S. PATENT DOCUMENTS

| | | |
|---|---|---|
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0217499 A1 | 8/2012 | Endo et al. |
| 2012/0241739 A1* | 9/2012 | Yamazaki ........... H01L 27/0688 257/43 |
| 2014/0306217 A1 | 10/2014 | Yamazaki et al. |
| 2014/0340608 A1 | 11/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc—Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—Bo Systems [A; Fe, Ga, Or, Al; B: Mg, Mn, Fe, Ni, Cu,Or, Zn] at Temperatures Over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors using amorphous oxide semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor upon exposure to water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. Amoled Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 13A
FIG. 13B
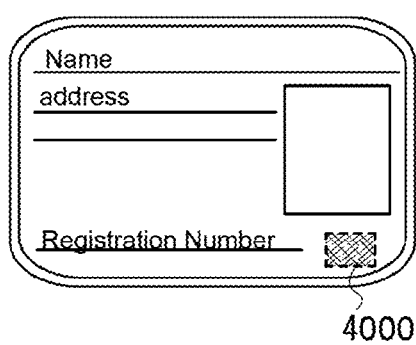
4000
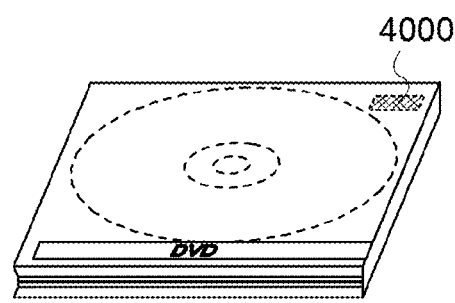
4000
FIG.13C
FIG. 13D
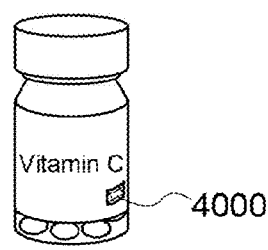
4000
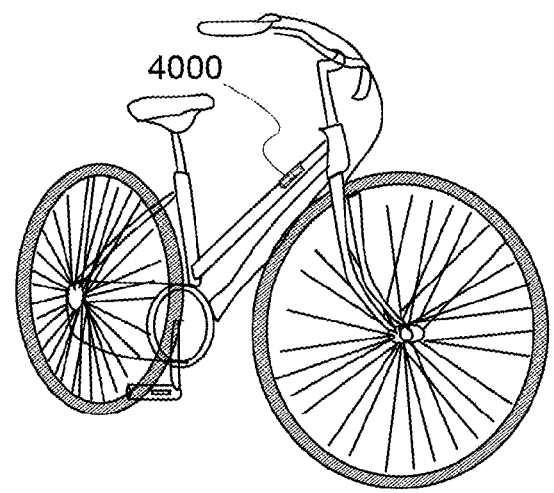
4000
FIG. 13E
FIG. 13F
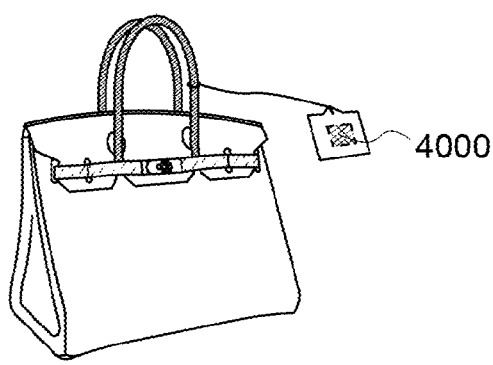
4000
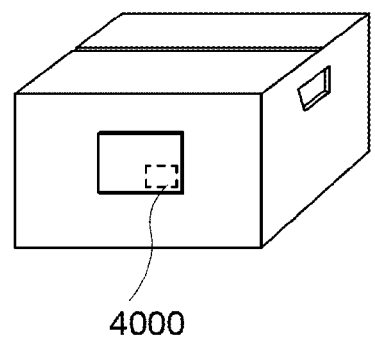
4000

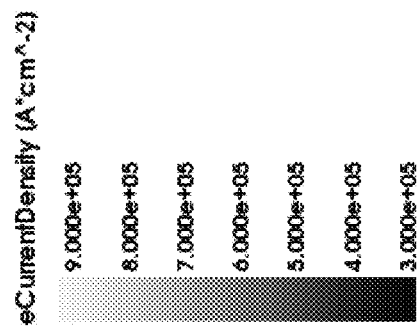
FIG. 19A
Vg=1V,Vs=0V,Vd=1V
FIG. 19B
Vg=1V,Vs=0V,Vd=2V
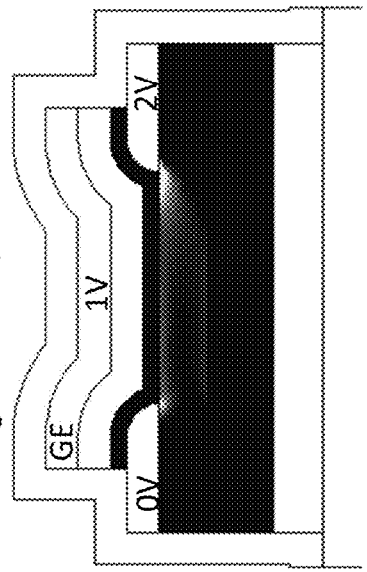 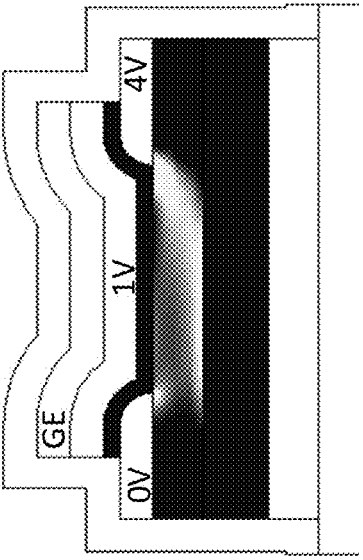
FIG. 19C
Vg=1V,Vs=0V,Vd=3V
FIG. 19D
Vg=1V,Vs=0V,Vd=4V
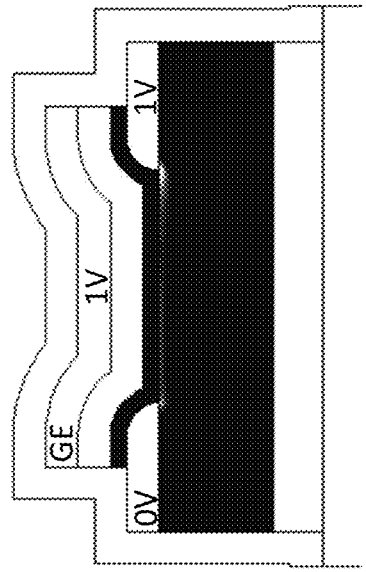 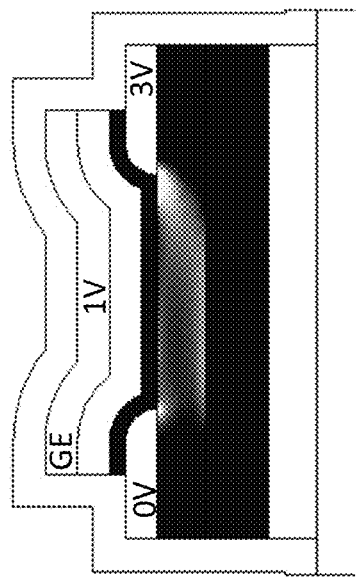

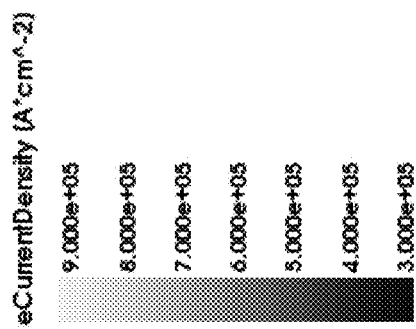
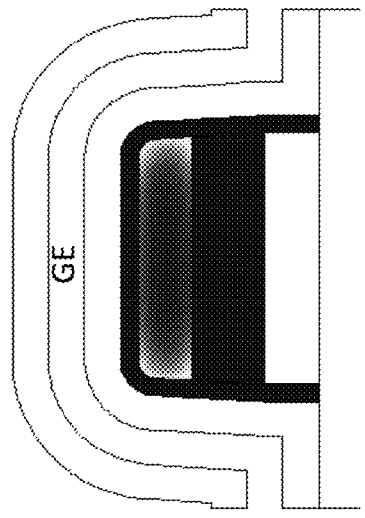
FIG. 20A Vg=1V, Vs=0V, Vd=1V
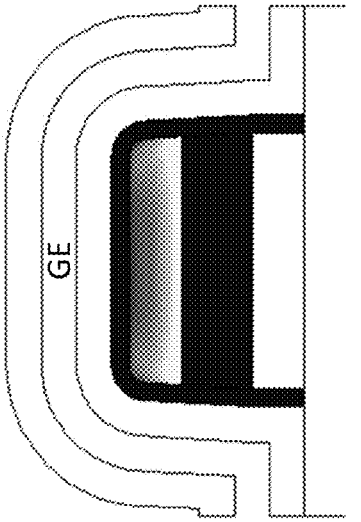
FIG. 20B Vg=1V, Vs=0V, Vd=2V
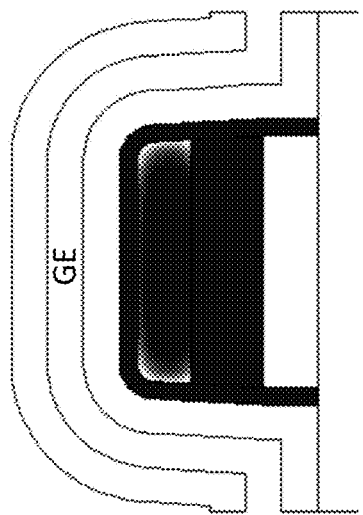
FIG. 20C Vg=1V, Vs=0V, Vd=3V
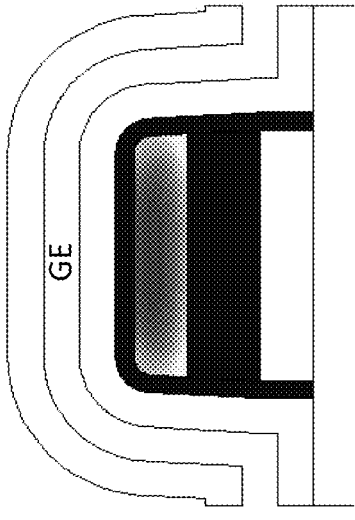
FIG. 20D Vg=1V, Vs=0V, Vd=4V

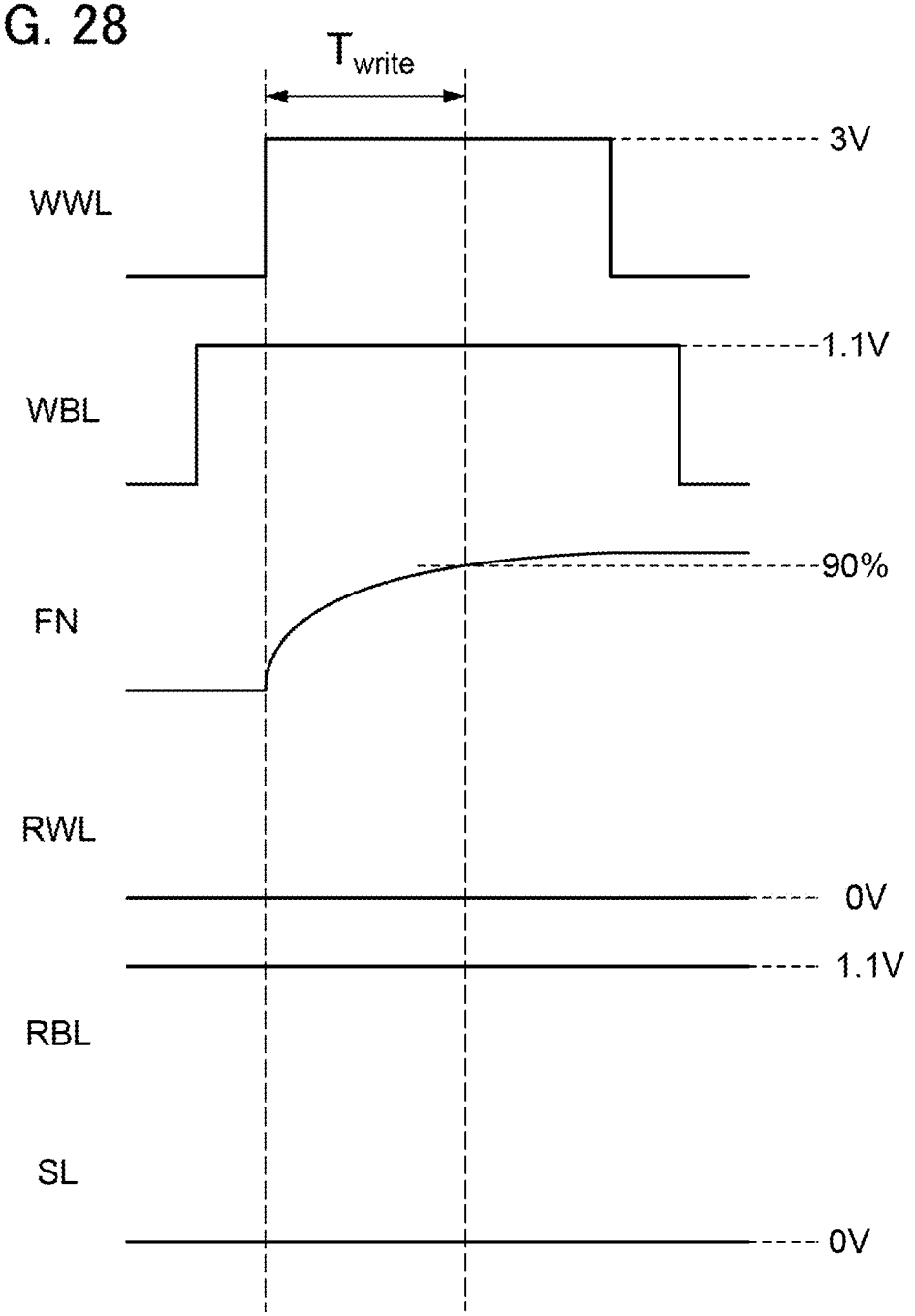

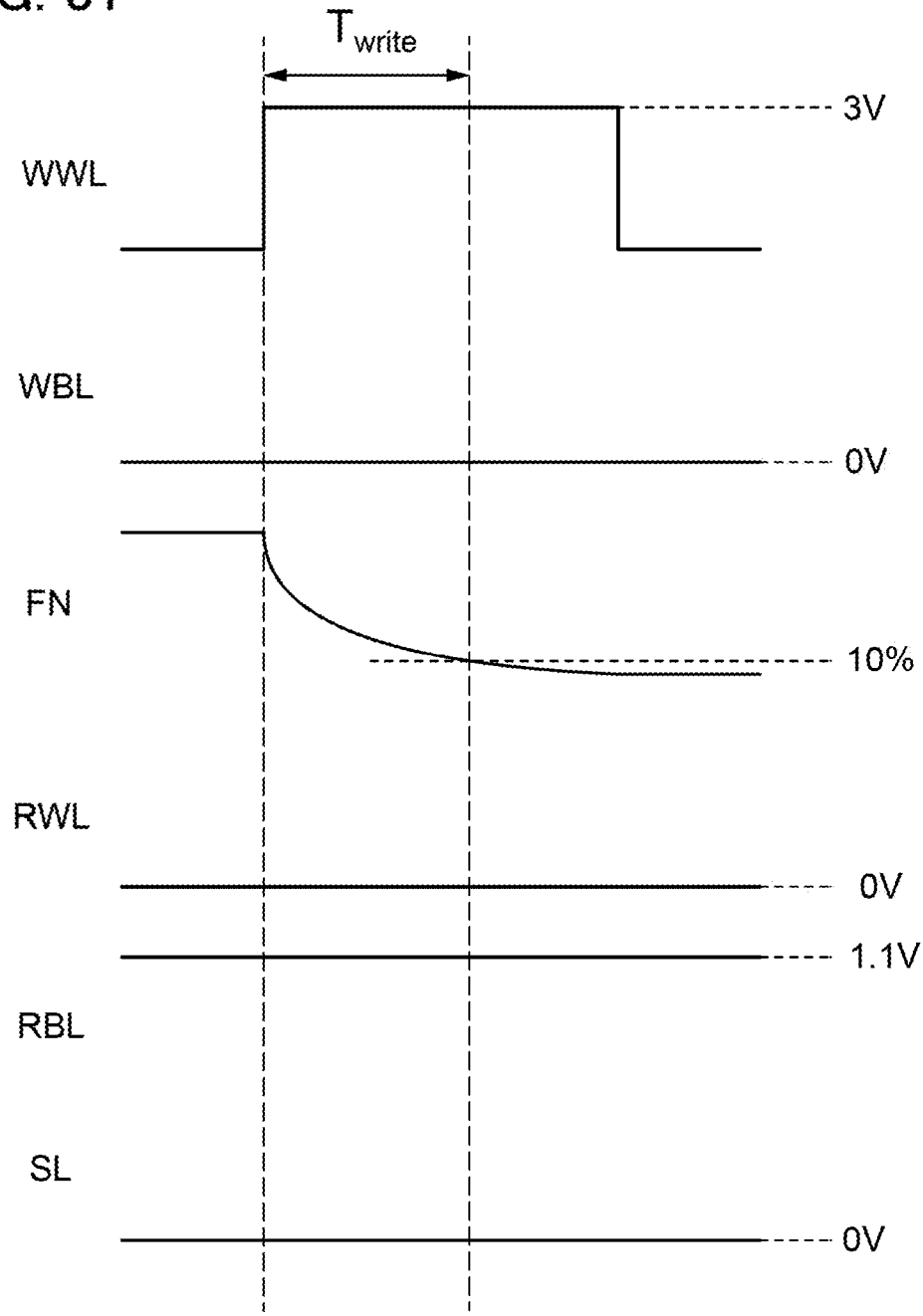

FIG. 36A
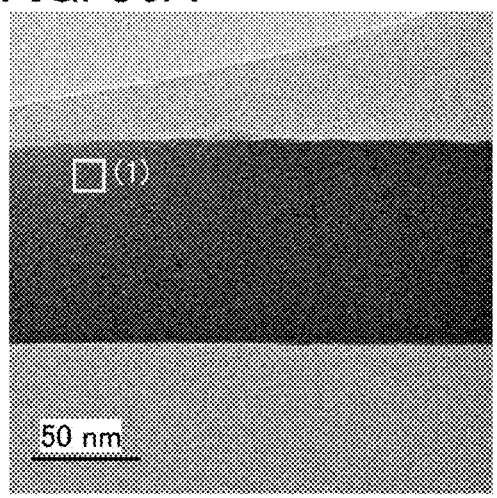
FIG. 36B  FIG. 36C
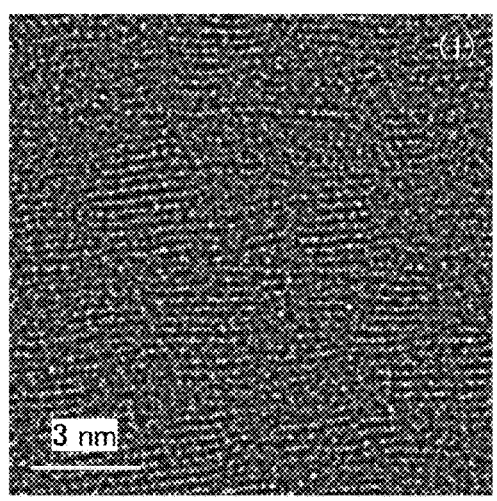 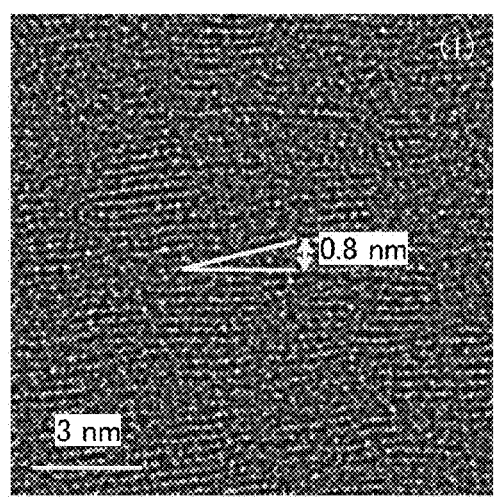
FIG. 36D
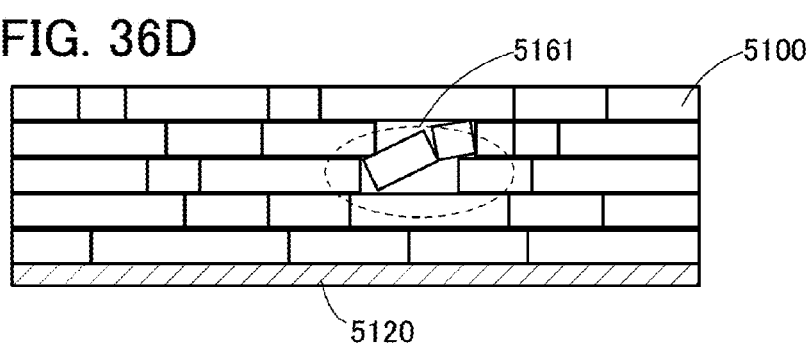

FIG. 37A
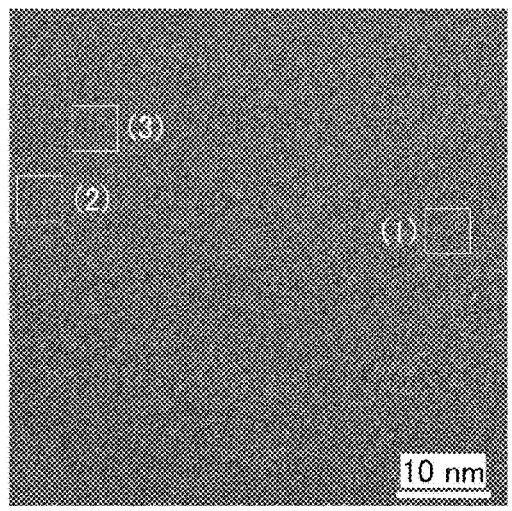
FIG. 37B  FIG. 37C  FIG. 37D
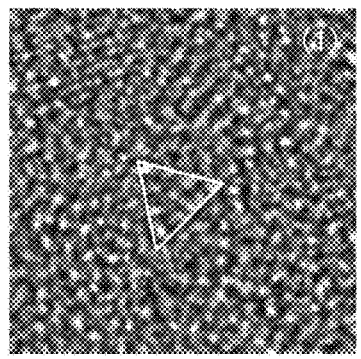 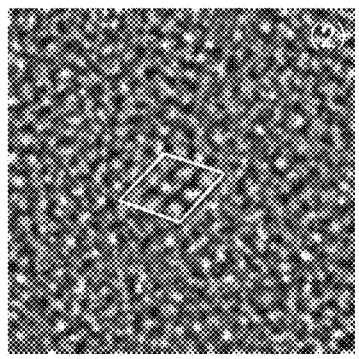 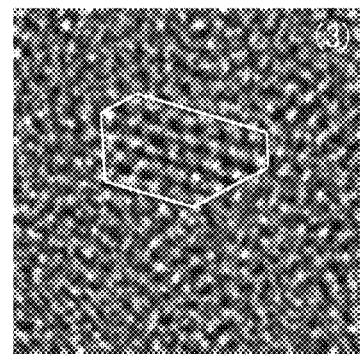

FIG. 39A
FIG. 39B
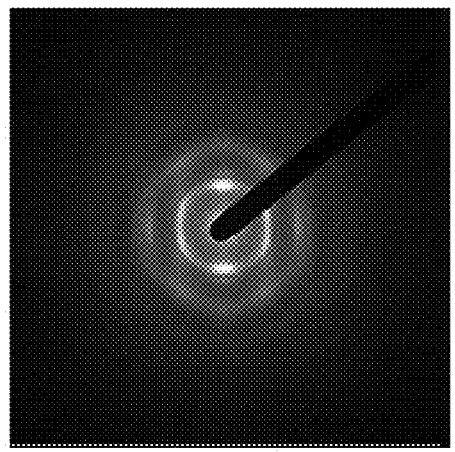
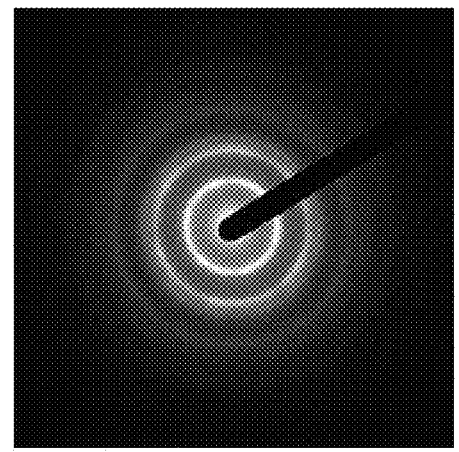

SEMICONDUCTOR DEVICE INCLUDING OXIDE SEMICONDUCTOR

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, a driving method thereof, or a manufacturing method thereof. In particular, one embodiment of the present invention relates to a semiconductor device, a memory device, a power supply circuit, a display device, or a light-emitting device each including an oxide semiconductor.

In this specification and the like, a semiconductor device generally means a device that can function by utilizing semiconductor characteristics. In some cases, a display device, an electro-optical device, a semiconductor circuit, or an electronic device includes a semiconductor device.

2. Description of the Related Art

A technique by which a transistor is formed using a semiconductor material has been attracting attention. The transistor is used in a wide range of electronic devices such as an integrated circuit (IC) or an image display device (also simply referred to as a display device). A silicon-based semiconductor material is widely known as a semiconductor material applicable to the transistor, but an oxide semiconductor (OS) has been attracting attention as an alternative material. A transistor in which an oxide semiconductor is used in a channel is referred to as an OS transistor.

For example, a technique for manufacturing a transistor using zinc oxide or an In—Ga—Zn-based oxide semiconductor as an oxide semiconductor applicable to the OS transistor is disclosed (see Patent Documents 1 and 2).

In recent years, demand for integrated circuits in which semiconductor elements such as miniaturized transistors are integrated with high density has risen with increased performance and reductions in the size and weight of electronic devices.

REFERENCES

[Patent Document 1] Japanese Published Patent Application No. 2007-123861

[Patent Document 2] Japanese Published Patent Application No. 2007-96055

SUMMARY OF THE INVENTION

An object of one embodiment of the present invention is to provide a semiconductor device that occupies a small area. Another object of one embodiment of the present invention is to provide a semiconductor device capable of operating at a high speed.

Another object of one embodiment of the present invention is to provide a variable resistor that occupies a small area. Another object of one embodiment of the present invention is to provide a variable resistor capable of operating at a high speed. Another object of one embodiment of the present invention is to provide a novel variable resistor. Another object of one embodiment of the present invention is to provide a novel semiconductor device.

Note that the descriptions of a plurality of objects do not preclude the existence of each object. One embodiment of the present invention does not necessarily achieve all the objects listed above. Objects other than those listed above are apparent from the description of the specification, drawings, claims, and the like, and such objects could be an object of one embodiment of the present invention.

One embodiment of the present invention is a semiconductor device which includes a resistor. The resistor includes a transistor. The increase rate of a drain current of the transistor with a 0.1 V change in drain voltage is preferably higher than or equal to 1% when the drain voltage is higher than a difference between a gate voltage and a threshold voltage of the transistor. The semiconductor device of one embodiment of the present invention has a function of generating a voltage based on the resistance of the resistor.

In the above embodiment, the transistor includes first to third oxide semiconductor layers, a gate insulating layer, and a gate electrode layer. The second oxide semiconductor layer preferably includes a portion provided between the first oxide semiconductor layer and the third oxide semiconductor layer. The gate insulating layer preferably includes a region in contact with an upper surface of the third oxide semiconductor layer. The gate electrode layer and the portion preferably include a region where the gate electrode layer and the portion overlap with each other with the gate insulating layer provided therebetween.

In the above embodiment, the first to third oxide semiconductor layers preferably contain indium, zinc, and M (M is Al, Ti, Ga, Y, Zr, La, Ce, Nd, or Hf).

In the above embodiment, the first and third oxide semiconductor layers preferably have a higher atomic ratio of M to In than the second oxide semiconductor layer.

In the above embodiment, the gate electrode layer preferably overlaps with an upper surface of the portion and a side surface of the portion in a channel width direction with the gate insulating layer provided therebetween.

In the above embodiment, a cutoff frequency of the transistor at a source—drain voltage higher than or equal to 1 V and lower than or equal to 2 V is preferably higher than 2 GHz.

In the above embodiment, the second oxide semiconductor layer preferably includes a plurality of crystal parts with c-axis alignment.

In the above embodiment, a channel length of the transistor is preferably 100 nm or less.

One embodiment of the present invention is an electronic device which includes the semiconductor device described in the above embodiment and at least one of a microphone, a speaker, a display portion, and an operation key.

One embodiment of the present invention is a resistor which includes a transistor. The transistor preferably includes first to third oxide semiconductor layers, a gate insulating layer, and a gate electrode layer. The second oxide semiconductor layer preferably includes a portion provided between the first oxide semiconductor layer and the third oxide semiconductor layer. The gate insulating layer preferably includes a region in contact with an upper surface of the third oxide semiconductor layer. The gate electrode layer and the portion preferably include a region where the gate electrode layer and the portion overlap with each other with the gate insulating layer provided therebetween. The increase rate of a drain current with a 0.1 V change in drain voltage is preferably higher than or equal to 1% when the drain voltage is higher than a difference between a gate voltage and a threshold voltage of the transistor.

In the above embodiment, a channel length of the transistor is preferably 100 nm or less.

In the above embodiment, the first to third oxide semiconductor layers preferably contain indium, zinc, and M (M is Al, Ti, Ga, Y, Zr, La, Ce, Nd, or Hf).

In the above embodiment, the first and third oxide semiconductor layers preferably have a higher atomic ratio of M to In than the second oxide semiconductor layer.

In the above embodiment, the gate electrode layer preferably overlaps with an upper surface of the portion and a side surface of the portion in a channel width direction with the gate insulating layer provided therebetween.

In the above embodiment, a cutoff frequency of the transistor at a source-drain voltage higher than or equal to 1 V and lower than or equal to 2 V is preferably higher than 2 GHz.

In the above embodiment, the second oxide semiconductor layer preferably includes a plurality of crystal parts with c-axis alignment.

One embodiment of the present invention is an electronic device which includes the resistor described in the above embodiment and at least one of a microphone, a speaker, a display portion, and an operation key.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

According to one embodiment of the present invention, a semiconductor device that occupies a small area can be provided. According to one embodiment of the present invention, a semiconductor device capable of operating at a high speed can be provided.

According to one embodiment of the present invention, a variable resistor that occupies a small area can be provided. According to one embodiment of the present invention, a variable resistor capable of operating at a high speed can be provided. According to one embodiment of the present invention, a novel variable resistor can be provided. According to one embodiment of the present invention, a novel semiconductor device can be provided.

Note that the descriptions of these effects do not disturb the existence of other effects. One embodiment of the present invention does not necessarily achieve all the effects listed above. Other effects will be apparent from and can be derived from the descriptions of the specification, the drawings, the claims, and the like.

BRIEF DESCRIPTION OF THE DRAWINGS

FIGS. 13A to 13F each illustrate an example of an RF tag.

FIGS. 19A to 19D show current density distributions in the channel length direction which are obtained by device simulation.

FIGS. 20A to 20D show current density distributions in the channel width direction which are obtained by device simulation.

FIG. 28 is a schematic diagram showing operation waveforms of a fabricated circuit.

FIG. 31 is a schematic diagram showing operation waveforms of a fabricated circuit.

FIGS. 36A to 36D are Cs-corrected high-resolution TEM images of a cross section of a CAAC-OS and a schematic cross-sectional view of the CAAC-OS.

FIGS. 37A to 37D are Cs-corrected high-resolution TEM images of a plane of a CAAC-OS.

FIGS. 39A and 39B show electron diffraction patterns of a CAAC-OS.

DETAILED DESCRIPTION OF THE INVENTION

Figure 1:
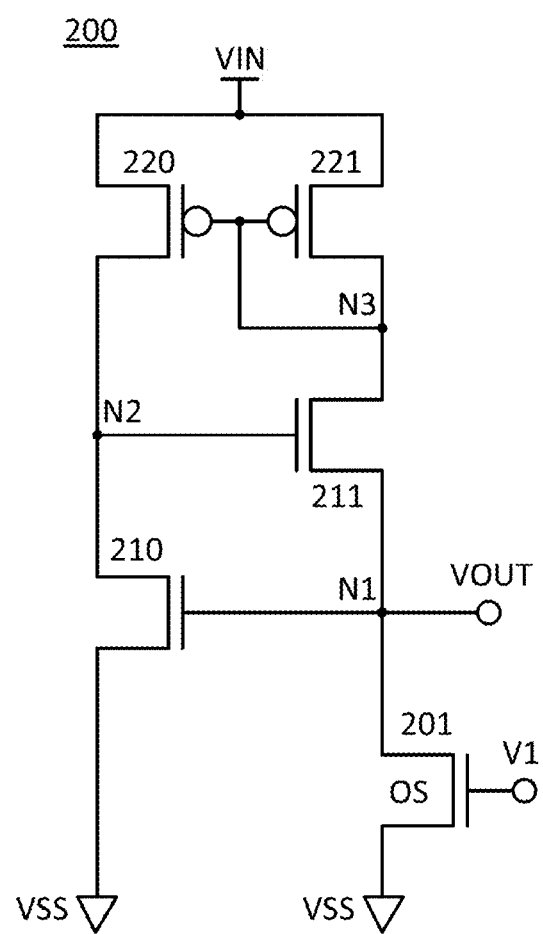
FIG. 1 is a circuit diagram illustrating a structural example of a semiconductor device in one embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is applied to similar functions, and these are not especially denoted by reference numerals in some cases.

Note that in each drawing described in this specification, the size, the layer thickness, or the region of each component is exaggerated for clarity in some cases. Therefore, embodiments of the invention are not limited to such scales.

Note that ordinal numbers such as "first" and "second" in this specification and the like are used in order to avoid confusion among components, and the terms do not limit the components numerically.

Note that a "semiconductor" includes characteristics of an "insulator" in some cases when, for example, the conductivity is sufficiently low. Furthermore, a "semiconductor" and an "insulator" cannot be strictly distinguished from each other in some cases because the border between the "semiconductor" and the "insulator" is not clear. Accordingly, a "semiconductor" in this specification can be called an "insulator" in some cases. Similarly, an "insulator" in this specification can be called a "semiconductor" in some cases.

A transistor is a kind of semiconductor element and can achieve amplification of a current or a voltage, switching operation for controlling conduction or non-conduction, or the like. A transistor in this specification includes an insulated-gate field effect transistor (IGFET) and a thin film transistor (TFT).

In this specification or the like, in description of connections of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

A circuit structural example of a semiconductor device according to one embodiment of the present invention will be described with reference to FIG. 1.

A semiconductor device 200 illustrated in FIG. 1 is a constant voltage generation circuit, which is used as a circuit for generating a reference voltage in a power supply circuit or the like, for example.

The semiconductor device 200 includes a transistor 201, a transistor 210, a transistor 211, a transistor 220, a transistor 221, a node N1, a node N2, and a node N3.

In the following description of this embodiment, the transistor 201, the transistor 210, and the transistor 211 are n-channel transistors, and the transistor 220 and the transistor 221 are p-channel transistors. Note that the semiconductor device 200 can operate similarly when the transistor 210 and the transistor 211 are p-channel transistors and the transistor 201, the transistor 220, and the transistor 221 are n-channel transistors.

One of a source and a drain of the transistor 220 is electrically connected to a wiring to which a potential VIN is supplied. The other of the source and the drain of the transistor 220 is electrically connected to the node N2. A gate of the transistor 220 is electrically connected to the node N3.

One of a source and a drain of the transistor 221 is electrically connected to the wiring to which the potential $V_{IN}$ is supplied. The other of the source and the drain of the transistor 221 is electrically connected to the node N3. A gate of the transistor 221 is electrically connected to the node N3.

One of a source and a drain of the transistor 211 is electrically connected to the node N3. The other of the source and the drain of the transistor 211 is electrically connected to the node N1. A gate of the transistor 211 is electrically connected to the node N2.

One of a source and a drain of the transistor 210 is electrically connected to the node N2. The other of the source and the drain of the transistor 210 is electrically connected to a wiring to which a power $V_{SS}$ is supplied. A gate of the transistor 210 is electrically connected to the node N1.

One of a source and a drain of the transistor 201 is electrically connected to the node N1. The other of the source and the drain of the transistor 201 is electrically connected to a wiring to which the power $V_{SS}$ is supplied. A gate of the transistor 201 is electrically connected to a wiring to which a potential $V_1$ is supplied.

The semiconductor device 200 illustrated in FIG. 1 has a function of outputting a potential $V_{N1}$ of the node N1 as an output potential $V_{OUT}$.

In the following description of operation of generating a constant potential as an example of circuit operation, the transistor 210, the transistor 211, the transistor 220, and the transistor 221 operate in a saturation region.

The transistor 220 and the transistor 221 form a current mirror circuit. Since the two transistors have the same gate-source voltage $V_{gs}$, substantially the same amount of current flows through the transistor 220 and the transistor 221. Thus, the potential $V_{N1}$ of the node N1 is determined such that substantially the same amount of current flows through the transistor 210 and the transistor 201.

A saturation current at $V_{gs}=V_{N1}$ flows through the transistor 210, and a current of roughly $V_{N1}/R_{V1}$ flows through the transistor 201 in accordance with an effective resistance $R_{V1}$ at $V_{gs}=V_1$. The current which flows through the transistor 210 is roughly proportional to the square of $V_{N1}$, and the current which flows through the transistor 201 is roughly proportional to $V_{N1}$. Accordingly, there is a potential at which the two current values balance out, which determines $V_{N1}$. The current value at this time is denoted by $I_0$. The potential $V_{N1}$ is determined regardless of the power supply potential $V_{IN}$.

A potential $V_{N2}$ of the node N2 is determined such that a saturation current of the transistor 211 becomes $I_0$ at $V_{gs}=V_{N2}-V_{N1}$. A potential $V_{N3}$ of the node N3 is determined such that saturation currents of the transistor 221 and the transistor 220 become $I_0$ at $V_{gs}=V_{IN}-V_{N3}$.

In the above manner, the potentials of the node N1, the node N2, and the node N3 are determined. As described above, $V_{N1}$ and $V_{N2}$ are determined regardless of the potential $V_{IN}$. In addition, $V_{N3}$ is determined such that $V_{IN}-V_{N3}$ is substantially constant. The potential of the node N1 is output as the output potential $V_{OUT}$.

In the semiconductor device 200, a capacitor may be connected to the node N2. This may stabilize operation. Although FIG. 1 illustrates an example in which the potential of the node N1 is used as the output potential, the potential of the node N2 or the potential of the node N3 may be used as the output potential.

It is preferable to use a short-channel OS transistor as the transistor 201.

Figure 34A:
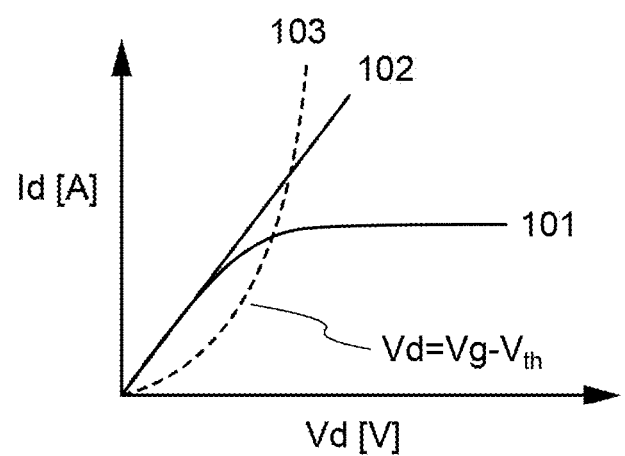
FIGS. 34A and 34B illustrate $V_d$–$I_d$ characteristics of a transistor.

FIG. 34A shows $V_d-I_d$ characteristics of a metal-oxide-semiconductor (MOS) transistor ($V_d$: drain voltage, $I_d$: drain current). A region on the left side of a dashed line 103 (a curve representing $V_d=V_g-V_{th}$, $V_g$: gate voltage, $V_{th}$: threshold voltage of the transistor) is referred to as a linear region, and a region on the right side of the dashed line 103 is referred to as a saturation region. It is generally known that the drain current of a MOS transistor in the saturation region is constant (saturated) with respect to the drain voltage as indicated by a solid line 101.

It has been confirmed as will be described in Examples 1 and 2 that the drain current of an OS transistor with a short channel is not constant (not saturated) as indicated by a solid line 102. Such an OS transistor maintains a linear relationship between drain voltage and drain current.

Figure 34B:
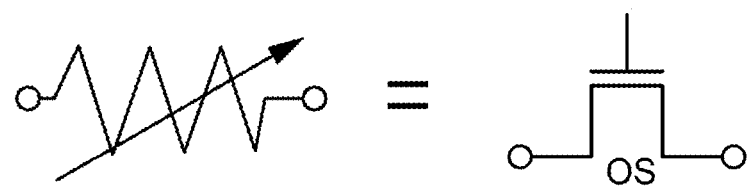

In other words, a short-channel OS transistor can be used as a resistor. The resistance thereof is controlled by a potential input to a gate. This means that a short-channel OS transistor can function as a variable resistor (FIG. 34B).

In a conventional integrated circuit, a resistor is formed in many cases by adding an impurity to a semiconductor such as silicon. For example, in the case where a resistor having a high resistance of 1 MΩ to 2 MΩ, for example, is formed by the above method, the resistor occupies a large area, resulting in problems such as inhibiting circuit integration. In addition, in the case where the resistor is formed by the above method, the resistance may vary because of variation in impurity concentration or the like.

Since the channel resistance of a short-channel OS transistor can be controlled by the gate voltage, a resistor which occupies a small area and has a high resistance can be provided.

A short-channel OS transistor can provide a resistor which maintains linearity between drain voltage and drain current even at high drain voltage.

A short-channel OS transistor can also provide a resistor with less variation.

In the semiconductor device 200 in FIG. 1, the transistor 201 for which an OS transistor is used can function as a load resistor, and functions as a variable resistor which is controlled by the potential $V_1$.

With the use of the transistor 201 in the semiconductor device 200, the output potential $V_{OUT}$ can be controlled by the potential $V_1$. This enables stable operation in a power supply circuit or the like. With the potential $V_1$, the output potential $V_{OUT}$ can be changed; thus, the value of a power supply voltage of a power supply circuit or the like can also be changed according to the situation. With the use of the transistor 201 in the semiconductor device 200, the area occupied by the circuit can be decreased, and a highly integrated semiconductor device can be provided.

Note that the phrase "drain current is not saturated" or "shows non-saturation characteristics" means that the increase rate of a drain current with a 0.1 V change in drain voltage is preferably higher than or equal to 1%, further preferably higher than or equal to 2%, still further preferably higher than or equal to 3% in the saturation region illustrated in FIG. 34A (or in the case where the drain voltage is higher than a difference between gate voltage and threshold voltage).

Note that the increase rate of the drain current with the 0.1 V change in drain voltage can be calculated using the following formula, where $I_{D1}$ [A] is a drain current at drain voltage $V_{D1}$ [V] and $I_{D2}$ [A] is a drain current at drain current ($V_{D1}$+0.1) [V].

$$|I_{D2}-I_{D1}|/I_{D1}\times 100 \quad (1)$$

Note that this embodiment can be combined with any of the other embodiments and examples in this specification as appropriate.

Embodiment 2

In this embodiment, examples of OS transistors which can be used in the semiconductor device 200 described in Embodiment 1 will be described.

Structural Example 1 of Transistor

Figure 2A:
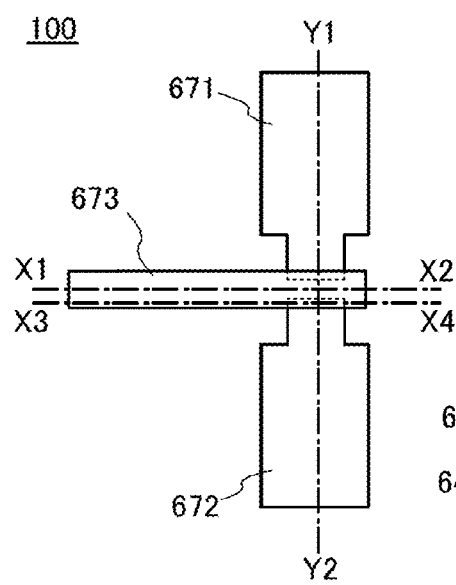
FIGS. 2A to 2D are a top view and cross-sectional views illustrating a structural example of a transistor.
Figure 2B:
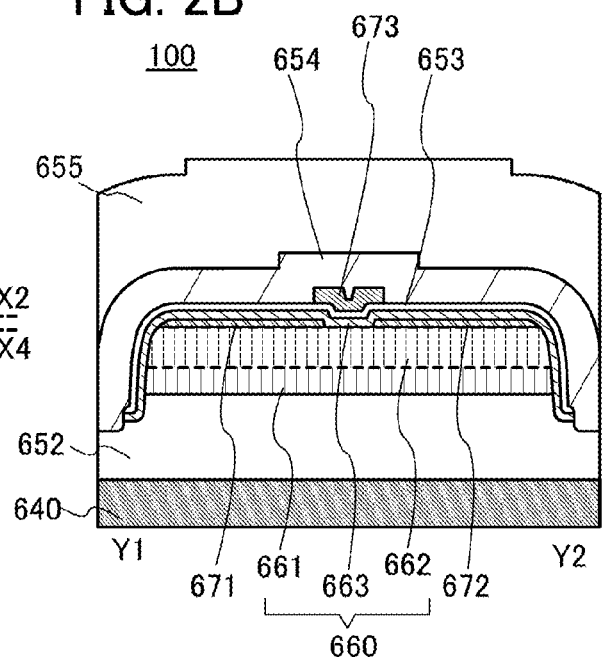
Figure 2C:
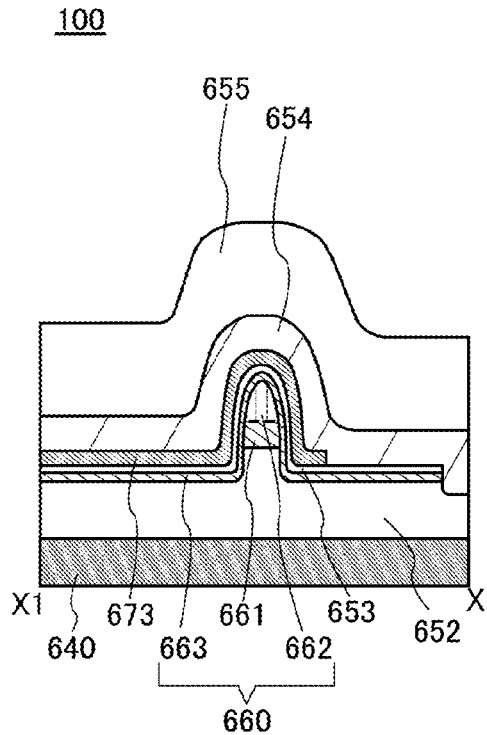
Figure 2D:
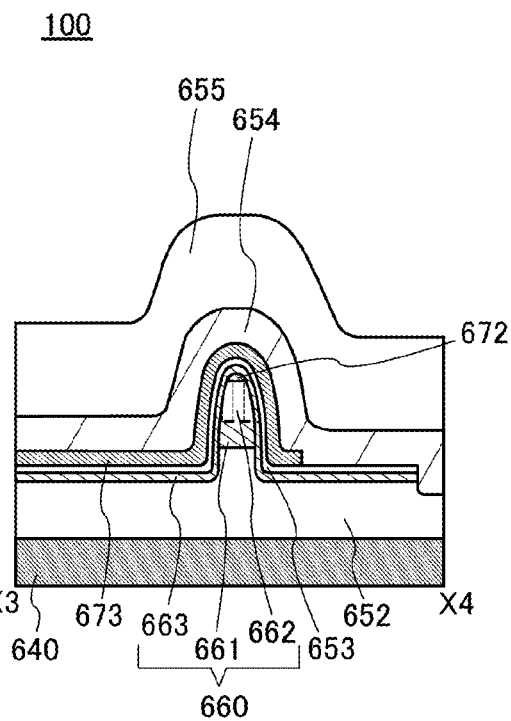

FIGS. 2A to 2D are a top view and cross-sectional views of a transistor 100. FIG. 2A is the top view. FIG. 2B illustrates a cross section along the dashed-dotted line Y1-Y2 in FIG. 2A. FIG. 2C illustrates a cross section along the dashed-dotted line X1-X2 in FIG. 2A. FIG. 2D illustrates a cross section along the dashed-dotted line X3-X4 in FIG. 2A. In FIGS. 2A to 2D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel with is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

The transistor 100 includes a substrate 640, an insulating film 652 over the substrate 640, a semiconductor 661 and a semiconductor 662 stacked in this order over the insulating film 652, a conductive film 671 and a conductive film 672 in contact with an upper surface of the semiconductor 662, a semiconductor 663 in contact with the semiconductor 661, the semiconductor 662, the conductive film 671, and the conductive film 672, an insulating film 653 and a conductive film 673 over the semiconductor 663, an insulating film 654 over the conductive film 673 and the insulating film 653, and an insulating film 655 over the insulating film 654. Note that the semiconductor 661, the semiconductor 662, and the semiconductor 663 are collectively referred to as a semiconductor 660.

The conductive film 671 functions as a source electrode of the transistor 100. The conductive film 672 functions as a drain electrode of the transistor 100. Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

The conductive film 673 functions as a gate electrode of the transistor 100.

The insulating film 653 functions as a gate insulating film of the transistor 100.

As illustrated in FIG. 2C, a side surface of the semiconductor 662 is surrounded by the conductive film 673. With such a structure, the semiconductor 662 can be electrically surrounded by an electric field of the conductive film 673 (a transistor structure in which a semiconductor is electrically surrounded by an electric field of a conductive film (gate electrode) is referred to as a surrounded channel (s-channel) structure). Therefore, a channel is formed in the entire semiconductor 662 (bulk) in some cases. In the s-channel structure, a large amount of current can flow between a source and a drain of a transistor, so that high current in an on state (on-state current) can be achieved. The s-channel structure enables a transistor to operate at high frequency.

Since high on-state current can be obtained, the s-channel structure is suitable for a downsized transistor. A semiconductor device including the downsized transistor can have a high integration degree and high density. For example, the channel length of the transistor is preferably less than or equal to 100 nm, more preferably less than or equal to 60 nm, still more preferably less than or equal to 30 nm and greater than or equal to 10 nm. The channel width of the transistor is preferably less than or equal to 100 nm, more preferably less than or equal to 60 nm, still more preferably less than or equal to 30 nm.

Since high on-state current can be obtained, the s-channel structure is suitable for a transistor that needs to operate at high frequency. A semiconductor device including the transistor can operate at high frequency.

Components of the semiconductor device of this embodiment will be described below in detail.

<Substrate>

As the substrate 640, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a single material semiconductor substrate made of silicon, germanium, or the like or a compound semiconductor substrate made of silicon carbide, silicon germanium, gallium arsenide, indium phosphide, zinc oxide, gallium oxide, or the like is used. A semiconductor substrate in which an insulator region is provided in the above semiconductor substrate, e.g., a silicon on insulator (SOI) substrate may also be used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 640. As a method for providing a transistor over a flexible substrate, there is a method in which the transistor is formed over a non-flexible substrate and then the transistor is separated and transferred to the substrate 640 which is a flexible substrate. In that case, a separation layer is preferably provided between the non-flexible substrate and the transistor. As the substrate 640, a sheet, a film, or a foil containing a fiber may be used. The substrate 640 may have elasticity. The substrate 640 may have a property of returning to its original shape when bending or pulling is stopped. Alternatively, the substrate 640 may have a property of not returning to its original shape. The thickness of the substrate 640 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 640 has a small thickness, the weight of the semiconductor device can be reduced. When the substrate 640 has a small thickness, even in the case of using glass or the like, the substrate 640 may have elasticity or a property of returning to its original shape when bending or pulling is stopped. Therefore, an impact applied to the semiconductor device over the substrate 640, which is caused by dropping or the like, can be reduced. That is, a durable semiconductor device can be provided.

For the substrate 640 which is a flexible substrate, for example, metal, an alloy, resin, glass, or fiber thereof can be used. The flexible substrate 640 preferably has a lower coefficient of linear expansion because deformation due to an environment is suppressed. The flexible substrate 640 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 640 because of its low coefficient of linear expansion.

<Base Insulating Film>

It is preferable that the upper surface of the insulating film 652 be planarized by a chemical mechanical polishing (CMP) method or the like.

The insulating film 652 preferably includes oxide. In particular, the insulating film 652 preferably includes an oxide material from which part of oxygen is released by heating. The insulating film 652 preferably includes an oxide containing oxygen in excess of that in the stoichiometric composition. Part of oxygen is released by heating from the oxide film containing oxygen in excess of that in the stoichiometric composition. Oxygen released from the insulating film 652 is supplied to the semiconductor 660 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen in excess of that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. As the metal oxide, aluminum oxide, aluminum oxynitride, gallium oxide, gallium oxynitride, yttrium oxide, yttrium oxynitride, hafnium oxide, or hafnium oxynitride can be used. Note that in this specification, "oxynitride" refers to a material that contains oxygen at a higher proportion than nitrogen, and "nitride oxide" refers to a material that contains nitrogen at a higher proportion than oxygen.

In order to make the insulating film 652 contain excess oxygen, oxygen (at least including any of oxygen radicals, oxygen atoms, and oxygen ions) may be introduced into the insulating film 652, whereby a region containing excess oxygen is formed. Oxygen can be introduced by, for example, an ion implantation method, an ion doping method, a plasma immersion ion implantation method, plasma treatment, or the like.

<Semiconductor>

Next, semiconductors which can be used as the semiconductors 661 to 663 or the like will be described below.

In the transistor 100, it is preferable that current flowing between a source and drain in an off state (off-state current) be low. Here, the term "low off-state current" means that normalized off-state current per micrometer of channel width at room temperature with a source-drain voltage of 10 V is lower than or equal to $10\times10^{-21}$ A. An example of a transistor with such a low off-state current is a transistor including an oxide semiconductor as a semiconductor.

The semiconductor 662 is, for example, an oxide semiconductor containing indium (In). The semiconductor 662 has a high carrier mobility (electron mobility) when containing, for example, indium. The semiconductor 662 preferably contains an element M. The element M is preferably aluminum (Al), gallium (Ga), yttrium (Y), tin (Sn), or the like. Other elements which can be used as the element M include boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (HO, tantalum (Ta), and tungsten (W). Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 662 preferably contains zinc (Zn). When the oxide semiconductor contains zinc, the oxide semiconductor is easily crystallized in some cases.

Note that the semiconductor 662 is not limited to the oxide semiconductor containing indium. The semiconductor 662 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 662, an oxide with a wide energy gap may be used. For example, the energy gap of the semiconductor 662 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor 662 is preferably a CAAC-OS film which will be described later.

For example, the semiconductor 661 and the semiconductor 663 include one or more elements other than oxygen included in the semiconductor 662. Since the semiconductor 661 and the semiconductor 663 each include one or more elements other than oxygen included in the semiconductor 662, an interface state is less likely to be formed at the interface between the semiconductor 661 and the semiconductor 662 and the interface between the semiconductor 662 and the semiconductor 663.

The semiconductor 661, the semiconductor 662, and the semiconductor 663 preferably include at least indium.

In the case of using an In—M—Zn oxide as the semiconductor 661, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively.

In the case of using an In—M—Zn oxide as the semiconductor 662, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively.

In the case of using an In—M—Zn oxide as the semiconductor 663, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 663 and the semiconductor 661 may be formed using the same type of oxide. Note that the semiconductor 661 and/or the semiconductor 663 do/does not necessarily contain indium in some cases. For example, the semiconductor 661 and/or the semiconductor 663 may be gallium oxide.

Figure 3A:
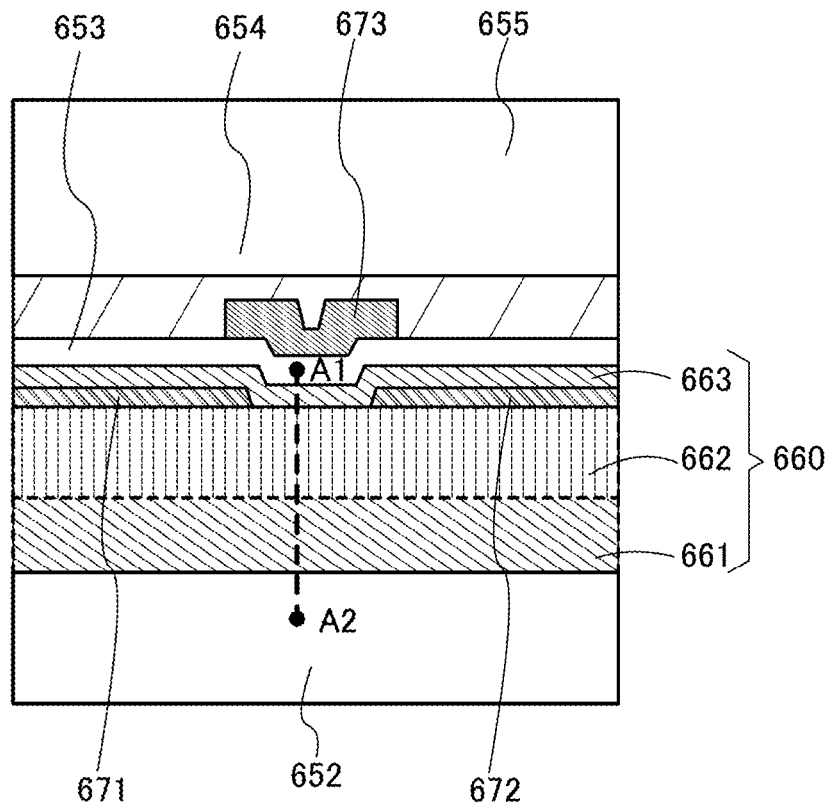
FIG. 3A is a cross-sectional view illustrating a structural example of a transistor.
Figure 3B:
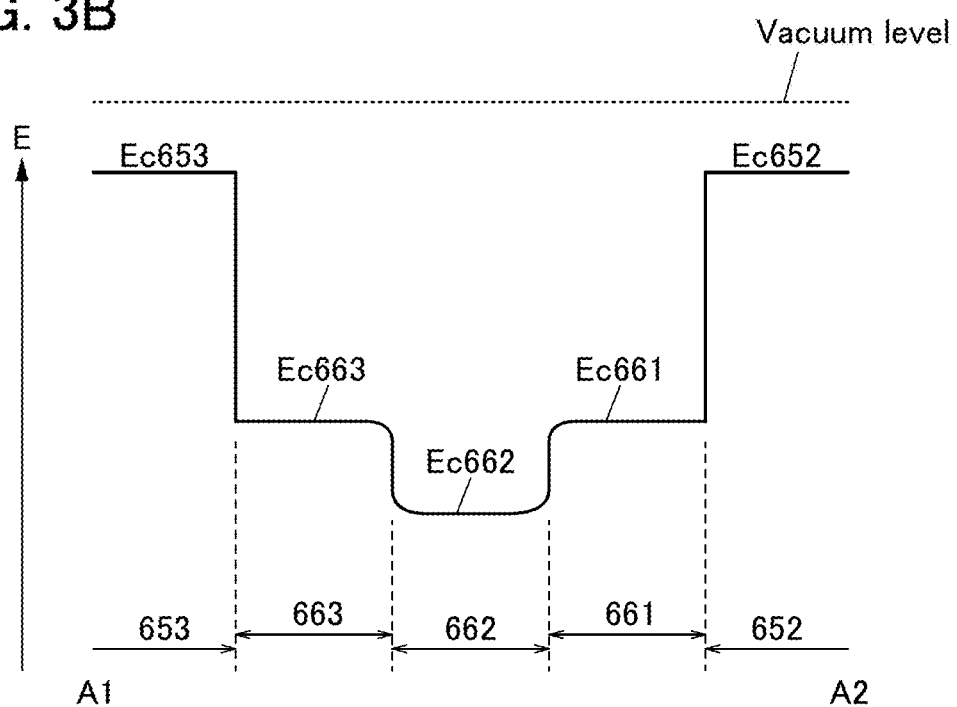
FIG. 3B is a band diagram of the transistor.

Next, a function and an effect of the semiconductor 660 in which the semiconductor 661, the semiconductor 662, and the semiconductor 663 are stacked will be described using an energy band diagram in FIG. 3B. FIG. 3A is an enlarged view of the channel portion of the transistor 100 illustrated in FIG. 2B. FIG. 3B shows an energy band structure of a portion along the chain line A1-A2 in FIG. 3A. FIG. 3B illustrates the energy band structure of a channel formation region of the transistor 100.

In FIG. 3B, Ec652, Ec661, Ec662, Ec663, and Ec653 indicate the energy of the conduction band minimum of the insulating film 652, the semiconductor 661, the semiconductor 662, the semiconductor 663, and the insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating film 652 and the insulating film 653 are insulators, Ec652 and Ec653 are closer to the vacuum level than Ec661, Ec662, and Ec663 (i.e., the insulating film 652 and the insulating film 653 have a smaller electron affinity than the semiconductor 661, the semiconductor 662, and the semiconductor 663).

As the semiconductor 662, an oxide having an electron affinity higher than those of the semiconductors 661 and 663 is used. For example, as the semiconductor 662, an oxide having an electron affinity higher than those of the semiconductors 661 and 663 by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the semiconductor 663 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the semiconductor 662 having the highest electron affinity among the semiconductors 661 to 663.

Here, in some cases, there is a mixed region of the semiconductor 661 and the semiconductor 662 between the semiconductor 661 and the semiconductor 662. Furthermore, in some cases, there is a mixed region of the semiconductor 662 and the semiconductor 663 between the semiconductor 662 and the semiconductor 663. The mixed region has a low interface state density. For that reason, the stack of the semiconductor 661, the semiconductor 662, and the semiconductor 663 has a band structure where energy at each interface and in the vicinity of the interface is changed continuously (continuous junction).

At this time, electrons move mainly in the semiconductor 662, not in the semiconductor 661 and the semiconductor 663. As described above, when the interface state density at the interface between the semiconductor 661 and the semiconductor 662 and the interface state density at the interface between the semiconductor 662 and the semiconductor 663 are decreased, electron movement in the semiconductor 662 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor 662 (a formation surface; here, the semiconductor 661) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P-V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 662 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 662, the on-state current of the transistor can be increased in some cases.

For example, the hydrogen concentration at a certain depth in the semiconductor 662 or in a certain region of the semiconductor 662, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

To decrease oxygen vacancies in the semiconductor 662, for example, there is a method in which excess oxygen in the insulating film 652 is moved to the semiconductor 662 through the semiconductor 661. In this case, the semiconductor 661 is preferably a layer having an oxygen-transmitting property (a layer through which oxygen passes or is transmitted).

In the case where the transistor has an s-channel structure, a channel is formed in the whole of the semiconductor 662. Therefore, as the semiconductor 662 has a larger thickness, a channel region becomes larger. In other words, the thicker the semiconductor 662 is, the larger the on-state current of the transistor is. For example, the semiconductor 662 has a region with a thickness of greater than or equal to 20 nm, preferably greater than or equal to 40 nm, more preferably greater than or equal to 60 nm, still more preferably greater than or equal to 100 nm. Note that the semiconductor 662 has a region with a thickness of, for example, less than or equal to 300 nm, preferably less than or equal to 200 nm, more preferably less than or equal to 150 nm, otherwise the productivity of the semiconductor device might be decreased.

Moreover, the thickness of the semiconductor 663 is preferably as small as possible to increase the on-state current of the transistor. For example, the semiconductor 663 has a region with a thickness of less than 10 nm, preferably less than or equal to 5 nm, more preferably less than or equal to 3 nm. Meanwhile, the semiconductor 663 has a function of blocking entry of elements other than oxygen (such as hydrogen and silicon) included in the adjacent insulator into the semiconductor 662 where a channel is formed. For this reason, it is preferable that the semiconductor 663 have a certain thickness. For example, the semiconductor 663 may have a region with a thickness of greater than or equal to 0.3 nm, preferably greater than or equal to 1 nm, more preferably greater than or equal to 2 nm. The semiconductor 663 preferably has an oxygen blocking property to suppress outward diffusion of oxygen released from the insulating film 652 and the like.

To improve reliability, preferably, the thickness of the semiconductor 661 is large and the thickness of the semiconductor 663 is small. For example, the semiconductor 661 has a region with a thickness of greater than or equal to 10 nm, preferably greater than or equal to 20 nm, more preferably greater than or equal to 40 nm, still more preferably greater than or equal to 60 nm. When the thickness of the semiconductor 661 is made large, the distance from an interface between the adjacent insulator and the semiconductor 661 to the semiconductor 662 in which a channel is formed can be large. However, to prevent the productivity of the semiconductor device from being decreased, the semiconductor 661 has a region with a thickness of, for example, less than or equal to 200 nm, preferably less than or equal to 120 nm, more preferably less than or equal to 80 nm.

For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS analysis is provided between the semiconductor 662 and the semiconductor 661. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor 662 and the semiconductor 663.

It is preferable to reduce the concentration of hydrogen in the semiconductor 661 and the semiconductor 663 in order to reduce the concentration of hydrogen in the semiconductor 662. The semiconductor 661 and the semiconductor 663 each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor 661 and the semiconductor 663 in order to reduce the concentration of nitrogen in the semiconductor 662. The semiconductor 661 and the semiconductor 663 each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The above three-layer structure is an example. For example, a two-layer structure without the semiconductor 661 or the semiconductor 663 may be employed. A four-layer structure in which any one of the semiconductors described as examples of the semiconductor 661, the semiconductor 662, and the semiconductor 663 is provided under or over the semiconductor 661 or under or over the semiconductor 663 may be employed. An n-layer structure (n is an integer of 5 or more) in which any one of the semiconductors described as examples of the semiconductor 661, the semiconductor 662, and the semiconductor 663 is provided at two or more of the following positions: over the semiconductor 661, under the semiconductor 661, over the semiconductor 663, and under the semiconductor 663.

When the semiconductors 661 to 663 have the above structures, the transistor 100 can have high on-state current and operate at high frequency.

<Conductive Film>

The conductive films 671 to 673 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive films are preferably formed using a low-resistance conductive material such as aluminum or copper. The conductive films are further preferably formed using a Cu—Mn alloy, in which case manganese oxide formed at the interface with an insulator containing oxygen has a function of preventing Cu diffusion.

The conductive films 671 to 673 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

The conductive films 671 to 673 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<Gate Insulating Film>

The insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 653 may be a stack including any of the above materials. The insulating film 653 may contain lanthanum (La), nitrogen, or zirconium (Zr) as an impurity.

An example of a stacked-layer structure of the insulating film 653 is described. The insulating film 653 contains oxygen, nitrogen, silicon, or hafnium, for example. Specifically, the insulating film 653 preferably includes hafnium oxide and silicon oxide or silicon oxynitride.

Hafnium oxide has a higher dielectric constant than silicon oxide and silicon oxynitride. Therefore, the thickness of the insulating film 653 can be made large as compared with the case where silicon oxide is used; as a result, leakage current due to tunnel current can be low. That is, it is possible to provide a transistor with a low off-state current.

<Protective Insulating Film>

The insulating film 654 has a function of blocking oxygen, hydrogen, water, alkali metal, alkaline earth metal, and the like. Providing the insulating film 654 can prevent outward diffusion of oxygen from the semiconductor 660 and entry of hydrogen, water, or the like into the semiconductor 660 from the outside. The insulating film 654 can be, for example, a nitride insulating film. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 654 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the semiconductor 660, preventing release of oxygen, which is the main component of the semiconductor 660, from the oxide semiconductor, and preventing unnecessary release of oxygen from the insulating film 652. In addition, oxygen contained in the aluminum oxide film can be diffused into the oxide semiconductor.

<Interlayer Insulating Film>

The insulating film 655 is preferably formed over the insulating film 654. The insulating film 655 can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 655, an organic resin such as a polyimide resin, a polyamide resin, an acrylic resin, a siloxane resin, an epoxy resin, or a phenol resin can be used. The insulating film 655 may be a stack including any of the above materials.

<Structure of Oxide Semiconductor Film>

A structure of an oxide semiconductor that can be used as the semiconductor 662 will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

A CAAC-OS observed with TEM will be described below. FIG. 36A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

FIG. 36B is an enlarged Cs-corrected high-resolution TEM image of a region (1) in FIG. 36A. FIG. 36B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS film, and is arranged parallel to the formation surface or the top surface of the CAAC-OS film.

As shown in FIG. 36B, the CAAC-OS has a characteristic atomic arrangement. The characteristic atomic arrangement is denoted by an auxiliary line in FIG. 36C. FIGS. 36B and 36C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Here, according to the Cs-corrected high-resolution TEM images, the schematic arrangement of pellets 5100 of a CAAC-OS over a substrate 5120 is illustrated by such a structure in which bricks or blocks are stacked (see FIG. 36D). The part in which the pellets are tilted as observed in FIG. 36C corresponds to a region 5161 shown in FIG. 36D.

FIG. 37A shows a Cs-corrected high-resolution TEM image of a plane of the CAAC-OS observed from a direction substantially perpendicular to the sample surface. FIGS. 37B, 37C, and 37D are enlarged Cs-corrected high-resolution TEM images of regions (1), (2), and (3) in FIG. 37A, respectively. FIGS. 37B, 37C, and 37D indicate that metal atoms are arranged in a triangular, quadrangular, or hexagonal configuration in a pellet. However, there is no regularity of arrangement of metal atoms between different pellets.

Figure 38A:
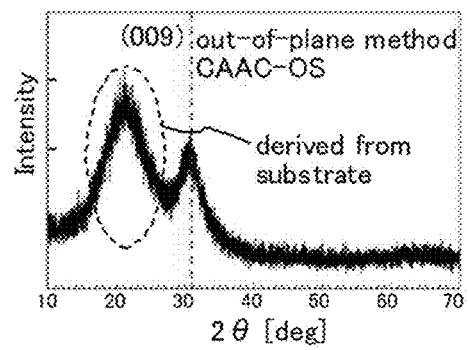
FIGS. 38A to 38C show structural analysis of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31° as shown in FIG. 38A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 38B:
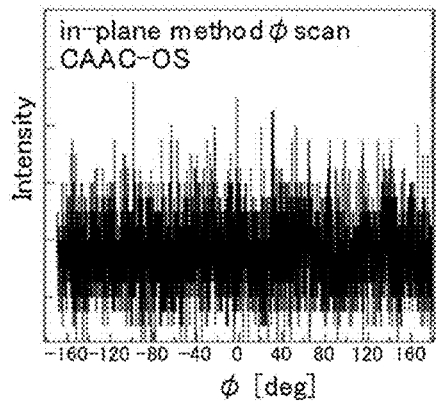
Figure 38C:
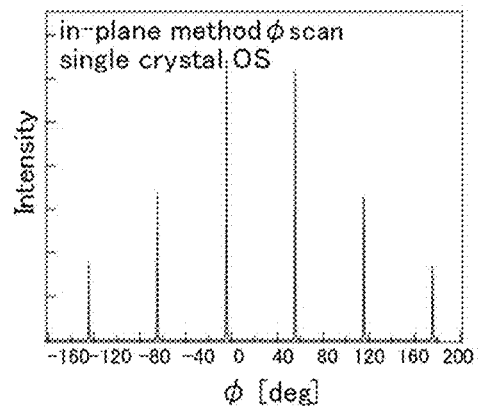

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 38B, a peak is not clearly observed. In contrast, in the case of a single crystal oxide semiconductor of $InGaZnO_4$, when φ scan is performed with 2θ fixed at around 56°, as shown in FIG. 38C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 39A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 39B shows a diffraction pattern obtained in such a manner that an electron beam with a probe diameter of 300 nm is incident on the same sample in a direction perpendicular to the sample surface. As shown in FIG. 39B, a ring-like diffraction pattern is observed. Thus, the electron diffraction also indicates that the a-axes and b-axes of the pellets included in the CAAC-OS do not have regular alignment. The first ring in FIG. 39B is considered to be derived from the (010) plane, the (100) plane, and the like of the $InGaZnO_4$ crystal. The second ring in FIG. 39B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

The above impurity is an element other than the main components of the oxide semiconductor, such as hydrogen, carbon, silicon, or a transition metal element. In particular, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor might serve as a carrier trap or a carrier generation source.

The CAAC-OS is an oxide semiconductor having a low density of defect states. In some cases, oxygen vacancies in the oxide semiconductor serve as carrier traps or serve as carrier generation sources when hydrogen is captured therein, for example.

The state in which impurity concentration is low and density of defect states is low (the number of oxygen vacancies is small) as in the CAAC-OS is referred to as a "highly purified intrinsic" or "substantially intrinsic" state. A highly purified intrinsic or substantially intrinsic oxide semiconductor has few carrier generation sources, and thus can have a low carrier density. Therefore, a transistor including the oxide semiconductor rarely has negative threshold voltage (is rarely normally on). The highly purified intrinsic or substantially intrinsic oxide semiconductor has few carrier traps. Accordingly, the transistor including the oxide semiconductor has little variation in electrical characteristics and high reliability. Electric charge trapped by the carrier traps in the oxide semiconductor takes a long time to be released and might behave like fixed electric charge. Thus, the transistor including the oxide semiconductor having high impurity concentration and a high density of defect states has unstable electrical characteristics in some cases.

Note that in this specification and the like, the carrier density of a highly purified intrinsic or a substantially intrinsic oxide semiconductor is lower than $1\times10^{17}/cm^3$, lower than $1\times10^{15}/cm^3$, or lower than $1\times10^{13}/cm^3$.

With the use of the CAAC-OS in a transistor, variation in the electrical characteristics of the transistor due to irradiation with visible light or ultraviolet light is small.

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction.

The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 40:
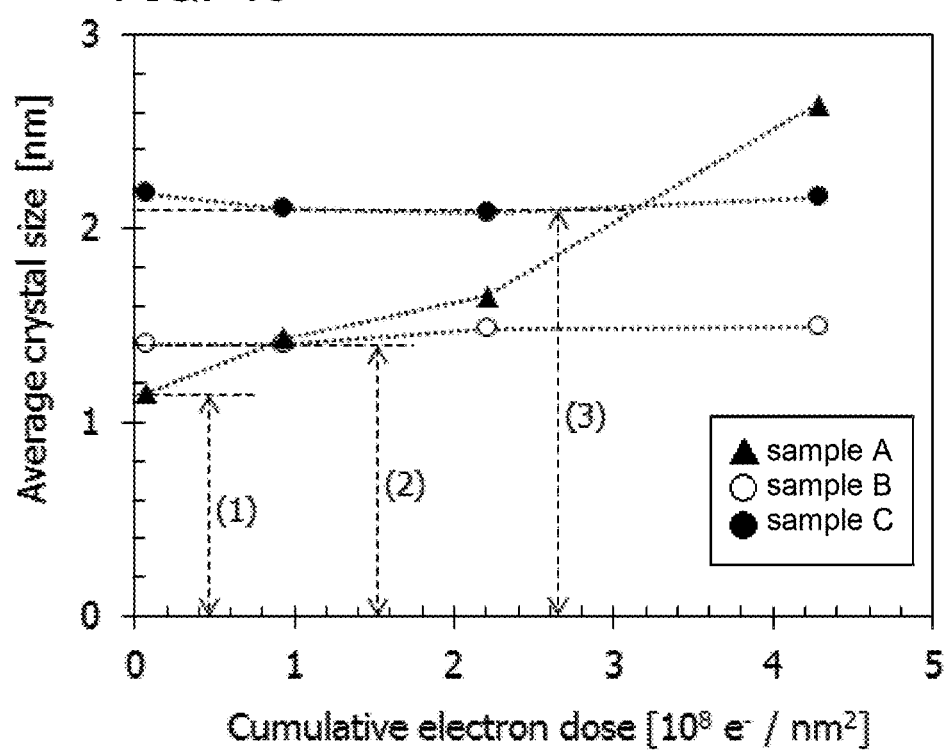
FIG. 40 shows a change in crystal part of an In—Ga—Zn oxide induced by electron irradiation.

FIG. 40 shows change in the average size of crystal parts (at 22 points to 45 points) in each sample. Note that the crystal part size corresponds to the length of a lattice fringe. FIG. 40 indicates that the crystal part size in the a-like OS increases with an increase in the cumulative electron dose. Specifically, as shown by (1) in FIG. 40, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 40, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Composition of a CAAC-OS will be described below. For explanation of the composition, the case of an In—M—Zn oxide that is an oxide semiconductor to be a CAAC-OS is described as an example. The element M is aluminum, gallium, yttrium, tin, or the like. Other elements which can be used as the element M include boron, silicon, titanium, iron, nickel, germanium, yttrium, zirconium, molybdenum, lanthanum, cerium, neodymium, hafnium, tantalum, and tungsten.

Figure 4:
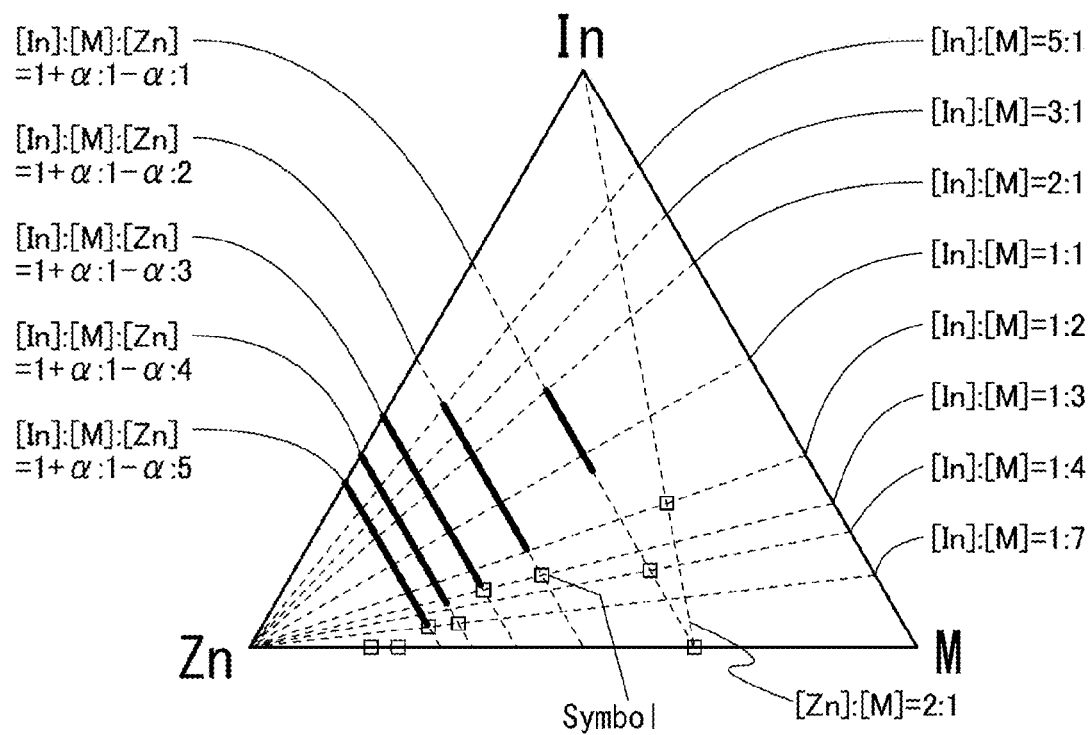
FIG. 4 is a triangular diagram for explaining composition of an In—M—Zn oxide.

FIG. 4 is a triangular diagram whose vertices represent In, M, and Zn. In the diagram, [In] means the atomic concentration of In, [M] means the atomic concentration of the element M, and [Zn] means the atomic concentration of Zn.

A crystal of an In—M—Zn oxide is known to have a homologous structure and is represented by InMO$_3$(ZnO)$_m$ (m is a natural number). Since In and M can be interchanged, the crystal can also be represented by In$_{1+\alpha}$M$_{1-\alpha}$O$_3$(ZnO)$_m$. This composition is represented by any of the dashed lines denoted as [In]:[M]:[Zn]=1+$\alpha$:1-$\alpha$:1, [In]:[M]:[Zn]=1+$\alpha$:1-$\alpha$:2, [In]:[M]:[Zn]=1+$\alpha$:1-$\alpha$:3, [In]:[M]:[Zn]=1+$\alpha$:1-$\alpha$:4, and [In]:[M]:[Zn]=1+$\alpha$:1-$\alpha$:5 in FIG. 4.

It is known that thick lines on the dashed lines in FIG. 4 indicate compositions which allow a single-phase solid solution range when oxides (raw materials) are mixed and sintered at 1350° C., for example. Coordinates denoted by square symbols in FIG. 4 correspond to known compositions with which a spinel crystal structure is likely to be mixed.

For example, a compound represented by ZnM$_2$O$_4$, such as ZnGa$_2$O$_4$, is known as a compound having a spinel crystal structure, for example. When a composition is in the neighborhood of ZnM$_2$O$_4$ as illustrated in FIG. 4, that is, the ratio of In to Zn and M is close to 0:1:2, a spinel crystal structure is likely to be formed or mixed. Furthermore, it is preferable that the CAAC-OS have no spinel crystal structure in particular.

In addition, to increase carrier mobility, the indium content is preferably increased. In an oxide semiconductor containing indium, the element M, and zinc, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby carrier mobility can be increased.

Accordingly, the composition of the semiconductor 662 in FIGS. 2A to 2D is preferably in the neighborhood of the composition represented by the bold line in FIG. 4. When these compositions are employed, the channel formation region can have a high proportion of CAAC. Furthermore, in the case where the indium content in the semiconductor 662 is increased, the on-state current of the transistor can be increased.

When the channel formation region of the transistor includes a CAAC-OS as described above, a transistor having high reliability and high on-state current can be provided. In addition, a transistor capable of operating at high frequency can be provided.

When a CAAC-OS is deposited by a sputtering method, because of heating of a substrate surface (the surface on which the CAAC-OS is deposited), space heating, or the like, the composition of the film is sometimes different from that of a target as a source or the like. For example, since zinc oxide sublimates more easily than indium oxide, gallium oxide, or the like, the source and the film are likely to have different compositions. Thus, a source is preferably selected taking into account the change in composition. Note that a difference between the compositions of the source and the film is also affected by a pressure or a gas used for the deposition as well as a temperature.

In the case where the CAAC-OS is deposited by a sputtering method, a target including a polycrystalline structure is preferably used.

Structural Example 2 of Transistor

Figure 5A:
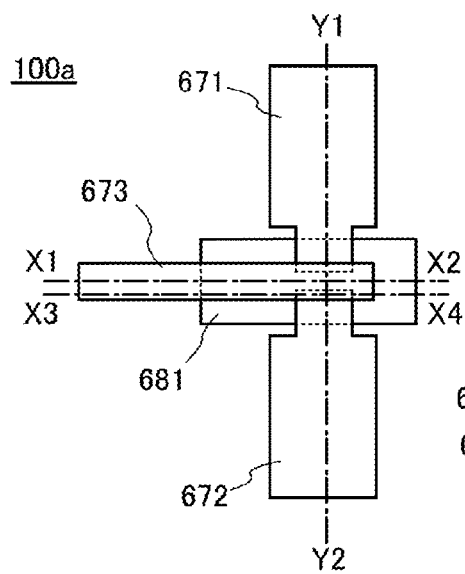
FIGS. 5A to 5D are a top view and cross-sectional views illustrating a structural example of a transistor.
Figure 5B:
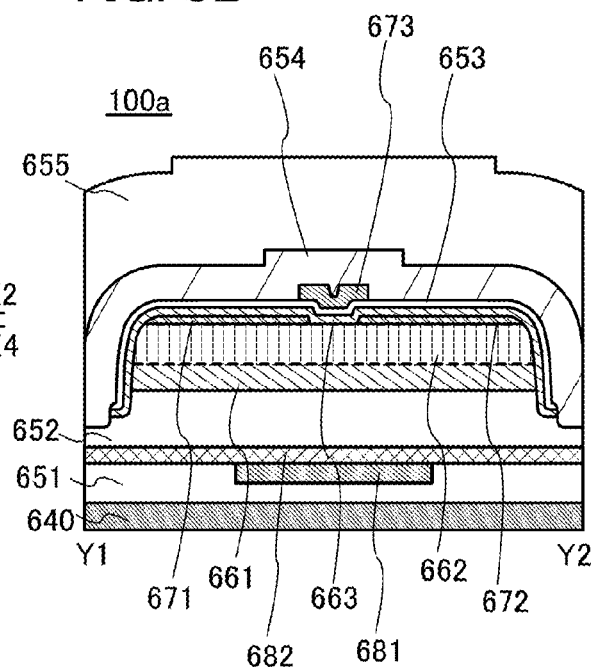
Figure 5C:
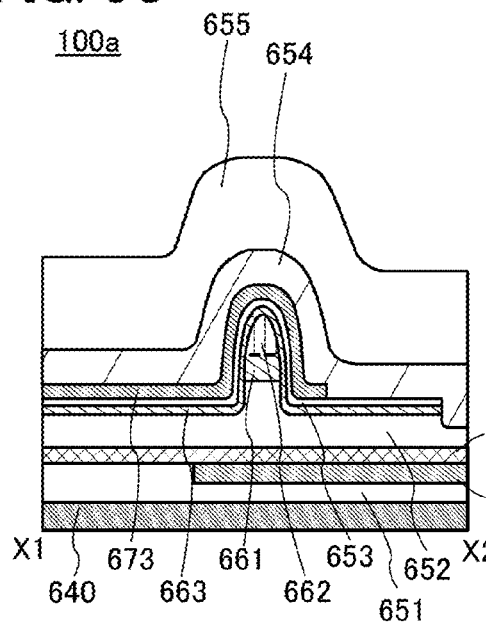
Figure 5D:
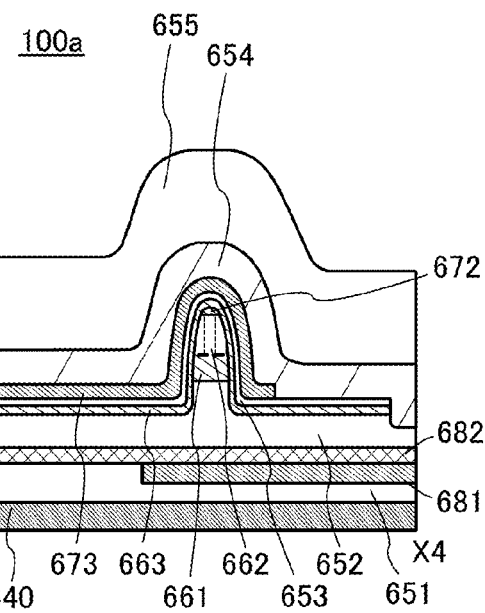

Although the example where one gate electrode is provided in the transistor is illustrated in FIGS. 2A to 2D, one embodiment of the present invention is not limited thereto. A plurality of gate electrodes may be provided in the transistor. FIGS. 5A to 5D illustrate an example where the transistor 100 illustrated in FIGS. 2A to 2D is provided with a conductive film 681 as a second gate electrode. FIG. 5A is a top view of a transistor 100a. FIG. 5B illustrates a cross section along the dashed-dotted line Y1-Y2 in FIG. 5A. FIG. 5C illustrates a cross section along the dashed-dotted line X1-X2 in FIG. 5A. FIG. 5D illustrates a cross section along the dashed-dotted line X3-X4 in FIG. 5A. In FIGS. 5A to 5D, some components are scaled up or down or omitted for easy understanding.

The transistor 100a illustrated in FIGS. 5A to 5D differ from the transistor illustrated in FIGS. 2A to 2D in that an insulating film 651, the conductive film 681, and an insulating film 682 are provided between the substrate 640 and the insulating film 652.

The insulating film 651 has a function of electrically isolating the substrate 640 and the conductive film 681 from each other. The insulating film 651 may be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 651, an organic resin such as a polyimide resin, a polyamide resin, an acrylic resin, a siloxane resin, an epoxy resin, or a phenol resin may be used. The insulating film 651 may be a stack including any of the above materials.

The description of the conductive film 673 can be referred to for a material which can be used for the conductive film 681. The conductive film 681 functions as a second gate electrode. The conductive film 681 may be supplied with a constant potential, or a potential or a signal that is the same as that supplied to the conductive film 673.

The insulating film 682 has a function of preventing oxygen contained in the insulating film 652 from decreasing by bonding to metal contained in the conductive film 681. The description of the insulating film 654 can be referred to for a material which can be used for the insulating film 682.

Structural Example 3 of Transistor

Figure 6A:
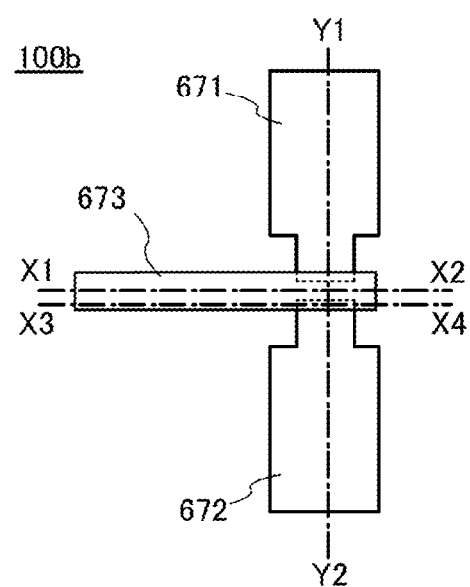
FIGS. 6A to 6D are a top view and cross-sectional views illustrating a structural example of a transistor.
Figure 6B:
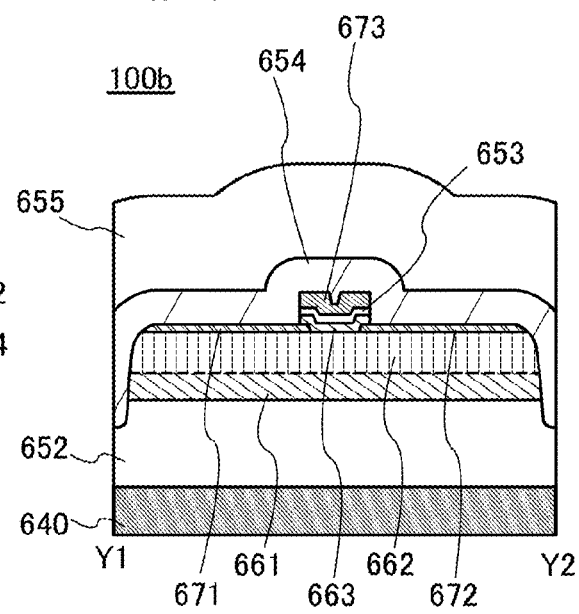
Figure 6C:
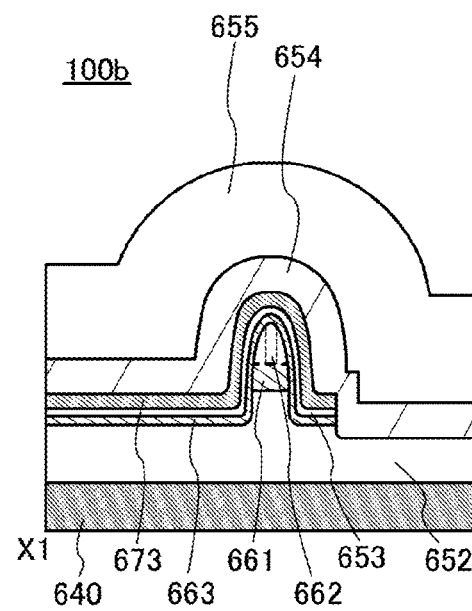
Figure 6D:
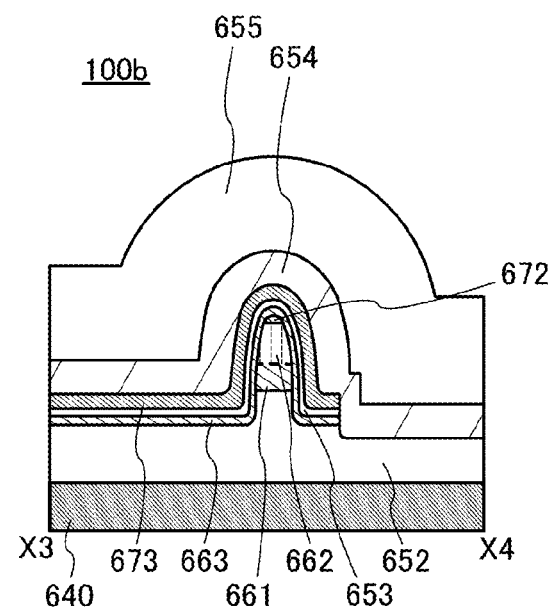

In the transistor 100 in FIGS. 2A to 2D, the semiconductor 663 and the insulating film 653 may be etched at the same time as the conductive film 673. One example is illustrated in FIGS. 6A to 6D. FIG. 6A is a top view of a transistor 100b. FIG. 6B illustrates a cross section along the dashed-dotted line Y1-Y2 in FIG. 6A. FIG. 6C illustrates a cross section along the dashed-dotted line X1-X2 in FIG. 6A. FIG. 6D illustrates a cross section along the dashed-dotted line X3-X4 in FIG. 6A. In FIGS. 6A to 6D, some components are scaled up or down or omitted for easy understanding.

In the transistor 100b in FIGS. 6A to 6D, the semiconductor 663 and the insulating film 653 are provided only below the conductive film 673 and are removed in other regions.

Structural Example 4 of Transistor

Figure 7A:
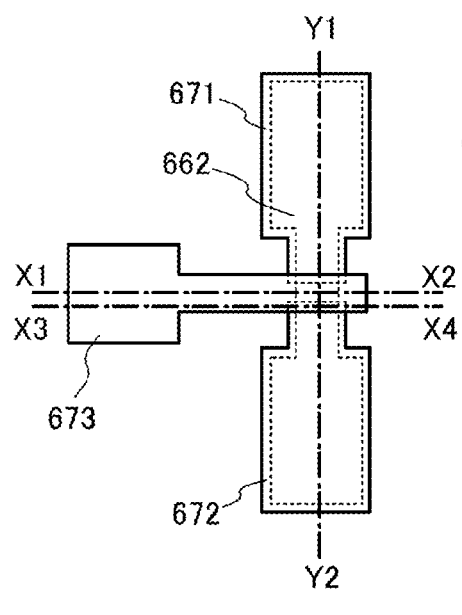
FIGS. 7A to 7D are a top view and cross-sectional views illustrating a structural example of a transistor.
Figure 7B:
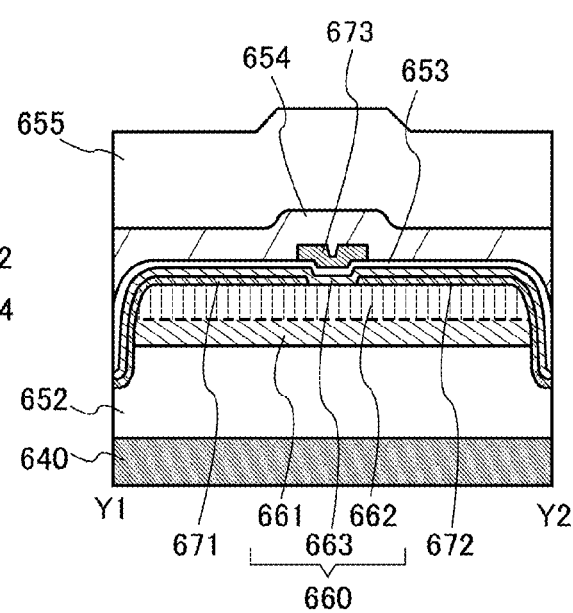
Figure 7C:
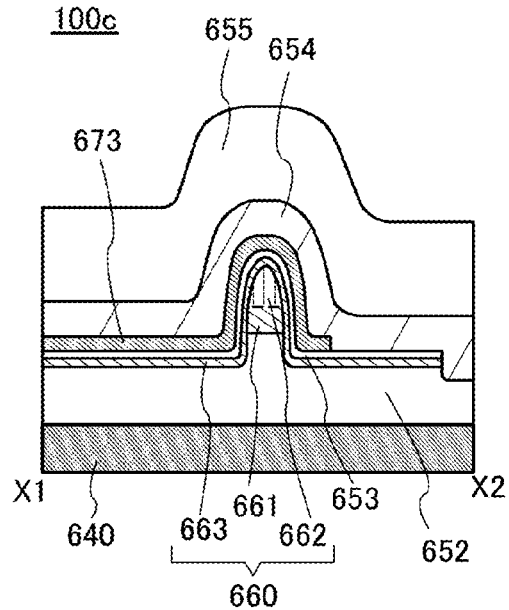
Figure 7D:
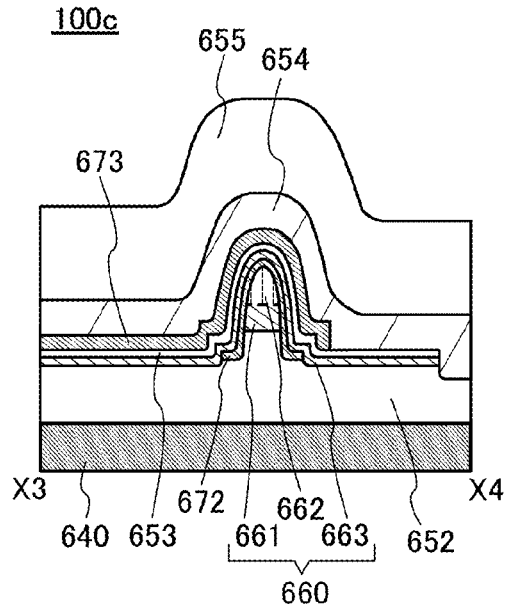

In the transistor 100 in FIGS. 2A to 2D, the conductive films 671 and 672 may be in contact with side surfaces of the semiconductors 661 and 662. One example is illustrated in FIGS. 7A to 7D. FIG. 7A is a top view of a transistor 100c. FIG. 7B illustrates a cross section along the dashed-dotted line Y1-Y2 in FIG. 7A. FIG. 7C illustrates a cross section along the dashed-dotted line X1-X2 in FIG. 7A. FIG. 7D illustrates a cross section along the dashed-dotted line X3-X4 in FIG. 7A. In FIGS. 7A to 7D, some components are scaled up or down or omitted for easy understanding.

Structural Example 5 of Transistor

Figure 8A:
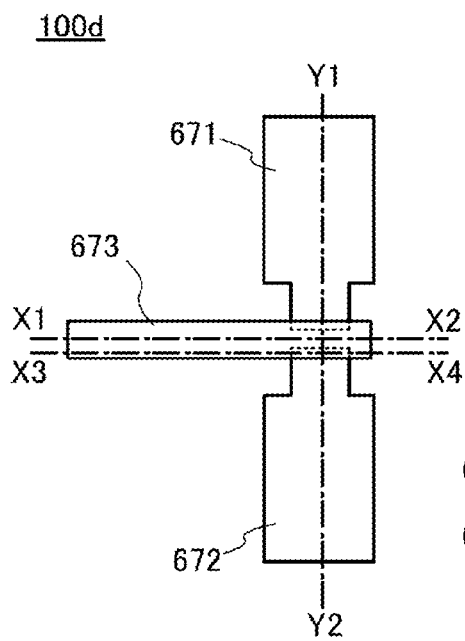
FIGS. 8A to 8D are a top view and cross-sectional views illustrating a structural example of a transistor.
Figure 8B:
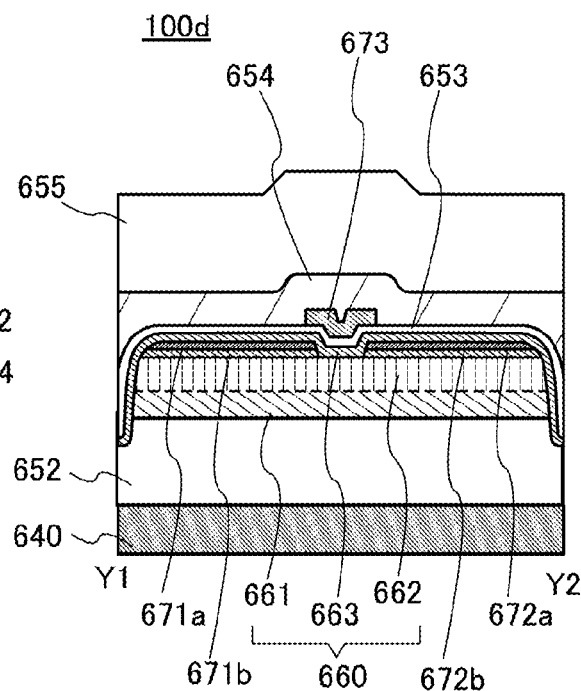
Figure 8C:
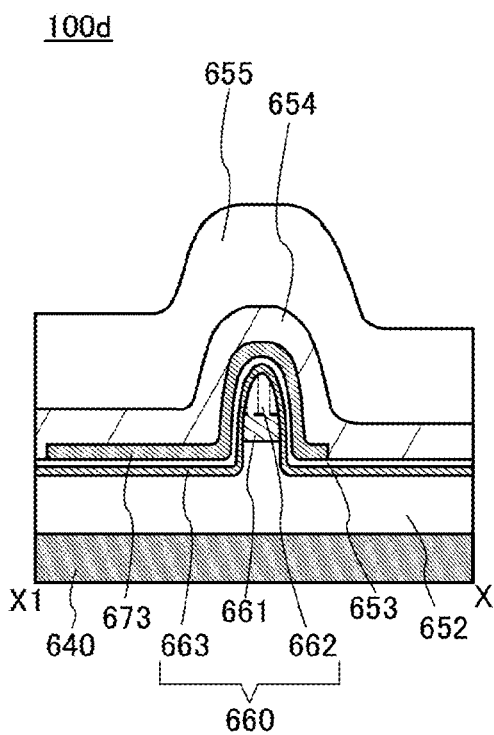
Figure 8D:
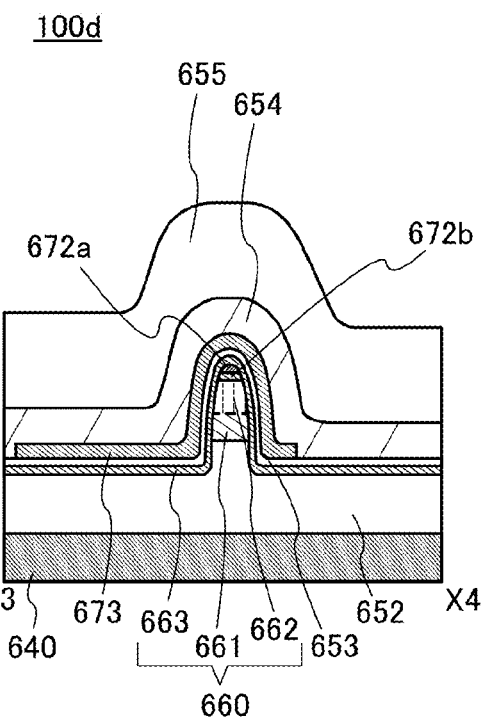

In the transistor 100 in FIGS. 2A to 2D, the conductive film 671 may have a layered structure of conductive films 671a and 671b. In addition, the conductive film 672 may have a layered structure of conductive films 672a and 672b. One example is illustrated in FIGS. 8A to 8D. FIG. 8A is a top view of a transistor 100d. FIG. 8B illustrates a cross section along the dashed-dotted line Y1-Y2 in FIG. 8A. FIG. 8C illustrates a cross section along the dashed-dotted line X1-X2 in FIG. 8A. FIG. 8D illustrates a cross section along the dashed-dotted line X3-X4 in FIG. 8A. In FIGS. 8A to 8D, some components are scaled up or down or omitted for easy understanding.

The conductive films 671b and 672b may be formed using a transparent conductor, an oxide semiconductor, a nitride semiconductor, or an oxynitride semiconductor, for example. The conductive films 671b and 672b may be formed using, for example, a film containing indium, tin, and oxygen, a film containing indium and zinc, a film containing indium, tungsten, and zinc, a film containing tin and zinc, a film containing zinc and gallium, a film containing zinc and aluminum, a film containing zinc and fluorine, a film containing zinc and boron, a film containing tin and antimony, a film containing tin and fluorine, a film containing titanium and niobium, or the like. Alternatively, any of these films may contain hydrogen, carbon, nitrogen, silicon, germanium, or argon.

The conductive films 671b and 672b may have a property of transmitting visible light. Alternatively, the conductive films 671b and 672b may have a property of not transmitting visible light, ultraviolet light, infrared light, or X-rays by reflecting or absorbing it. In some cases, such a property can suppress a change in electrical characteristics of the transistor due to stray light.

The conductive films 671b and 672b may preferably be formed using a layer which does not form a Schottky barrier with the semiconductor 662. Accordingly, on-state characteristics of the transistor can be improved.

Each of the conductive films 671a and 672a may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Note that the conductive films 671b and 672b may preferably be formed using a film having a resistance higher than that of the conductive films 671a and 672a. The conductive films 671b and 672b may preferably be formed using a film having a resistance lower than that of the channel of the transistor. For example, the conductive films 671b and 672b may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive films 671b and 672b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive films 671b and 672b (e.g., the film on the drain side) may preferably be provided.

Structural Example 6 of Transistor

Figure 9A:
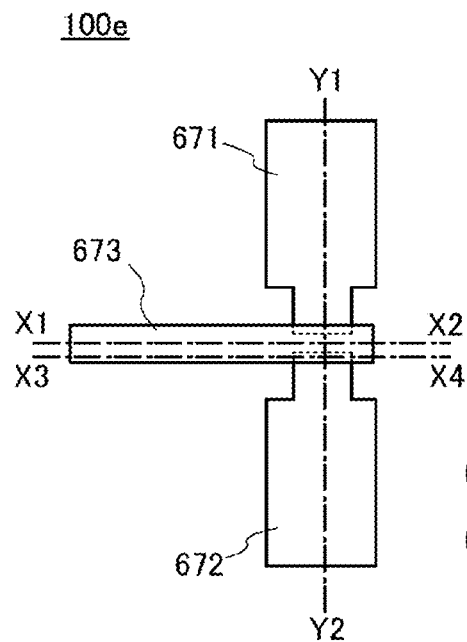
FIGS. 9A to 9D are a top view and cross-sectional views illustrating a structural example of a transistor.
Figure 9B:
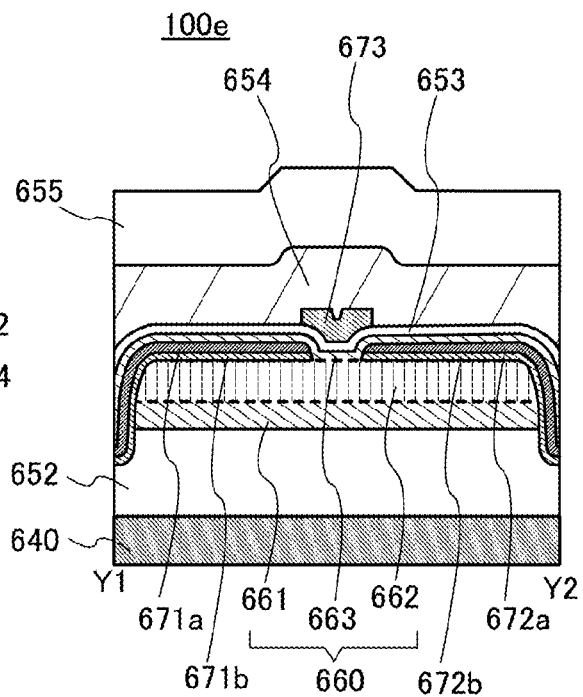
Figure 9C:
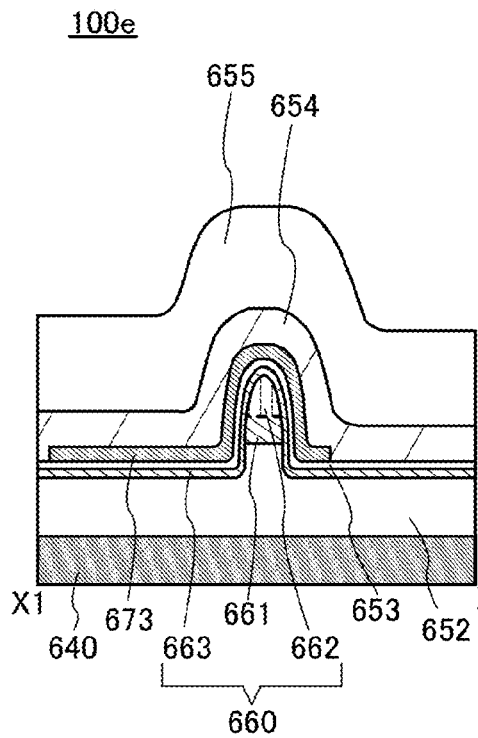
Figure 9D:
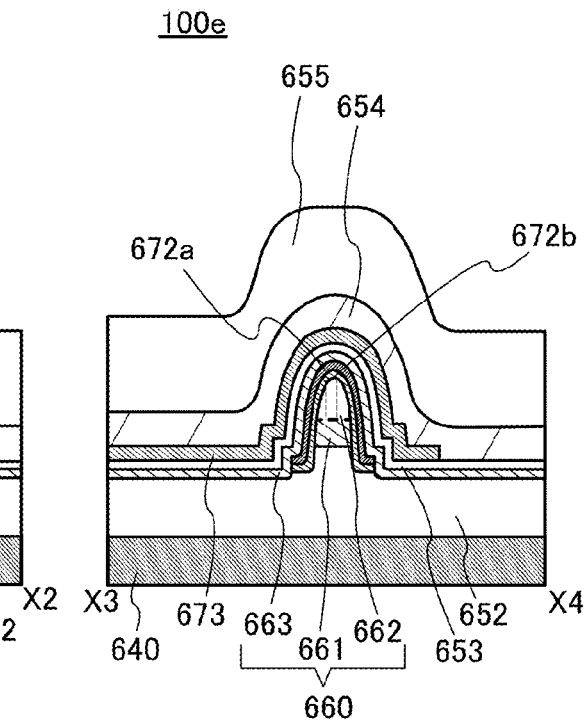

In the transistor 100c in FIGS. 7A to 7D, the conductive film 671 may have a layered structure of conductive films 671a and 671b. In addition, the conductive film 672 may have a layered structure of conductive films 672a and 672b. One example is illustrated in FIGS. 9A to 9D. FIG. 9A is a top view of a transistor 100e. FIG. 9B illustrates a cross section along the dashed-dotted line Y1-Y2 in FIG. 9A. FIG. 9C illustrates a cross section along the dashed-dotted line X1-X2 in FIG. 9A. FIG. 9D illustrates a cross section along the dashed-dotted line X3-X4 in FIG. 9A. In FIGS. 9A to 9D, some components are scaled up or down or omitted for easy understanding.

The description of FIGS. 8A to 8D can be referred to for the details of the conductive films 671a, 671b, 672a, and 672b in FIGS. 9A to 9D.

Embodiment 3

In this embodiment, an example of the semiconductor device 200 described in Embodiment 1 will be described with reference to FIG. 10.

Figure 10:
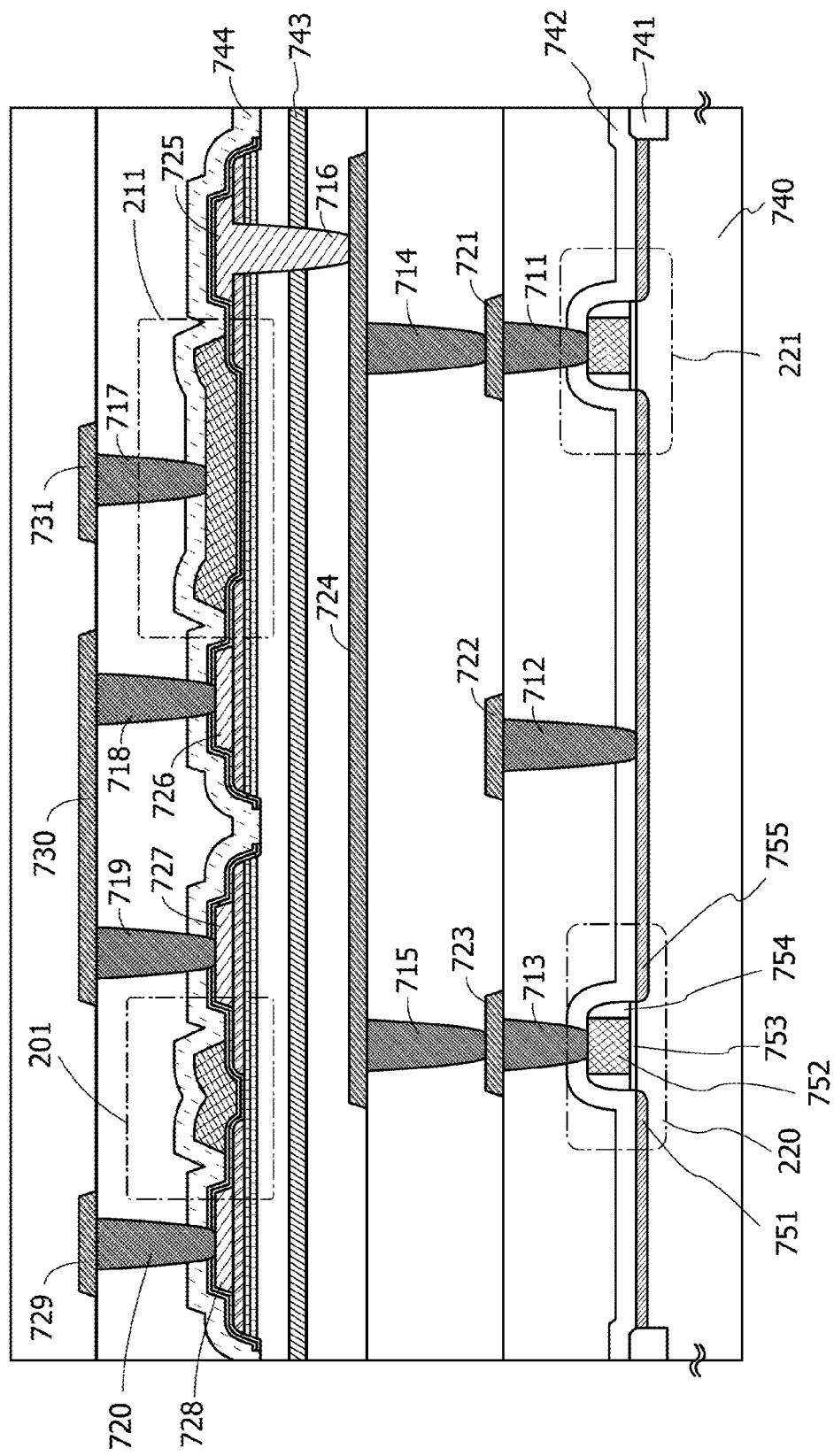
FIG. 10 is a cross-sectional view illustrating a structural example of a semiconductor device.

FIG. 10 is a cross-sectional view illustrating a structural example of the semiconductor device 200. The semiconductor device 200 illustrated in FIG. 10 includes a transistor 201, a transistor 211, a transistor 220, a transistor 221, a substrate 740, an element isolation layer 741, an insulating film 742, an insulating film 743, an insulating film 744, plugs 711 to 720, and wirings 721 to 731.

It is preferable that the transistors 220 and 221 include a first semiconductor material and the transistors 201 and 211 include a second semiconductor material. The first and second semiconductor materials preferably have different band gaps. For example, the first semiconductor material may be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material may be an oxide semiconductor.

FIG. 10 illustrates an example in which transistors including single crystal silicon (Si transistors) are used as the transistors 220 and 221. A transistor using single crystal silicon can easily operate at high speed.

The transistors 220 and 221 each include impurity regions 751 and 755 functioning as a source region and a drain region, a gate electrode 752, a gate insulating film 753, and a sidewall insulating layer 754.

Each of the transistors 220 and 221 may be either an n-channel transistor or a p-channel transistor; an appropriate transistor is used depending on a circuit. In the description of this embodiment, the transistors 220 and 221 are p-channel transistors (PMOS transistors).

The transistors 220 and 221 may each be provided with an impurity region serving as a lightly doped drain (LDD) region or an extension region under the sidewall insulating layer 754. In particular, when the transistors 220 and 221 are n-channel transistors, the LDD region or the extension region is preferably provided in order to suppress the deterioration due to hot carriers.

As the transistor 220 or 221, a transistor containing silicide (salicide) or a transistor that does not include the sidewall insulating layer 754 may be used. When a structure that contains silicide (salicide) is used, the resistance of the source region and the drain region can be further lowered and the speed of the semiconductor device can be increased. Furthermore, the semiconductor device can operate at low voltage; thus, power consumption of the semiconductor device can be reduced.

FIG. 10 illustrates an example in which the OS transistor described in Embodiment 2 is used as each of the transistors 201 and 211. The OS transistor has excellent subthreshold characteristics and can be downsized. Furthermore, the transistor can operate at a high speed because of its high switching speed and has low off-state current.

As the transistor 211, a long-channel OS transistor is preferably used. As the transistor 201, a short-channel OS transistor is preferably used.

As the substrate 740, a single crystal semiconductor substrate or a polycrystalline semiconductor substrate made of silicon or silicon carbide, a compound semiconductor substrate made of silicon germanium, an SOI substrate, or the like may be used. A transistor formed using a semiconductor substrate can easily operate at high speed. In the case of using a p-type single crystal silicon substrate as the substrate 740, an impurity element imparting n-type conductivity may be added to part of the substrate 740 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 740 may be a metal substrate or an insulating substrate provided with a semiconductor film. Examples of the metal substrate are a stainless steel substrate, a substrate including stainless steel foil, a tungsten substrate, and a substrate including tungsten foil. Examples of the insulating substrate are a glass substrate, a quartz substrate, a plastic substrate, a flexible substrate, an attachment film, paper including a fibrous material, and a base film. Examples of the glass substrate are a barium borosilicate glass substrate, an aluminoborosilicate glass substrate, and a soda lime glass substrate. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

The transistors 220 and 221 are isolated from other transistors formed on the substrate 740 by the element isolation layer 741. The element isolation layer 741 can be formed using an insulator containing one or more materials selected from aluminum oxide, aluminum oxynitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, tantalum oxide, and the like.

In the case where a silicon-based semiconductor material is used for the transistors 220 and 221 provided in a lower portion, the insulating film 742 provided in the vicinity of the semiconductor films of the transistors 220 and 221 preferably contains hydrogen. Hydrogen in the insulating film 742 terminates dangling bonds of silicon; accordingly, the reliability of the transistors 220 and 221 can be improved. For the insulating film 742, silicon oxide, silicon oxynitride, silicon nitride oxide, silicon nitride, or the like can be used.

In the case where an oxide semiconductor is used for the transistors 201 and 211 provided in an upper portion, hydrogen in an insulating film provided in the vicinity of the semiconductor films of the transistors 201 and 211 becomes a factor of generating carriers in the oxide semiconductor; thus, the reliability of the transistors 201 and 211 might be decreased. Therefore, it is particularly effective that the insulating film 743 having a function of preventing diffusion of hydrogen is provided between the transistors 220 and 221 and the transistors 201 and 211. The insulating film 743 makes hydrogen remain in the lower portion, thereby improving the reliability of the transistors 201 and 211. In addition, since the insulating film 743 suppresses diffusion of hydrogen from the lower portion to the upper portion, the reliability of the transistors 220 and 221 also can be improved.

The insulating film 743 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

In addition, the insulating film 744 having a function of preventing hydrogen diffusion is preferably formed so as to cover the transistors 201 and 211. For the insulating film 744, a material that is similar to that of the insulating film 743 can be used, and in particular, aluminum oxide is preferably used. The aluminum oxide film has a high shielding (blocking) effect of preventing penetration of both oxygen and impurities such as hydrogen and moisture. Thus, by using the aluminum oxide film as the insulating film 744, release of oxygen from the oxide semiconductor films included in the transistors 201 and 211 and entry of water and hydrogen into the oxide semiconductor films can be prevented.

The plugs 711 to 720 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the plugs are preferably formed using a low-resistance conductive material such as aluminum or copper. The plugs are further preferably formed using a Cu—Mn alloy, in which case manganese oxide formed at the interface with an insulator containing oxygen has a function of preventing Cu diffusion.

The wirings 721 to 731 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the wirings are preferably formed using a low-resistance conductive material such as aluminum or copper. The wirings are further preferably formed using a Cu—Mn alloy, in which case manganese oxide formed at the interface with an insulator containing oxygen has a function of preventing Cu diffusion.

The plug 716 and the wirings 725 to 728 may be formed in the same manufacturing process.

The transistor described in Embodiment 2 may also be formed over the transistors 201 and 211 as necessary.

In FIG. 10, regions without reference numerals and hatch patterns represent regions formed of an insulator. The regions can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the regions, an organic resin such as a polyimide resin, a polyamide resin, an acrylic resin, a siloxane resin, an epoxy resin, or a phenol resin can be used.

Figure 11A:
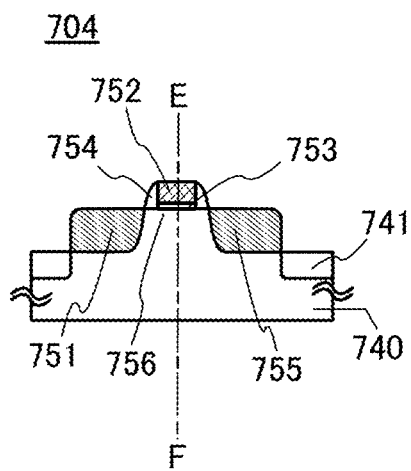
FIGS. 11A and 11B are cross-sectional views illustrating a structural example of a transistor.
Figure 11B:
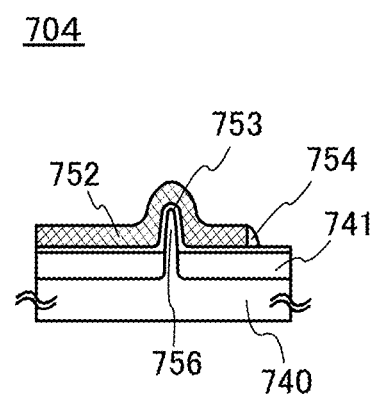

Here, instead of each of the transistors 220 and 221, a transistor 704 illustrated in FIGS. 11A and 11B may be used. FIG. 11B illustrates a cross section along the dashed-dotted line E-F in FIG. 11A. In the transistor 704, a semiconductor layer 756 (a portion of the semiconductor substrate) in which a channel is formed has a protrusion, and the gate insulating film 753 and the gate electrode 752 are provided along top and side surfaces of the protrusion. In addition, the element isolation layer 741 is provided. The transistor having such a shape is also referred to as a FIN transistor because it utilizes a protruding portion of the semiconductor substrate. Note that an insulating film serving as a mask for forming the protruding portion may be provided in contact with the top of the protruding portion. Although the case where the protruding portion is formed by processing a portion of the semiconductor substrate is described here, a semiconductor layer having a protruding shape may be formed by processing an SOI substrate.

When the semiconductor device 200 has the structure illustrated in FIG. 10, the OS transistors and the PMOS transistors can be formed over the same substrate. Since the transistor 201 occupies a small area, a highly integrated semiconductor device can be provided.

The structures, methods, and the like described in this embodiment can be used as appropriate in combination with any of the structures, methods, and the like described in other embodiments.

Embodiment 4

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 12A to 12F illustrate specific examples of these electronic devices.

Figure 12A:
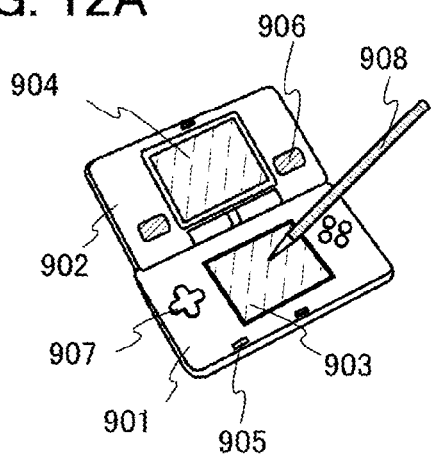
FIGS. 12A to 12F each illustrate an example of an electronic device.

FIG. 12A illustrates a portable game machine including a housing 901, a housing 902, a display portion 903, a display portion 904, a microphone 905, a speaker 906, an operation key 907, a stylus 908, and the like. Although the portable game machine in FIG. 12A has the two display portions 903 and 904, the number of display portions included in a portable game machine is not limited to this.

Figure 12B:
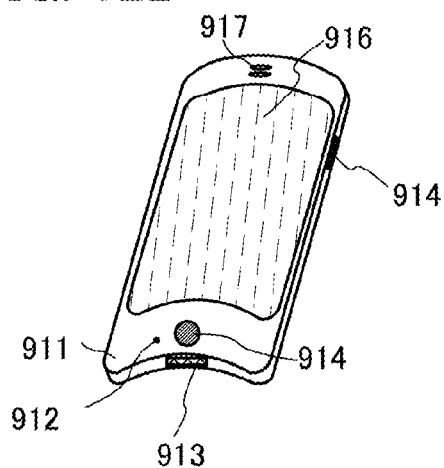

FIG. 12B illustrates a cellular phone, which is provided with a housing 911, a display portion 916, operation buttons 914, an external connection port 913, a speaker 917, a microphone 912, and the like. When the display portion 916 of the cellular phone illustrated in FIG. 12B is touched with a finger or the like, data can be input. Further, operations such as making a call and inputting a character can be performed by touch on the display portion 916 with a finger or the like. The power can be turned on or off with the operation button 914. In addition, types of images displayed on the display portion 916 can be switched; for example, switching images from a mail creation screen to a main menu screen is performed with the operation button 914.

Figure 12C:
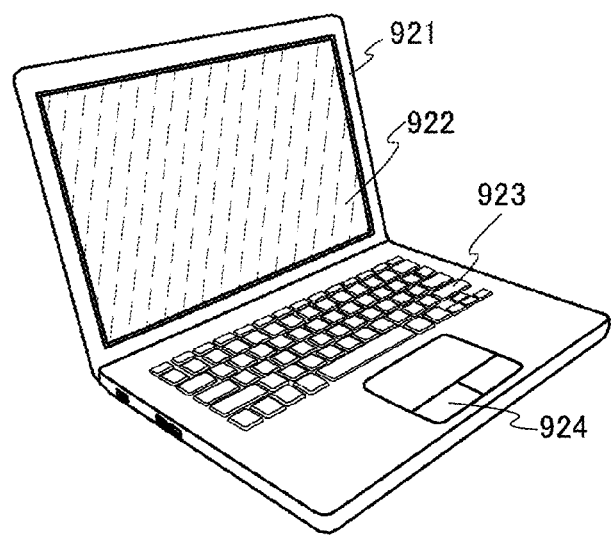

FIG. 12C illustrates a notebook personal computer, which includes a housing 921, a display portion 922, a keyboard 923, a pointing device 924, and the like.

Figure 12D:
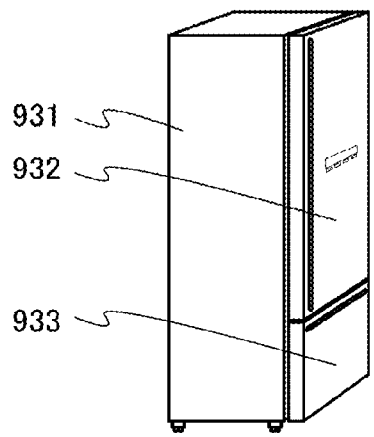

FIG. 12D illustrates an electric refrigerator-freezer including a housing 931, a door for a refrigerator 932, a door for a freezer 933, and the like.

Figure 12E:
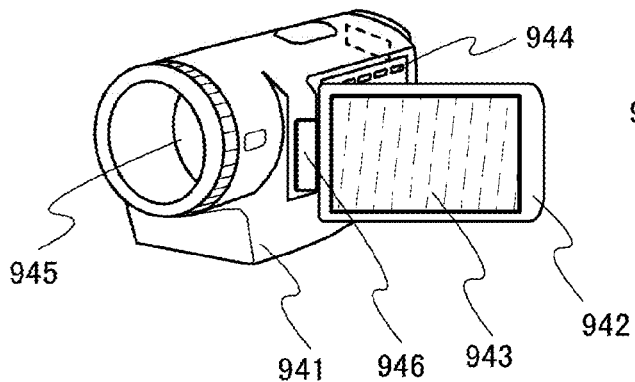

FIG. 12E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 12F:
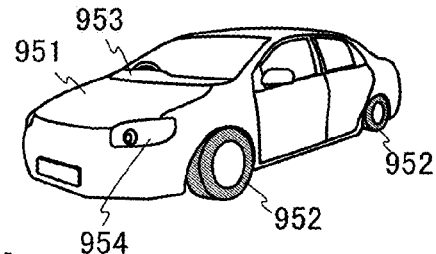

FIG. 12F illustrates an ordinary vehicle including a car body 951, wheels 952, a dashboard 953, lights 954, and the like.

Note that this embodiment can be combined with any of the other embodiments and examples in this specification as appropriate.

Embodiment 5

In this embodiment, application examples of an RF tag which can include the semiconductor device of one embodiment of the present invention will be described with reference to FIGS. 13A to 13F. The RF tag is widely used and can be provided for, for example, products such as bills, coins, securities, bearer bonds, documents (e.g., driver's licenses or resident cards, see FIG. 13A), recording media (e.g., DVDs or video tapes, see FIG. 13B), packaging containers (e.g., wrapping paper or bottles, see FIG. 13C), vehicles (e.g., bicycles, see FIG. 13D), personal belongings (e.g., bags or glasses), foods, plants, animals, human bodies, clothes, household goods, medical supplies such as medicine and chemicals, and electronic devices (e.g., liquid crystal display devices, EL display devices, television devices, or cellular phones), or tags on products (see FIGS. 13E and 13F).

An RF tag 4000 of one embodiment of the present invention is fixed to products by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Next, an example of use of a display device which can include the semiconductor device of one embodiment of the present invention will be described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be employed, for example.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using a micro electro mechanical system (MEMS) (e.g., a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), quantum dots, and the like. Other than the above, the display element, the display device, the light-emitting element, or the light-emitting device may include a display medium whose contrast, luminance, reflectance, transmittance, or the like is changed by electrical or magnetic effect. Examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. Examples of a display device including quantum dots in each pixel include a quantum dot display. Note that quantum dots may be provided not as a display element but in part of a backlight. By using quantum dots, display with high color purity can be performed. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. In the case where an LED chip is used, graphene or graphite may be positioned under an electrode or a nitride semiconductor of the LED chip. A plurality of graphene or graphite layers may be stacked and used as a multilayer film. When graphene or graphite is thus provided, a nitride semiconductor such as an n-type GaN semiconductor layer including crystals can be easily formed thereover. In addition, a p-type GaN semiconductor layer including crystals or the like may be provided thereover, whereby the LED chip can be formed. An MN layer may be provided between graphene or graphite and the n-type GaN semiconductor layer including crystals. The GaN semiconductor layer of the LED chip may be formed by MOCVD. Note that the GaN semiconductor layer of the LED chip can be formed by a sputtering method when graphene is provided. In a display element using a micro electro mechanical system (MEMS), a drying agent may be provided in a space in which the display element is sealed (e.g., between an element substrate provided with the display element and a counter substrate facing the element substrate). By providing the drying agent, moisture can be prevented from making a MEMS or the like difficult to move or easy to deteriorate.

Note that this embodiment can be combined with any of the other embodiments and examples in this specification as appropriate.

Example 1

In this example, the transistor 100 illustrated in FIGS. 2A to 2D was experimentally fabricated to evaluate its transistor characteristics.

A silicon wafer was used as the substrate 640.

As the insulating film 652, a 300-nm-thick silicon oxynitride film was formed and a surface of the insulating film 652 was planarized by CMP treatment. In order to make the insulating film 652 contain excess oxygen, oxygen ions were implanted into the insulating film 652.

A 20-nm-thick In—Ga—Zn oxide, a 15-nm-thick In—Ga—Zn oxide, and a 5-nm-thick In—Ga—Zn oxide were formed as the semiconductors 661, 662, and 663, respectively. All these In—Ga—Zn oxides were formed by a DC sputtering method. The atomic ratios of In:Ga:Zn in targets used for sputtering were 1:3:4, 1:1:1, and 1:3:2 for the semiconductors 661, 662, and 663, respectively.

A 20-nm-thick tungsten was formed by a sputtering method for the conductive films 671 and 672.

A 10-nm-thick silicon oxynitride film was formed as the gate insulating film (the insulating film 653) by a plasma-enhanced CVD (PECVD) method.

A stacked-layer film of a 10-nm-thick titanium nitride and a 30-nm-thick tungsten was formed as the gate electrode (the conductive film 673) by a sputtering method. The titanium nitride of the stacked-layer film is in contact with the gate insulating film.

Note that resists used for forming the conductive films 671, 672, and 673 were exposed to light in an electron beam exposure apparatus.

A stacked-layer film of a 10-nm-thick aluminum oxide film formed by an atomic layer deposition (ALD) method and a 30-nm-thick aluminum oxide film formed by a sputtering method was formed as the insulating film 654. A 150-nm-thick silicon oxynitride film was formed as the insulating film 655 by a PECVD method.

Figure 14:
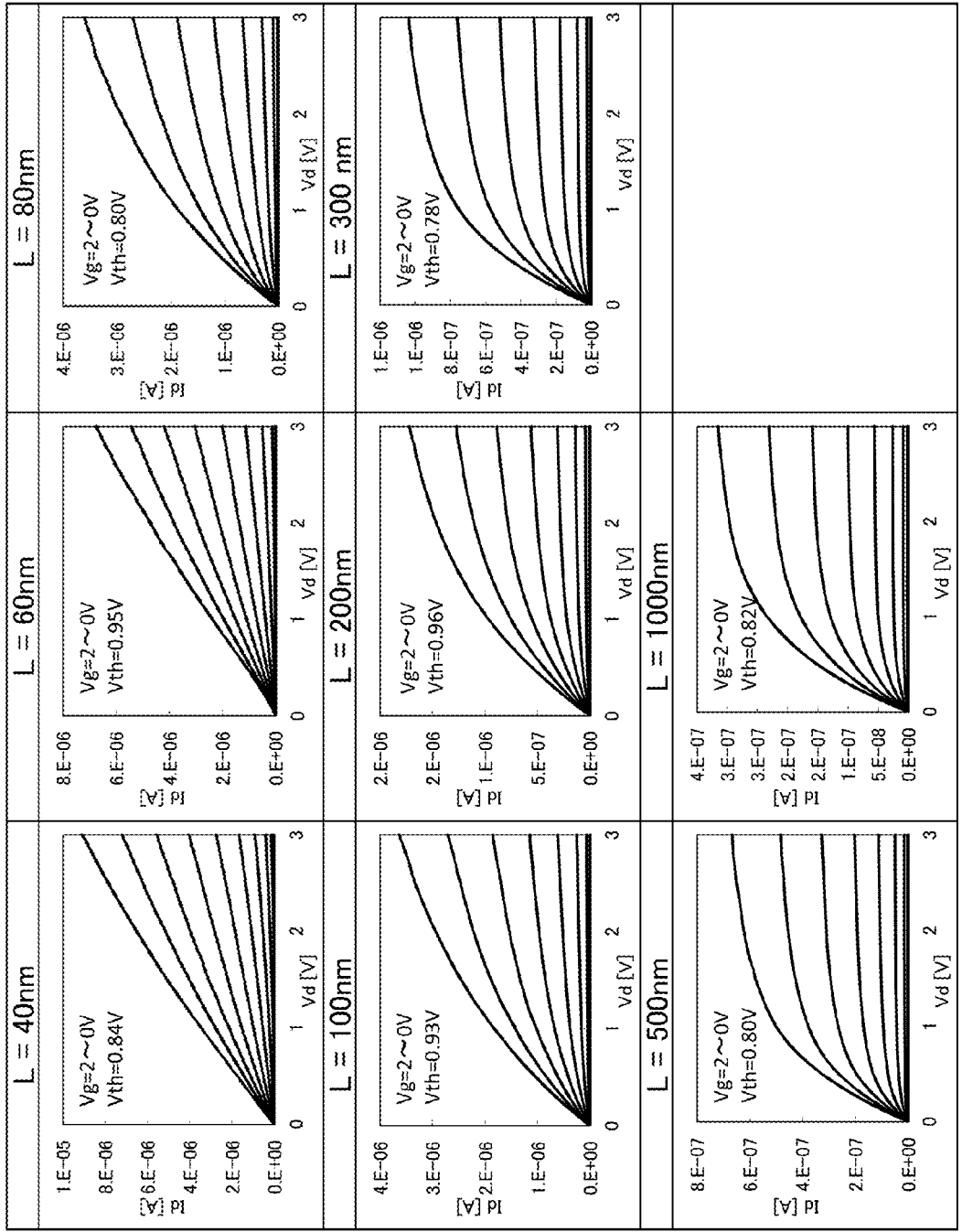
FIG. 14 shows $V_d$–$I_d$ characteristics of fabricated transistors.

FIG. 14 shows measured drain voltage-drain current ($V_d$–$I_d$) characteristics of fabricated transistors. Transistors with designed channel lengths (L) of 40 nm, 60 nm, 80 nm, 100 nm, 200 nm, 300 nm, 500 nm, and 1000 nm were measured. The channel width (W) of each of the measured transistors is 40 nm. The measurement was performed at gate voltages ($V_g$) from 0 V to 2 V in increments of 0.2 V. In the diagram, the threshold voltage ($V_{th}$) of each transistor at $V_d$=0.1 V is also shown.

The increase rates of drain currents per 0.1 V of drain voltage which were calculated from FIG. 14 are shown in the table below. Drain currents at $V_d$=2.0 V and $V_d$=2.1 V were extracted from the $V_d$–$I_d$ characteristics measured at $V_g$=2.0 V, and the increase rates were calculated according to the definition of the increase rate in Embodiment 1.

TABLE 1

| Channel length [nm] | Increase rate [%] |
|---|---|
| 40 | 4.2 |
| 60 | 4.3 |
| 80 | 3.4 |
| 100 | 3.0 |
| 200 | 2.3 |
| 300 | 1.0 |
| 500 | 0.9 |
| 1000 | 0.7 |

From the measurement results in FIG. 14, no saturation of the drain current is observed when the channel length (L) was 200 nm or less. In particular, when the channel length (L) was 100 nm or less, favorable linearity between drain voltage and drain current is observed.

It has been confirmed that the transistor 100 illustrated in FIGS. 2A to 2D can be used as the transistor 201 described in Embodiment 1.

Example 2

In this example, electrical characteristics of an OS transistor which were calculated by device simulation will be described.

Figure 15A:
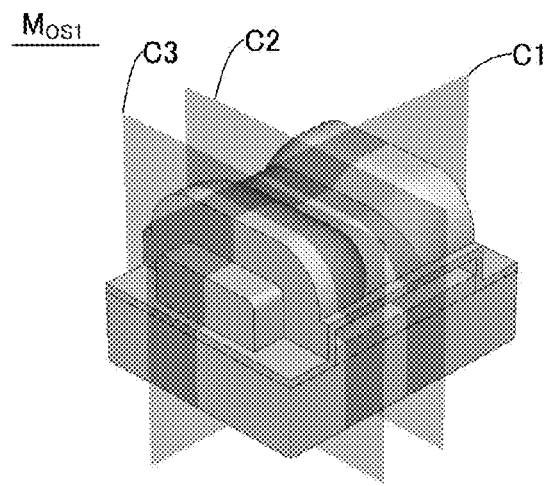
FIGS. 15A to 15D illustrate a device structure of an oxide semiconductor transistor used in device simulation.
Figure 15B:
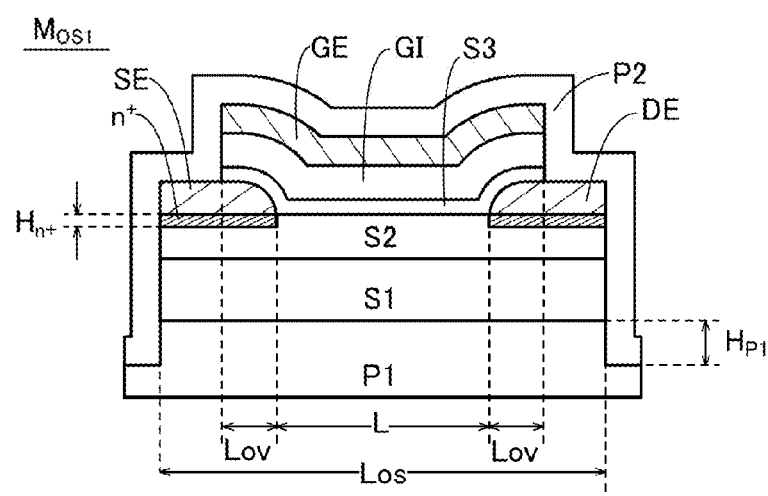
Figures 15C, 15D:
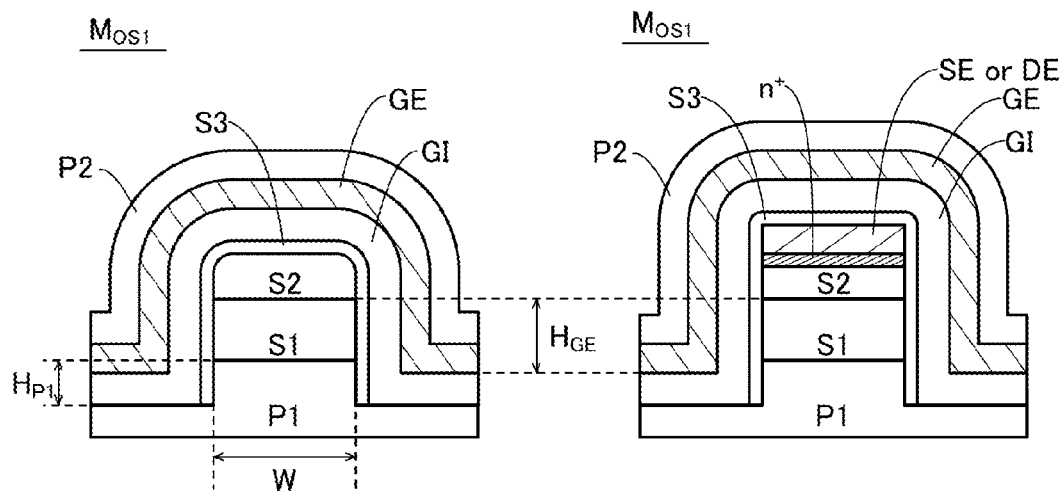

Sentaurus manufactured by Synopsys, Inc. was used for the calculation with a 3D structure. FIGS. 15A to 15D illustrate the structure of a transistor used for the calculation. Here, the transistor used for the calculation is referred to as a transistor $M_{OS1}$. FIG. 15A is a bird's-eye view of the transistor $M_{OS1}$. FIGS. 15B, 15C, and 15D are cross-sectional views taken along planes C1, C2, and C3 in FIG. 15A, respectively. FIG. 15B is a cross-sectional view of the transistor $M_{OS1}$ in the channel length direction. FIGS. 15C and 15D are cross-sectional views of the transistor $M_{OS1}$ in the channel width direction. As illustrated in FIGS. 15A to 15D, the transistor $M_{OS1}$ has an s-channel structure.

GE, SE, and DE are a gate electrode, a source electrode, and a drain electrode, respectively. GI is a gate insulating layer. Layers P1 and P2 are insulating layers. Layers S1, S2, and S3 are oxide semiconductor layers and form an island of the transistor $M_{OS1}$. In a region of the layer S2 which overlaps with the source electrode and a region of the layer S2 which overlaps with the drain electrode, regions (n⁺) having high donor density are formed. $H_{n+}$ is the thickness of the region n+.

L is the channel length, which is the distance between end portions of the source electrode and the drain electrode. W is the channel width. Los is the length of the island, specifically the length of the layer S1, in the channel length direction. Lov is the length in the channel length direction of a region where the layer S2 overlaps with the source electrode or the drain electrode. $H_{GE}$ is the length of a region of the gate electrode which extends in the depth direction below a lower surface of the layer S2. The transistor $M_{OS1}$ having a positive $H_{GE}$ value can be regarded as having the s-channel structure. In the example of FIG. 15C, $H_{GE}$ corresponds to a value obtained by subtracting the thickness of the gate insulating layer GI from the sum of $H_{P1}$ and the thickness of the layer S1.

The following table shows conditions used for the calculation. FIGS. 16A and 16B, FIGS. 17A and 17B, and FIGS. 18A and 18B show electrical characteristics and the like of the transistor MOS1 which were obtained by calculation. As shown in Table 2, the layers S1 and S3 differ from each other only in thickness and are assumed to be oxide semiconductors having the same physical properties. The layer S2 has a smaller bandgap than the layers S1 and S3. Although not illustrated in FIGS. 15A to 15D, the transistor MOS1 includes a back gate electrode (BG) overlapping with the layer S1 with the layer P1 provided therebetween. The electrical characteristics shown in FIGS. 16A and 16B, FIGS. 17A and 17B, and FIGS. 18A and 18B were obtained when the voltage of the back gate electrode was 0 V.

TABLE 2

| Transistor | Channel length L | 72 nm |
|---|---|---|
| | Los | 152 nm |
| | Lov | 20 nm |
| | Channel width W | 73 nm |
| | $H_{P1}$ | 15 nm |
| | $H_{GE}$ | 25 nm |
| | $H_{n+}$ | 1 nm |
| GI | Relative dielectric constant | 4.1 |
| | Thickness | 10 nm |
| S3 | Electron affinity | 4.3 eV |
| | Bandgap Eg | 3.7 eV |
| | Relative dielectric constant | 15 |
| | Donor density | $6.60 \times 10^{-9}$ cm$^{-3}$ |
| | Electron mobility | 0.1 cm²/Vs |
| | Hole mobility | 0.01 cm²/Vs |
| | Effective density of states in conduction band, Nc | $5.00 \times 10^{18}$ cm$^{-3}$ |
| | Effective density of states in valence band, Nv | $5.00 \times 10^{18}$ cm$^{-3}$ |
| | Thickness | 5 nm |
| S2 | Electron affinity | 4.6 eV |
| | Bandgap Eg | 3.2 eV |
| | Relative dielectric constant | 15 |
| | Donor density | $6.60 \times 10^{-9}$ cm$^{-3}$ |
| | Donor density (n⁺ region) | $5.00 \times 10^{18}$ cm$^{-3}$ |
| | Electron mobility | 20 cm²/Vs |
| | Hole mobility | 0.01 cm²/Vs |
| | Effective density of states in conduction band, Nc | $5.00 \times 10^{18}$ cm$^{-3}$ |
| | Effective density of states in valence band, Nv | $5.00 \times 10^{18}$ cm$^{-3}$ |
| | Thickness | 15 nm |
| S1 | Electron affinity | 4.3 eV |
| | Bandgap Eg | 3.7 eV |
| | Relative dielectric constant | 15 |
| | Donor density | $6.60 \times 10^{-9}$ cm$^{-3}$ |
| | Electron mobility | 0.1 cm²/Vs |
| | Hole mobility | 0.01 cm²/Vs |
| | Effective density of states in conduction band, Nc | $5.00 \times 10^{18}$ cm$^{-3}$ |
| | Effective density of states in valence band, Nv | $5.00 \times 10^{18}$ cm$^{-3}$ |
| | Thickness | 20 nm |
| P1 | Relative dielectric constant | 4.1 |
| | Thickness | 400 nm |
| P2 | Relative dielectric constant | 4.1 |
| | Thickness | 10 nm |
| GE, BG | Work function | 5 eV |
| SE | Work function | 4.6 eV |
| DE | Thickness | 10 nm |

Figure 16A:
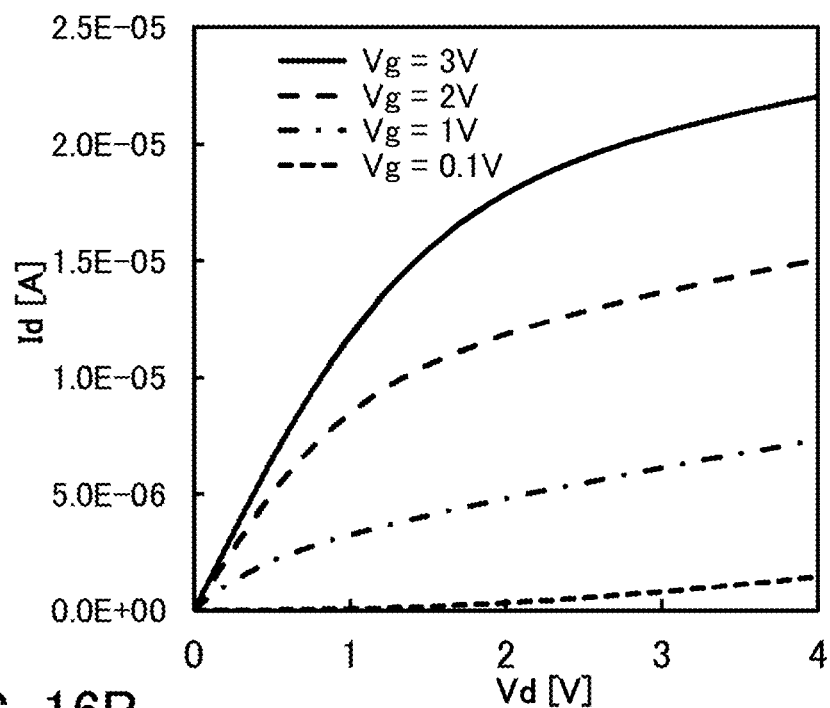
FIGS. 16A and 16B show $I_d$–$V_d$ characteristics and $I_d$–$V_g$ characteristics obtained by device simulation.
Figure 16B:
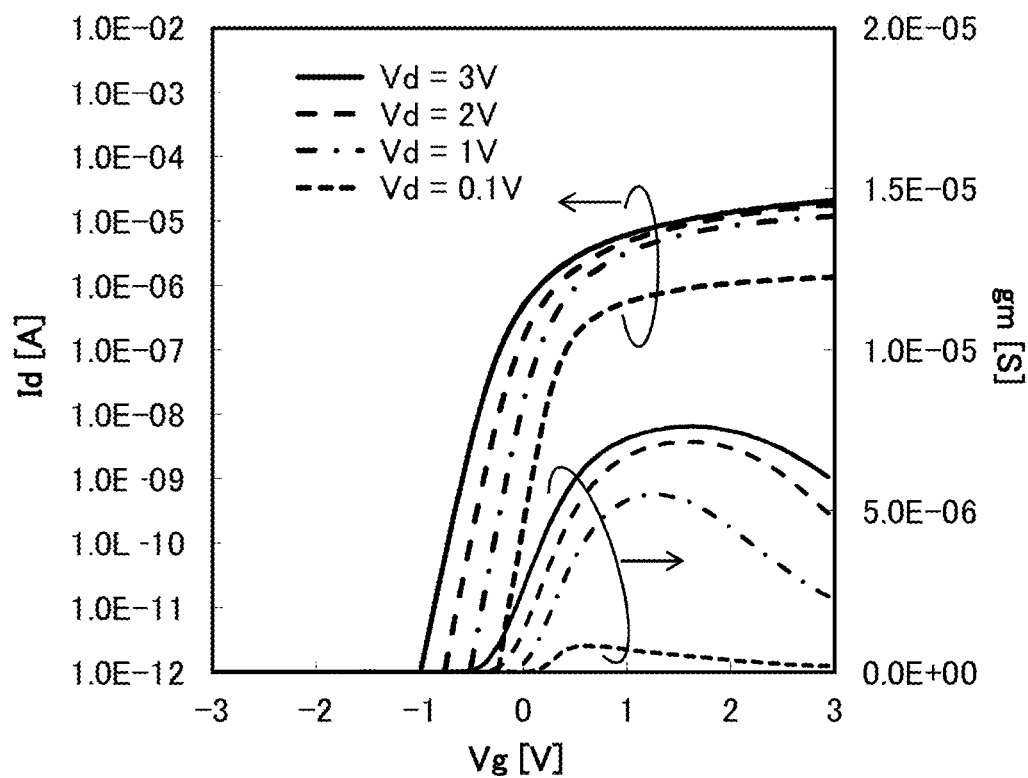

FIGS. 16A and 16B show $I_d$-$V_d$ characteristics and $I_d$-$V_g$ characteristics of the transistor $M_{OS1}$, respectively. FIG. 16B also shows transconductance $g_m$ with respect to gate voltage $V_g$. It can be confirmed from FIG. 16A that the transistor MOS1 has non-saturation characteristics where drain current is not saturated. Note that it has also been confirmed that an increase in the channel length of the transistor MOS1 tends to saturate the characteristics of the transistor MOS1.

Figure 17A:
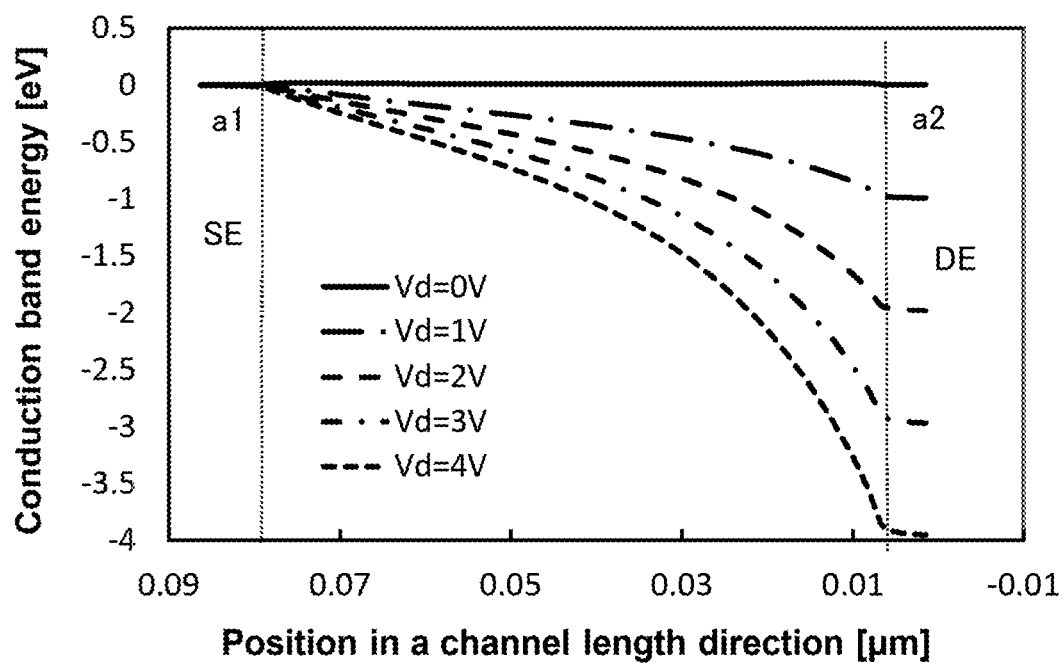
FIGS. 17A and 17B are energy band diagrams obtained by device simulation.
Figure 17B:
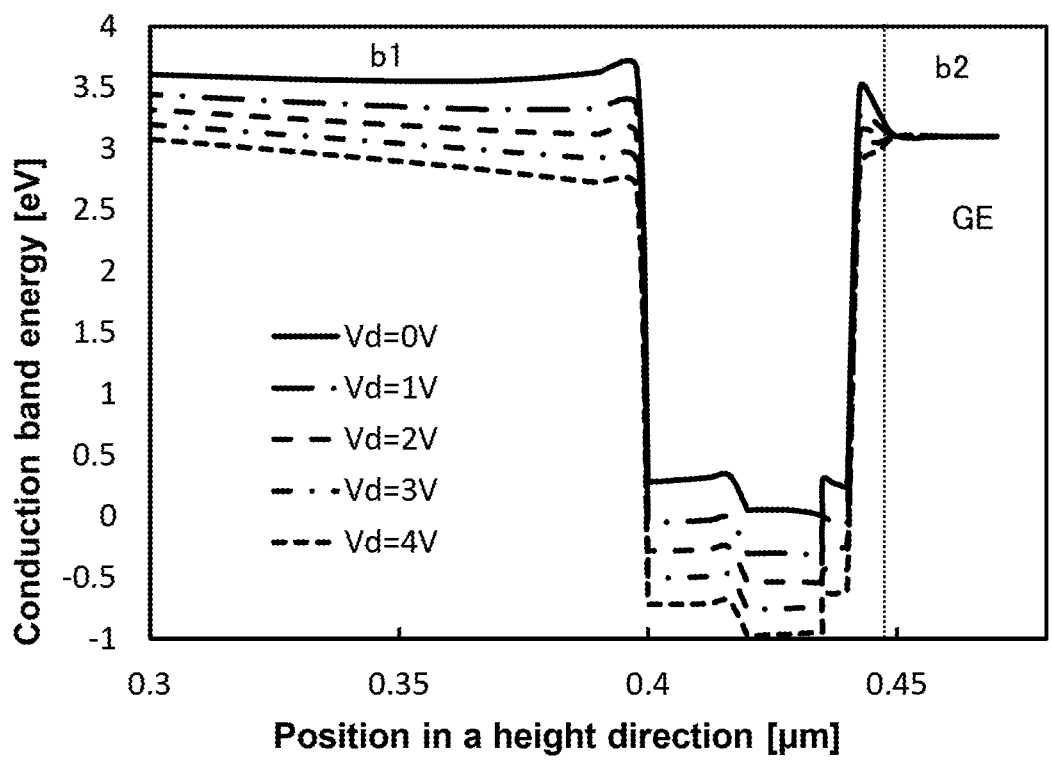
Figure 18A:
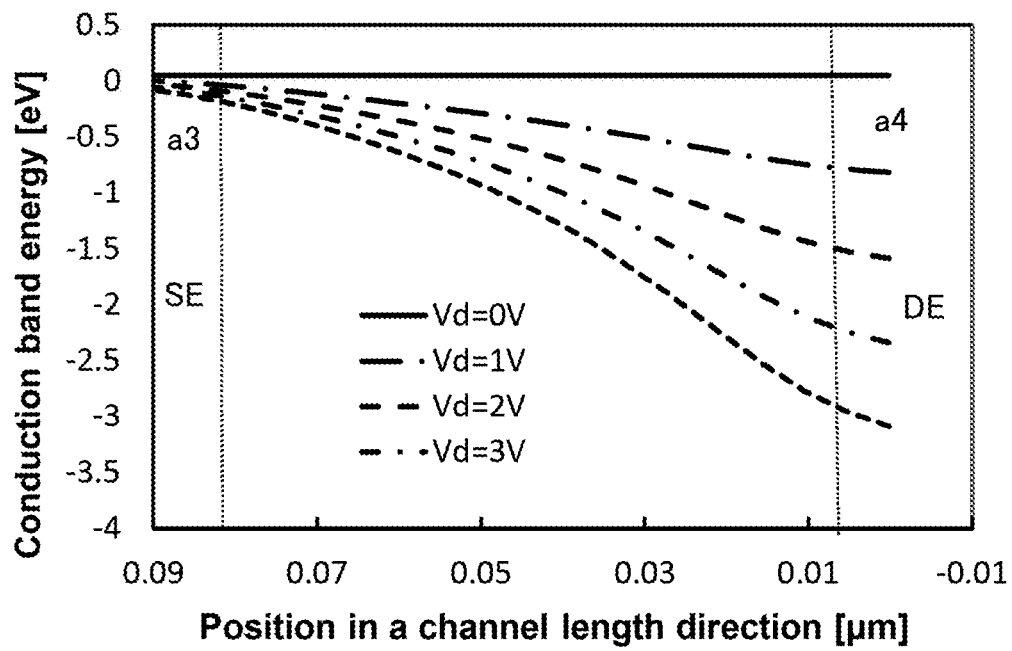
FIG. 18A is an energy band diagram obtained by device simulation.
Figure 18B:
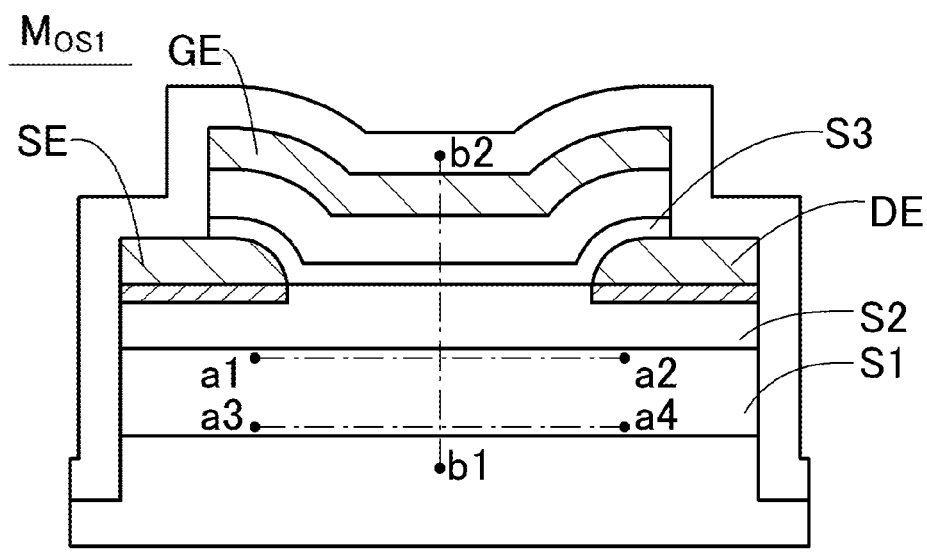
FIG. 18B illustrates the positions in an oxide transistor used in calculation of energy band states.

Energy band structures were obtained by calculation. The calculation results are shown in FIGS. 17A, 17B, and 18A. FIG. 18B illustrates positions in the transistor $M_{OS1}$ at which the energy band structures were calculated. FIG. 17A is an energy band diagram along the section a1-a2. The section a1-a2 is a portion which includes the middle of the channel width W of the transistor MOS1 and is 0.5 nm below the interface between the layer S1 and the layer S2. FIG. 17B is an energy band diagram along the section b1-b2. The section b1-b2 is a portion which includes the middle of the channel width W and the middle of the channel length L of the transistor $M_{OS1}$. FIG. 18A is an energy band diagram along the section a3-a4. The section a3-a4 is a portion which includes the middle of the channel width W of the transistor MOS1 and is 14.5 nm below the interface between the layer Si and the layer S2.

FIGS. 17A, 17B, and 18A demonstrate that as the drain voltage $V_d$ increases, the change in channel potential due to drain electric field increases.

The current density distributions in the oxide semiconductor layer (S1, S2, and S3) of the transistor $M_{OS1}$ were calculated. The current density distributions were calculated at drain voltages $V_d$ of 1 V, 2 V, 3 V, and 4 V with the gate voltage $V_g$ fixed to 1 V and the source voltage $V_s$ fixed to 0 V. The results are shown in FIGS. 19A to 19D and FIGS. 20A to 20D. FIGS. 19A to 19D show current density distributions on cross sections in the channel length direction. FIGS. 20A to 20D show current density distributions on cross sections in the channel width direction.

As shown in FIGS. 19A to 19D and FIGS. 20A to 20D, it has been confirmed that a channel is formed in the layer S2 of the oxide semiconductor layer (S1, S2, and S3). This means that the transistor $M_{OS1}$ is a buried-channel transistor. It has also been confirmed that as the drain voltage $V_d$ increases, the current density on the back channel side of the layer S2 increases. In other words, the device simulation in this example suggests that $I_d$-$V_d$ characteristics of an OS transistor with a channel length of 100 nm or less are not saturated because a current flows to the back channel owing to the increase in drain voltage $V_d$.

Example 3

In this example, the transistor 100 illustrated in FIGS. 2A to 2D was experimentally fabricated to evaluate its frequency characteristics.

Two different kinds of transistors (hereinafter referred to as Transistor A and Transistor B) were fabricated and evaluated. As in FIGS. 2A to 2D, Transistors A and B each include three semiconductors (the semiconductors 661 to 663).

Transistors A and B each include a 20-nm-thick In—Ga—Zn oxide as the semiconductor 661, a 15-nm-thick In—Ga—Zn oxide as the semiconductor 662, and a 5-nm-thick In—Ga—Zn oxide as the semiconductor 663. All these In—Ga—Zn oxides were formed by a DC sputtering method. The atomic ratios (In:Ga:Zn) of metal elements used in sputtering targets are shown in Table 3.

TABLE 3

|  | Transistor A | Transistor B |
| --- | --- | --- |
| Semiconductor 663 | In:Ga:Zn = 1:3:2 | In:Ga:Zn = 1:3:2 |
| Semiconductor 662 | In:Ga:Zn = 1:1:1 | In:Ga:Zn = 4:2:4.1 |
| Semiconductor 661 | In:Ga:Zn = 1:3:4 | In:Ga:Zn = 1:3:4 |

A silicon wafer was used as the substrate 640 of Transistors A and B.

As the insulating film 652, a 300-nm-thick silicon oxynitride film was formed and a surface of the insulating film 652 was planarized by CMP treatment. In order to make the insulating film 652 contain excess oxygen, oxygen ions were implanted into the insulating film 652.

A 20-nm-thick tungsten was formed by a sputtering method for the conductive films 671 and 672.

A 10-nm-thick silicon oxynitride film was formed as the gate insulating film (the insulating film 653) by a plasma-enhanced CVD (PECVD) method.

A stacked-layer film of a 10-nm-thick titanium nitride and a 30-nm-thick tungsten was formed as the gate electrode (the conductive film 673) by a sputtering method. The titanium nitride of the stacked-layer film is in contact with the gate insulating film.

Note that resists used for forming the conductive films 671, 672, and 673 were exposed to light in an electron beam exposure apparatus.

A 40-nm-thick aluminum oxide film was formed as the insulating film 654 by a sputtering method to cover Transistors A and B, and a 150-nm-thick silicon oxynitride film was formed as the insulating film 655 by a PECVD method.

Next, the frequency characteristics of Transistors A and B were evaluated. A plurality of transistors each designed with a channel length L of 60 nm and a channel width W of 60 nm were connected in parallel to measure frequency characteristics.

A network analyzer used in measurement has a standard impedance of 50Ω. When the impedance of a transistor to be measured is high, measurement accuracy is decreased in some cases. Thus, impedance was decreased by increasing the channel width of a transistor. Specifically, the channel width of the transistor was increased by connecting 300 transistors each having a channel width of 60 nm and adding up the channel widths of the plurality of transistors.

Figure 21:
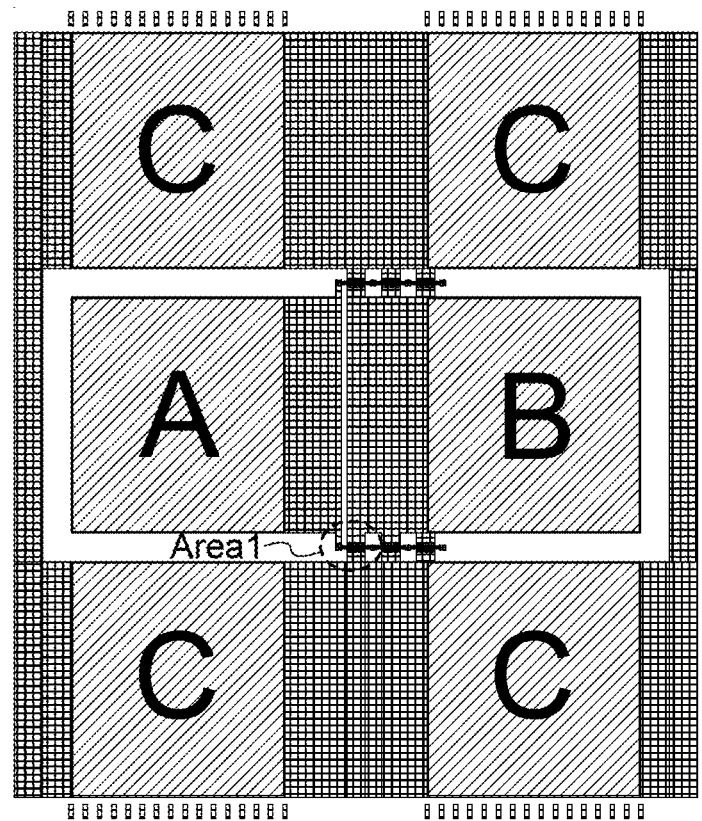
FIG. 21 is a top view of a fabricated TEG.
Figure 22:
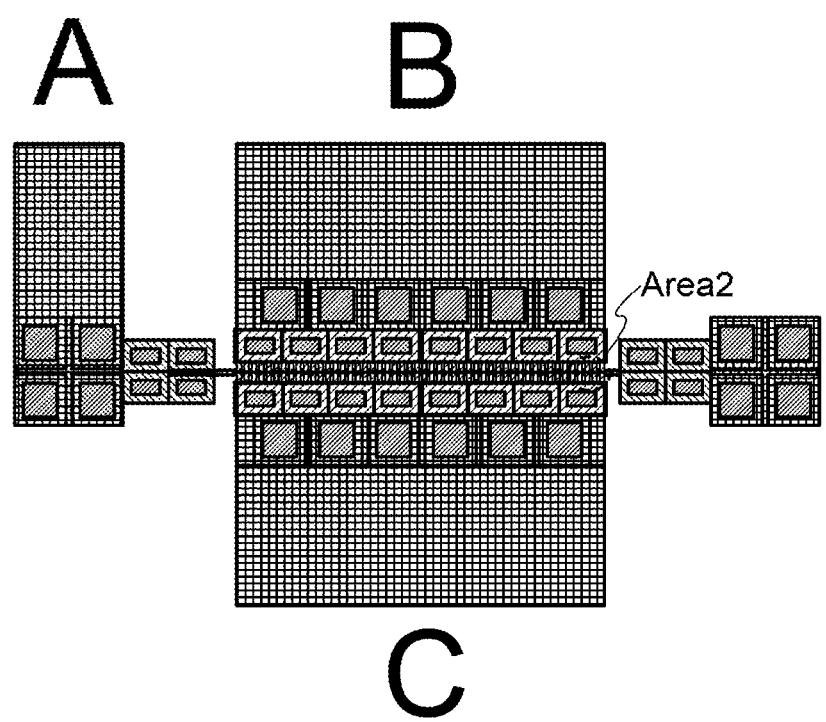
FIG. 22 is a top view of a fabricated TEG.
Figure 23:
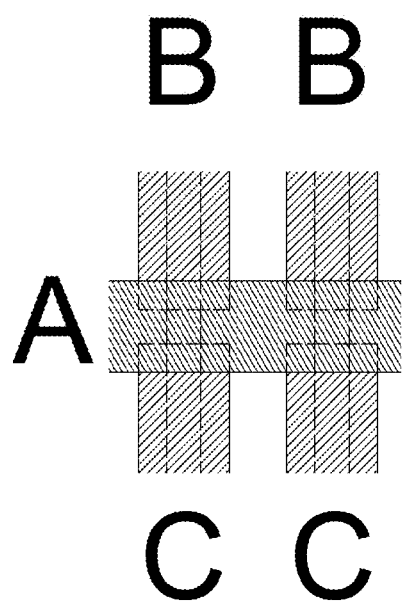
FIG. 23 is a top view of a fabricated TEG.

FIG. 21, FIG. 22, and FIG. 23 each show the layout of transistors to be measured.

FIG. 21 is a top view illustrating 300 transistors each having a channel width of 60 nm connected in parallel and measurement pads. A terminal A is connected to a gate of the transistor. A terminal B is connected to one of a source and a drain of the transistor. A terminal C is supplied with a GND potential and is connected to the other of the source and the drain of the transistor. Transistors are arranged in a region Area 1.

FIG. 22 is a magnified view of the region Area 1 in the top view of FIG. 21. The terminal A is connected to the gate of the transistor, and the terminals B and C are connected to the source and the drain of the transistor, respectively.

FIG. 23 is a magnified view of a region Area 2 in the top view of FIG. 22. The terminal A is connected to the gate of the transistor, and the terminals B and C are connected to the source and the drain of the transistor, respectively.

A network analyzer was used in measurement. An Agilent Technologies N5230A network analyzer and a Mini-Circuits ZX85-12G-S+ bias tee were used. In addition, ADCMT 6242 and 6241A SMUs were used.

In measurement, before a target element (device under test (DUT)) is measured, Open and Short test element groups (TEGs) are measured. Accordingly, even when the DUT is embedded in an extra network, it is possible to obtain the characteristics of the DUT (this is also called de-embedding).

S-parameters were measured by the network analyzer, and cutoff frequency $f_T$ and maximum oscillation frequency $f_{max}$ were calculated from the S-parameters. The cutoff frequency $f_T$ is defined as frequency at which a current amplification factor or an extrapolated current amplification factor becomes 1. The current amplification factor is an offdiagonal H matrix element and is represented by the following equation using the S-parameters.

[Formula 1]

$$H_{21} = -\frac{S_{21}}{(1-S_{11})(1+S_{22})+S_{12}S_{21}} \quad (2)$$

The maximum oscillation frequency $f_{max}$ is defined as frequency at which a power amplification factor or an extrapolated power amplification factor becomes 1. Maximum available power gain or maximum unilateral power gain can be used as the power amplification factor. Maximum unilateral power gain $U_g$ is represented by the following equation.

[Formula 2]

$$U_g = \frac{|S_{21}/S_{12} - 1|^2}{2K|S_{21}/S_{12}| - 2Re(S_{21}/S_{12})} \quad (3)$$

In Equation (3), K is a stabilization coefficient and is represented by the following equation.

[Formula 3]

$$K = \frac{1-|S_{11}|^2-|S_{22}|^2+|S_{11}S_{22}-S_{12}S_{21}|^2}{2|S_{12}S_{21}|} \quad (4)$$

Figure 24:
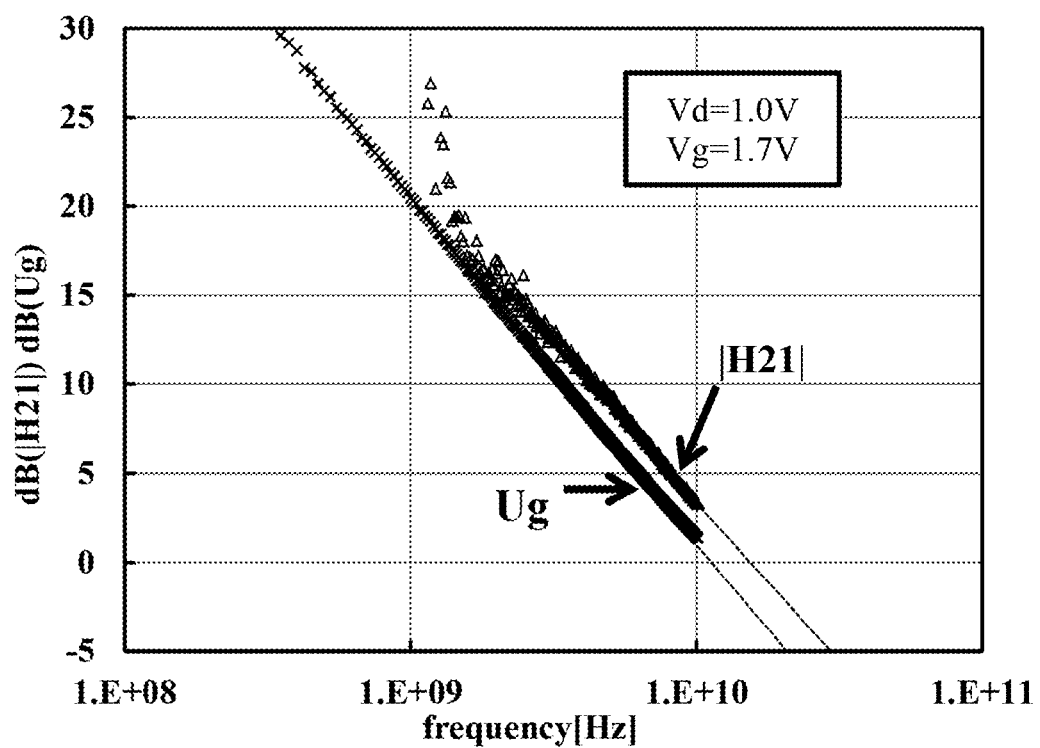
FIG. 24 shows an H matrix element and the maximum unilateral power gain of a fabricated transistor.

FIG. 24 shows an evaluation result example of Transistor B. Measurement was performed at $V_d$=1.0 V and $V_g$=1.7 V. An H-matrix element $|H_{21}|$ and the maximum unilateral power gain $U_g$ were calculated from measured S-parameters. FIG. 24 shows data after de-embedding. Cutoff frequency $f_T$ calculated from an extrapolated value was 11.3 GHz. Similarly, maximum oscillation frequency $f_{max}$ was 15.5 GHz.

Figure 25:
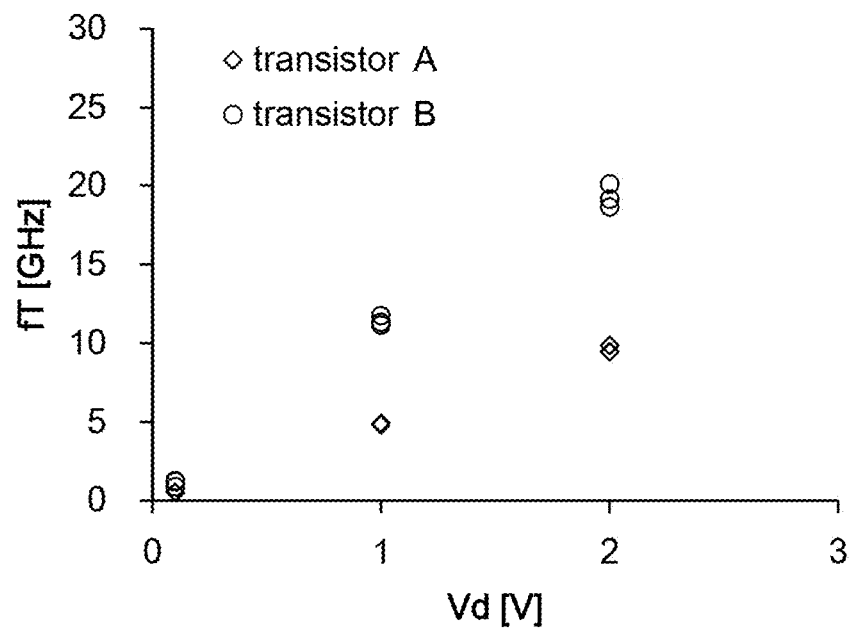
FIG. 25 shows cutoff frequencies of fabricated transistors.
Figure 26:
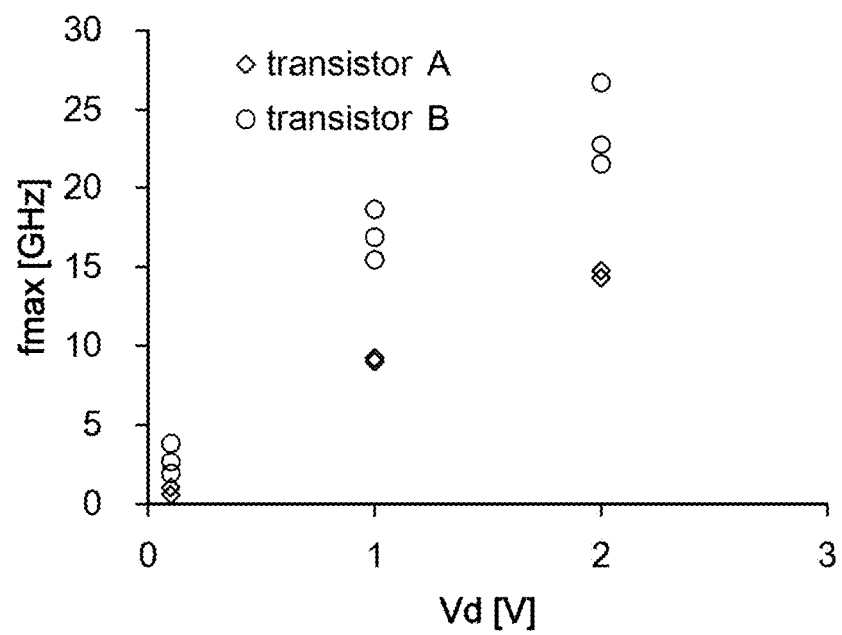
FIG. 26 shows maximum oscillation frequencies of fabricated transistors.

FIG. 25 and FIG. 26 show evaluation result examples of Transistor A and Transistor B. FIG. 25 shows results of cutoff frequency $f_T$ calculated at $V_d$=0.1 V, 1 V, and 2 V. FIG. 26 shows results of maximum oscillation frequency $f_{max}$ calculated at $V_d$=0.1 V, 1 V, and 2 V. Note that $f_T$ and $f_{max}$ were each evaluated at $V_d$ and $V_g$ where transconductance $g_m$ has the maximum value. The number of measured samples of Transistor A is two, and the number of measured samples of Transistor B is three.

From FIG. 25, the average cutoff frequency $f_T$ of Transistor A was 4.9 GHz at $V_d$=1.0 V and $V_g$=1.9 V, and the average cutoff frequency $f_T$ of Transistor A was 9.7 GHz at $V_d$=2.0V and $V_g$=2.35 V.

From FIG. 25, the average cutoff frequency $f_T$ of Transistor B was 11 GHz at $V_d$=1.0 V and $V_g$=1.7 V, and the average cutoff frequency $f_T$ of Transistor B was 19 GHz at $V_d$=2.0V and $V_g$=1.95 V.

From FIG. 26, the average maximum oscillation frequency $f_{max}$ of Transistor A was 9.1 GHz at $V_d$=1.0 V and $V_g$=1.9 V, and the average maximum oscillation frequency $f_{max}$ of Transistor A was 15 GHz at $V_d$=2.0 V and $V_g$=2.35 V.

From FIG. 26, the average maximum oscillation frequency $f_{max}$ of Transistor B was 17 GHz at $V_d$=1.0 V and $V_g$=1.7 V, and the average maximum oscillation frequency $f_{max}$ of Transistor B was 24 GHz at $V_d$=2.0 V and $V_g$=1.95 V.

As described above, Transistor A has a cutoff frequency $f_T$ of approximately 10 GHz and a maximum oscillation frequency $f_{max}$ of higher than or equal to 10 GHz at $V_d$=2.0 V. In addition, Transistor B has a cutoff frequency $f_T$ of approximately 20 GHz and a maximum oscillation frequency $f_{max}$ of higher than or equal to 20 GHz at $V_d$=2.0 V.

It is found that the OS transistor in Embodiment 2 has high frequency characteristics and can achieve high-speed operation when the transistor is used in a memory circuit, a logic circuit, or an analog circuit. It is also found that the semiconductor device 200 in one embodiment of the present invention can operate at high speed in the case where the semiconductor device 200 is manufactured using the above-described OS transistor.

Example 4

In this example, a memory circuit including the transistor 100 illustrated in FIGS. 2A to 2D was fabricated and subjected to a variety of evaluations. The structure of the transistor used in the memory circuit will be described below.

The memory circuit was fabricated using the transistor 100 illustrated in FIGS. 2A to 2D. As the insulating film 652, a 300-nm-thick silicon oxynitride film was formed and a surface of the insulating film 652 was planarized by CMP treatment. In order to make the insulating film 652 contain excess oxygen, oxygen ions were implanted into the insulating film 652. The semiconductor 661 was a 20-nm-thick In—Ga—Zn oxide (In:Ga:Zn=1:3:4 [atomic ratio]). The semiconductor 662 was a 15-nm-thick In—Ga—Zn oxide (In:Ga:Zn=1:1:1 [atomic ratio]). The semiconductor 663 was a 5-nm-thick In—Ga—Zn oxide (In:Ga:Zn=1:3:2 [atomic ratio]). The conductive films 671 and 672 were 20-nm-thick tungsten films. The gate insulating film (the insulating film 653) was a 10-nm-thick silicon oxynitride film. The gate electrode (the conductive film 673) was a stacked-layer film of a 10-nm-thick titanium nitride film and a 10-nm-thick tungsten film. The insulating film 654 was a 40-nm-thick aluminum oxide film. The insulating film 655 was a 150-nm-thick silicon oxynitride film.

Figure 27:
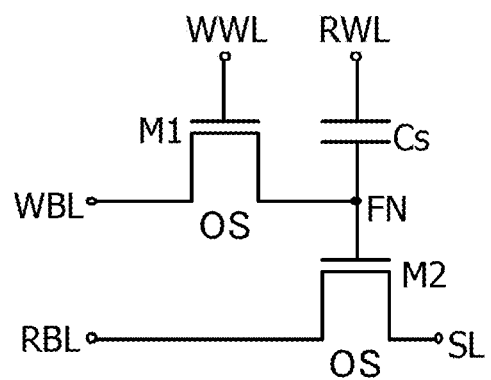
FIG. 27 is a circuit diagram of a fabricated circuit.

FIG. 27 is a circuit diagram of the fabricated memory circuit. The circuit includes a transistor M1, a transistor M2, a capacitor Cs, a wiring WWL, a wiring RWL, a wiring WBL, a wiring RBL, a wiring SL, and a node FN. As each of the transistors M1 and M2, the above-described OS transistor was used.

In the memory circuit illustrated in FIG. 27, when the transistor M1 is turned on, charge can be written to the node FN. When the transistor M1 is turned off, the node FN is a floating node, and the memory circuit can retain the written charge. The transistor M2 allows current to flow depending on the charge written to the node FN, and by detecting the current, the charge written to the node FN can be read from the memory circuit.

In the fabricated memory circuit, the transistor M1 is an OS transistor with a channel width W of 60 nm and a channel length L of 60 nm, and the transistor M2 is an OS transistor with a channel width W of 60 nm and a channel length L of 60 nm. Three kinds of circuits, one with a capacitance of the capacitor Cs of 1 fF, another with 3 fF, and the other with 10 fF, were manufactured. Here, these circuits are called a memory circuit Mem1 (Cs=1 fF), a memory circuit Mem2 (Cs=3 fF), and a memory circuit Mem3 (Cs=10 fF).

First, results of measurement in the case where data "1" is written to the memory circuit illustrated in FIG. 27 will be described.

FIG. 28 is a timing chart of the writing operation of the fabricated memory circuits. FIG. 28 illustrates the operation of writing data at high logic level to the memory circuits Mem1 and Mem2 (data "1" writing), which corresponds to operation of charging the capacitor Cs (node FN). A potential at 1.1 V was applied to the wiring WBL as a data signal. In addition, a pulse signal at 3 V was applied to the wiring WWL, whereby the transistor M1 was turned on. The potential of the wiring SL was 0 V. Writing time $T_{write}$ indicates time taken to step up the potential of the node FN to 90% of that of the wiring WBL. In the operation example in FIG. 28, the time $T_{write}$ is time taken to step up the potential of node FN from 0 V to 1 V (approximately 90% of 1.1 V, the potential of the wiring WBL).

Figure 29A:
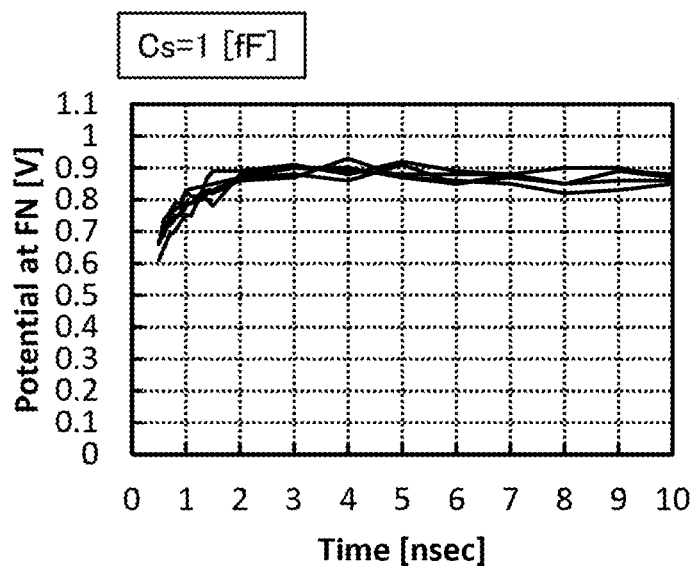
FIGS. 29A and 29B each show the relationship between the time and the potential of a floating node of a fabricated circuit.
Figure 29B:
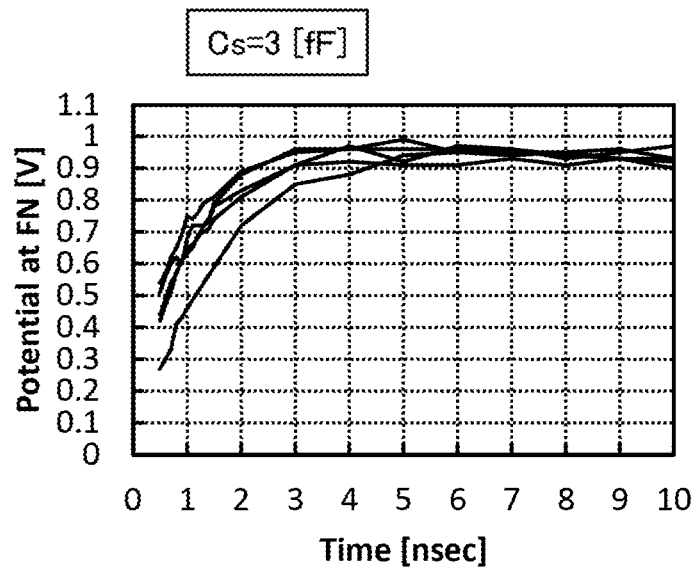

FIGS. 29A and 29B show measurement results of potentials s of the node FN with respect to the time for writing data "1". FIG. 29A shows the measurement result of the memory circuit Mem1, and FIG. 29B shows the measurement result of the memory circuit Mem2. Five samples of each circuit were measured. The potential of the node FN was obtained by measuring a current flowing in the wiring RBL in the writing operation. The current flowing in the wiring RBL corresponded to a drain current of the transistor M2, and the potential of the node FN corresponded to a gate potential of the transistor M2. Therefore, from the measured current values and the $I_d$-$V_g$ characteristics of the transistor M2 obtained in advance, the potential of the node FN was obtained. Note that the time on the horizontal axis of each of FIGS. 29A and 29B is the time during which 3 V is applied to the wiring WWL.

FIG. 29A shows that data "1" can be written to the memory circuit Mem1 in 2 nsec. FIG. 29B shows that data "1" can be written to the memory circuit Mem2 in 5 nsec. That is, data "1" can be written in a very short time.

Figure 30:
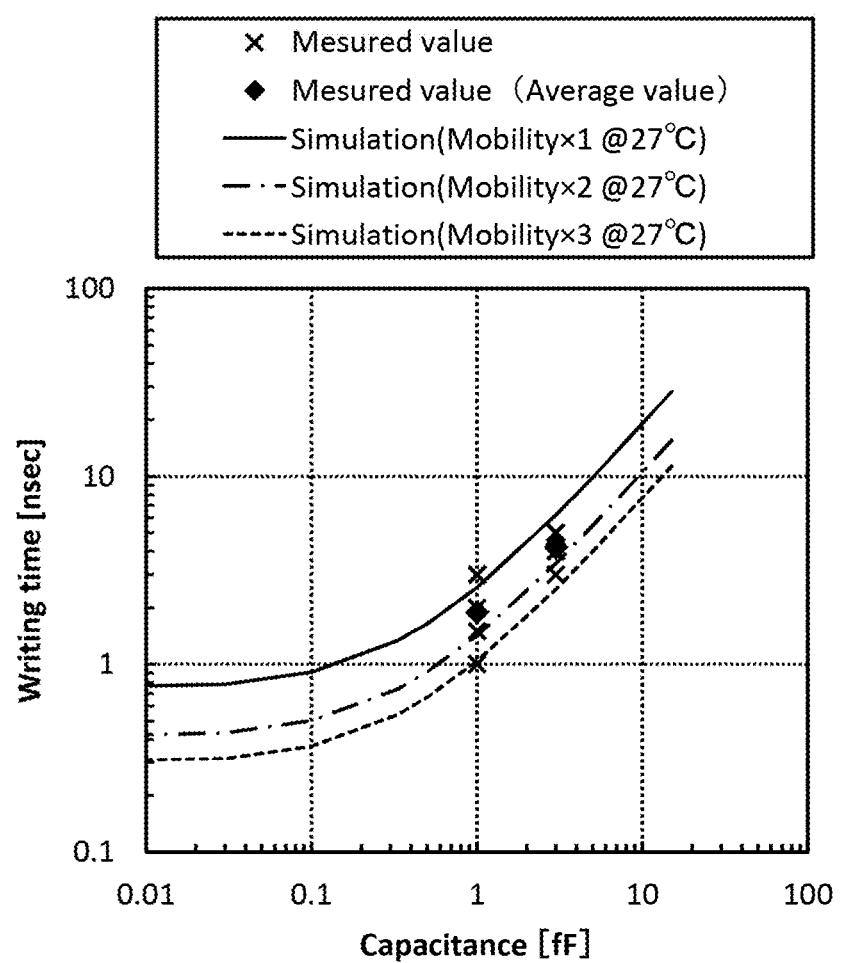
FIG. 30 shows the relationship between the capacitance and writing time of fabricated circuits in comparison with simulations.

FIG. 30 shows the relationship between the capacitance of the capacitor Cs of each of the memory circuits (Mem1 and Mem2) and the writing time for writing data "1". Measured values in FIG. 30 were obtained from the measurement results in FIGS. 29A and 29B. In addition, FIG. 30 shows an average value of the writing times of the five samples of the memory circuit Mem1 and an average value of the writing times of the five samples of the memory circuit Mem2.

The case of writing data "1" to the memory circuit in FIG. 27 was simulated to calculate the capacitance dependence of writing time. Three curves in FIG. 30 represent calculated values obtained by the simulation. The solid line of the three curves represents the result of calculation where parameters MU0 and MU1 corresponding to the mobility of the transistor M1 were set to 2.80 and $1.01 \times 10^{-5}$, respectively. The dashed-dotted line of the three curves represents the result of calculation where the above values of the parameters MU0 and MU1 were doubled. The dotted line of the three curves represents the result of calculation where the above values of the parameters MU0 and MU1 were tripled. Note that circuit simulator "SmartSpice" produced by Silvaco, Inc was used for the simulation. A LEVEL=36 model was used for each of the transistors M1 and M2. The circuit operation environment was assumed to be at room temperature (27° C.), and a parameter VTO corresponding to the threshold voltage of each of the transistors M1 and M2 was set to 0.83.

According to the simulation shown in FIG. 30, it was estimated that the writing time was reduced by doubling or tripling the mobility of the transistor M1. The average of the measured values is between the result of simulation where the mobility was not multiplied and the result of simulation where the mobility was doubled.

Next, results of measurement in the case where data "0" is written to the memory circuit illustrated in FIG. 27 will be described.

FIG. 31 illustrates the operation of writing data at low logic level (data "0" writing), which corresponds to operation of discharging the capacitor Cs (node FN). A potential of 0 V was constantly applied to the wiring WBL. In addition, a pulse signal at 3 V was applied to the wiring WWL, whereby the transistor M1 was turned on. The potential of the wiring SL was 0 V. Writing time $T_{write}$ indicates time taken to step down the potential with which the node FN is charged to 10%. In the operation example in FIG. 31, the time $T_{write}$ is time taken to step down the potential of the node FN from 1.1 V to 0.11 V (approximately 10% of 1.1 V, the potential of the wiring WBL).

Figure 32A:
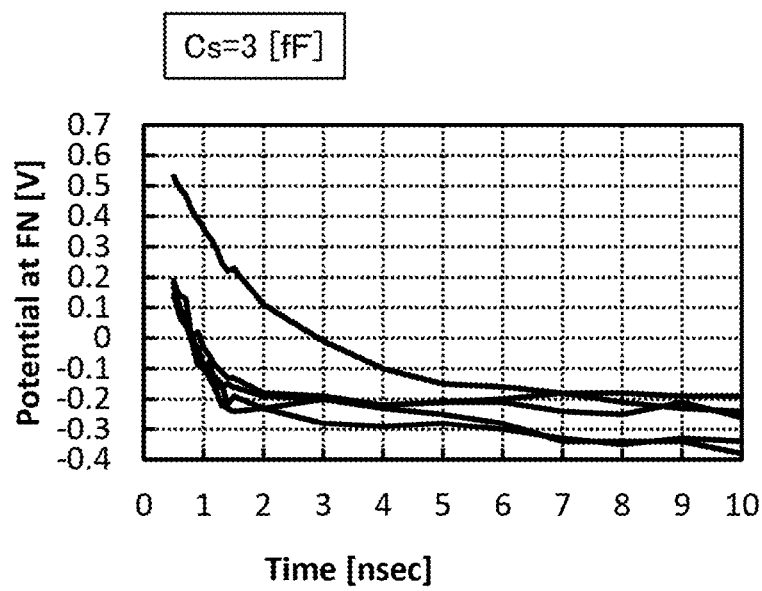
FIGS. 32A and 32B each show the relationship between the time and the potential of a floating node of a fabricated circuit.
Figure 32B:
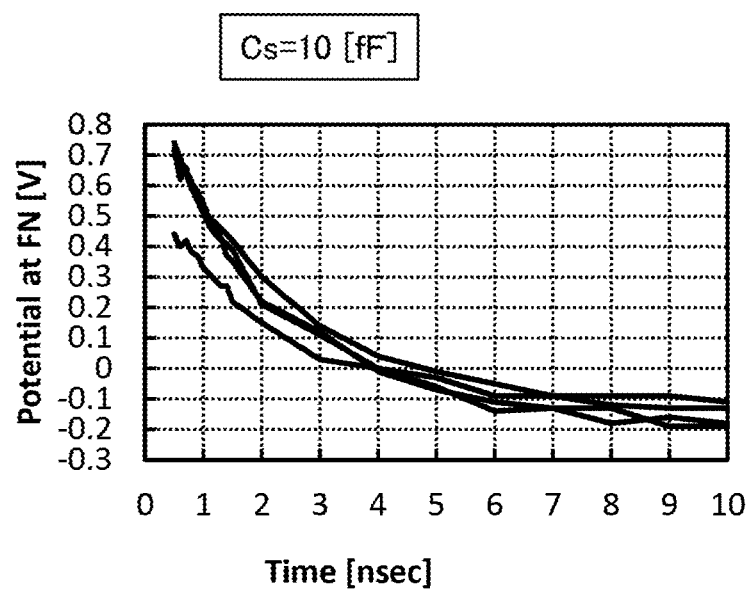

FIGS. 32A and 32B show measurement results of potentials of the node FN with respect to the time for writing data "0". FIG. 32A shows the measurement result of the memory circuit Mem2, and FIG. 32B shows the measurement result of the memory circuit Mem3. Five samples of each circuit were measured. As in FIGS. 29A and 29B, the potential of the node FN was obtained by measuring a current flowing in the wiring RBL in the writing operation. Note that the time on the horizontal axis of each of FIGS. 32A and 32B is the time during which 3 V is applied to the wiring WWL.

FIG. 32A shows that data "0" can be written to the memory circuit Mem2 in 3 nsec. FIG. 32B shows that data "0" can be written to the memory circuit Mem3 in 10 nsec. That is, data "0" can be written in a very short time.

Figure 33:
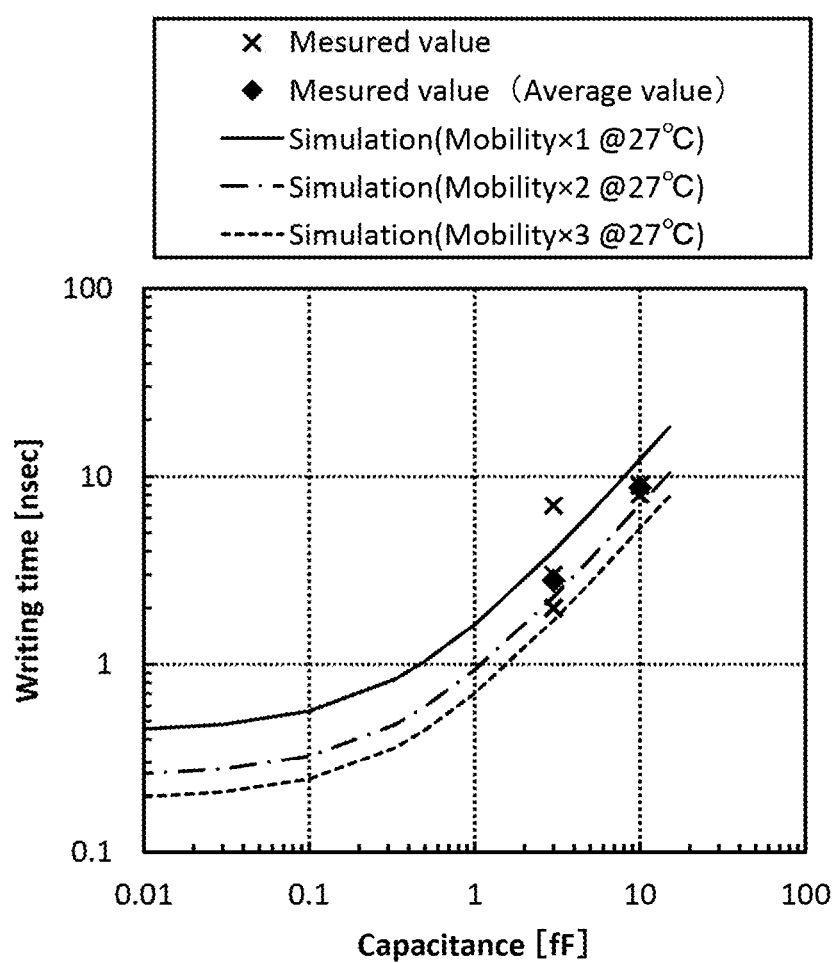
FIG. 33 shows the relationship between the capacitance and writing time of fabricated circuits in comparison with simulations.

FIG. 33 shows the relationship between the capacitance of the capacitor Cs of each of the memory circuits Mem2 and Mem3 and the writing time. Measured values in FIG. 33 were obtained from the measurement results in FIGS. 32A and 32B. In addition, like FIG. 30, FIG. 33 shows an average value of the writing times of the five samples of the memory circuit Mem2, an average value of the writing times of the five samples of the memory circuit Mem3, and three curves obtained by simulation. The solid line of the three curves represents the result of calculation where a parameter MU0 corresponding to the mobility of the transistor M1 was set to 2.80 and a parameter MU1 corresponding to the mobility of the transistor M1 was set to $1.01 \times 10^{-5}$. The dashed-dotted line of the three curves represents the result of calculation where the above values of the parameters MU0 and MU1 were doubled. The dotted line of the three curves represents the result of calculation where the above values of the parameters MU0 and MU1 were tripled. Refer to the description of FIG. 30 for the other conditions of the simulation.

From the simulation shown in FIG. 33, it was estimated that the writing time was reduced by doubling or tripling the mobility of the transistor M1. The average of the measured values of the writing time is between the result of simulation where the mobility was not multiplied and the result of simulation where the mobility was doubled. When the capacitance of the capacitor Cs is 3 fF, the writing time is less than 5 nsec.

Figure 35:
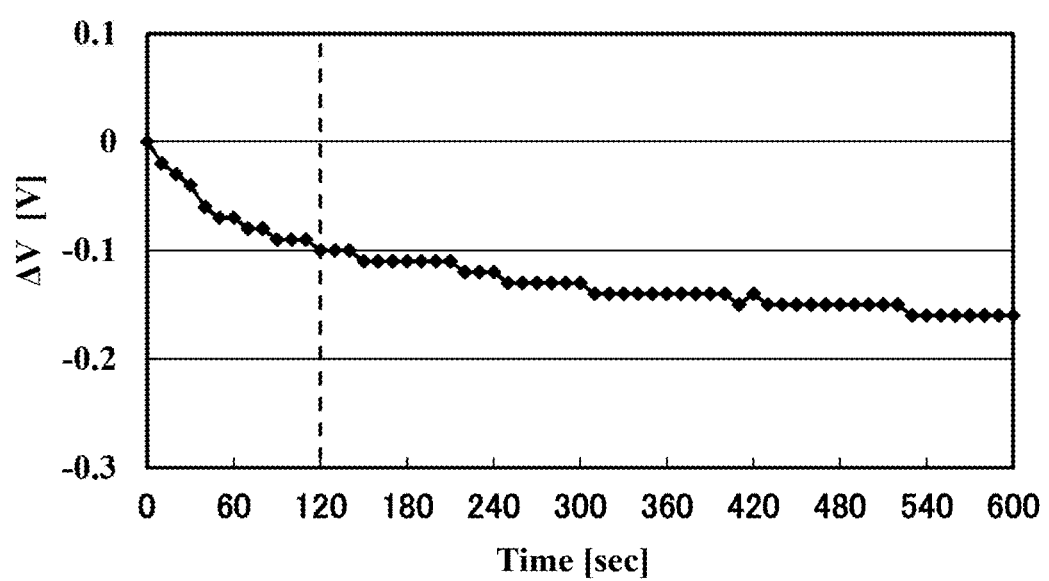
FIG. 35 shows changes in voltage of a floating node with respect to retention time of a fabricated circuit.

FIG. 35 shows the result of measuring retention characteristics of the node FN in the memory circuit Mem1. In FIG. 35, the horizontal axis represents retention time (Time), and the vertical axis represents the amount of change in the voltage of the node FN (ΔV). Assuming that data can be read normally even when the voltage of the node FN is decreased by 0.1 V, time $T_{ret}$ taken to decrease the voltage of the node FN by 0.1 V was 120 seconds as shown in FIG. 35. This result of the retention time exceeds the refresh rate required for existing DRAMs.

By substituting the above value into the following formula (5), the leakage current $I_{leak}$ of the node FN can be calculated. Note that in the formula (5), Cs is the capacitance of the capacitor Cs in the memory circuit Mem1 (i.e., 1 fF), and ΔV is the allowable amount of change in the potential of the node FN (i.e., 0.1 V).

$$I_{leak} = Cs \times \Delta V / T_{ret} \quad (5)$$

According to the formula (5), the leakage current $I_{leak}$ of the node FN can be estimated at $0.83 \times 10^{-18}$ A.

As described above, the circuit fabricated in this example could be applied to a high-speed and low-power-consumption LSI. In particular, the circuit is very suitable for a memory circuit or the like.

This application is based on Japanese Patent Application serial no. 2014-113592 filed with Japan Patent Office on May 30, 2014, Japanese Patent Application serial no. 2014-113591 filed with Japan Patent Office on May 30, 2014, and Japanese Patent Application serial no. 2014-182127 filed with Japan Patent Office on Sep. 8, 2014, the entire contents of which are hereby incorporated by reference.

What is claimed is:

1. A semiconductor device comprising:
   a first transistor, a second transistor, a third transistor, a fourth transistor, and a fifth transistor each including a gate, a source, and a drain; and
   a first wiring, a second wiring, and a third wiring,
   wherein the gate of the first transistor is electrically connected to the first wiring, one of the source and the drain of the first transistor is electrically connected to the second wiring, and the other of the source and the drain of the first transistor is electrically connected to a first node,
   wherein the gate of the second transistor is electrically connected to the first node, one of the source and the drain of the second transistor is electrically connected to the second wiring, and the other of the source and the drain of the second transistor is electrically connected to a second node,
   wherein the gate of the third transistor is electrically connected to the second node, one of the source and the drain of the third transistor is electrically connected to the first node, and the other of the source and the drain of the third transistor is electrically connected to a third node,
   wherein the gate of the fourth transistor is electrically connected to the third node, one of the source and the drain of the fourth transistor is electrically connected to the second node, and the other of the source and the drain of the fourth transistor is electrically connected to the third wiring,
   wherein the gate of the fifth transistor is electrically connected to the third node, one of the source and the drain of the fifth transistor is electrically connected to the third node, and the other of the source and the drain of the fifth transistor is electrically connected to the third wiring,
   wherein the first node is electrically connected to an output terminal,
   wherein the first transistor further comprises:
      an oxide semiconductor layer electrically connected to the source and the drain of the first transistor; and
      a gate insulating layer over the oxide semiconductor layer, the source, and the drain of the first transistor,
   wherein the gate of the first transistor is positioned over the gate insulating layer and overlaps with the oxide semiconductor layer, and
   wherein a bottom surface of the gate of the first transistor is positioned below a bottom surface of the oxide semiconductor layer.

2. The semiconductor device according to claim 1, wherein an increase rate of a drain current of the first transistor with a 0.1 V change in drain voltage is higher than or equal to 1% when the drain voltage is higher than a difference between a gate voltage and a threshold voltage of the first transistor.

3. The semiconductor device according to claim 2, wherein a cutoff frequency of the first transistor at a source-drain voltage higher than or equal to 1 V and lower than or equal to 2 V is higher than 2 GHz.

4. The semiconductor device according to claim 1, wherein the first transistor is capable of acting as a resistor.

5. The semiconductor device according to claim 1, wherein a channel length of the first transistor is less than or equal to 100 nm.

6. The semiconductor device according to claim 1, wherein the oxide semiconductor layer includes at least one of indium and zinc.

7. The semiconductor device according to claim 1, wherein the oxide semiconductor layer includes at least one of aluminum, gallium, yttrium, and tin.

8. The semiconductor device according to claim 1, wherein the gate of the first transistor overlaps with an upper surface of the oxide semiconductor layer and faces a side surface of the oxide semiconductor layer in a channel width direction with the gate insulating layer provided between the oxide semiconductor layer and the gate.

9. The semiconductor device according to claim 1, wherein the oxide semiconductor layer comprises a plurality of crystal parts with c-axis alignment.

10. A semiconductor device comprising:
    a first transistor, a second transistor, a third transistor, a fourth transistor, and a fifth transistor each including a gate, a source, and a drain; and
    a first wiring, a second wiring, and a third wiring,
    wherein the gate of the first transistor is electrically connected to the first wiring, one of the source and the drain of the first transistor is electrically connected to the second wiring, and the other of the source and the drain of the first transistor is electrically connected to a first node,
    wherein the gate of the second transistor is electrically connected to the first node, one of the source and the drain of the second transistor is electrically connected to the second wiring, and the other of the source and the drain of the second transistor is electrically connected to a second node,
    wherein the gate of the third transistor is electrically connected to the second node, one of the source and the drain of the third transistor is electrically connected to the first node, and the other of the source and the drain of the third transistor is electrically connected to a third node,
    wherein the gate of the fourth transistor is electrically connected to the third node, one of the source and the drain of the fourth transistor is electrically connected to the second node, and the other of the source and the drain of the fourth transistor is electrically connected to the third wiring,
    wherein the gate of the fifth transistor is electrically connected to the third node, one of the source and the drain of the fifth transistor is electrically connected to the third node, and the other of the source and the drain of the fifth transistor is electrically connected to the third wiring, wherein the first transistor further comprises:
- a first oxide semiconductor layer;
- a second oxide semiconductor layer over the first oxide semiconductor layer, the second oxide semiconductor layer electrically connected to the source and the drain of the first transistor;
- a third oxide semiconductor layer over the second oxide semiconductor layer, the source, and the drain of the first transistor; and
- a gate insulating layer over the third oxide semiconductor layer, the source, and the drain of the first transistor,
- wherein the gate of the first transistor is positioned over the gate insulating layer and overlaps with the second oxide semiconductor layer, and
- wherein a bottom surface of the gate of the first transistor is positioned below a bottom surface of the first oxide semiconductor layer.

11. The semiconductor device according to claim 10, wherein an increase rate of a drain current of the first transistor with a 0.1 V change in drain voltage is higher than or equal to 1% when the drain voltage is higher than a difference between a gate voltage and a threshold voltage of the first transistor.

12. The semiconductor device according to claim 11, wherein a cutoff frequency of the first transistor at a source-drain voltage higher than or equal to 1 V and lower than or equal to 2 V is higher than 2 GHz.

13. The semiconductor device according to claim 10, wherein the first transistor is capable of acting as a resistor.

14. The semiconductor device according to claim 10, wherein the first oxide semiconductor layer, the second oxide semiconductor layer, and the third oxide semiconductor layer each include at least one of indium and zinc.

15. The semiconductor device according to claim 10, wherein the first oxide semiconductor layer, the second oxide semiconductor layer, and the third oxide semiconductor layer each include at least one of aluminum, gallium, yttrium, and tin.

16. The semiconductor device according to claim 10, wherein the gate of the first transistor overlaps with an upper surface of the third oxide semiconductor layer and faces a side surface of the second oxide semiconductor layer in a channel width direction with the gate insulating layer provided between the second oxide semiconductor layer and the gate.

17. The semiconductor device according to claim 10, wherein the first oxide semiconductor layer, the second oxide semiconductor layer, and the third oxide semiconductor layer each comprise a plurality of crystal parts with c-axis alignment.

18. The semiconductor device according to claim 10, wherein the first node is electrically connected to an output terminal.

19. The semiconductor device according to claim 10, wherein the third oxide semiconductor layer is in contact with a side surface of the second oxide semiconductor layer in a channel length direction.

* * * * *